(12) United States Patent
Kim et al.

(10) Patent No.: US 12,349,534 B2
(45) Date of Patent: Jul. 1, 2025

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Hyeongpil Kim, Yongin-si (KR); Jungmin Kang, Yongin-si (KR); Kyungsik Kim, Yongin-si (KR); Seokgyu Yoon, Yongin-si (KR); Jaeyong Lee, Yongin-si (KR); Kunwook Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 906 days.

(21) Appl. No.: 17/451,624

(22) Filed: Oct. 20, 2021

(65) Prior Publication Data
US 2022/0231253 A1    Jul. 21, 2022

(30) Foreign Application Priority Data

Jan. 13, 2021    (KR) .................. 10-2021-0004926

(51) Int. Cl.
*H10K 50/17* (2023.01)
*C09K 11/06* (2006.01)
*H10K 85/30* (2023.01)
*H10K 85/60* (2023.01)

(52) U.S. Cl.
CPC .............. *H10K 50/17* (2023.02); *C09K 11/06* (2013.01); *H10K 85/322* (2023.02); *H10K 85/615* (2023.02); *H10K 85/636* (2023.02); *H10K 85/6572* (2023.02)

(58) Field of Classification Search
None
See application file for complete search history.

(56) References Cited

U.S. PATENT DOCUMENTS

| | | | |
|---|---|---|---|
| 7,754,185 B2 | 7/2010 | McHugh et al. | |
| 9,601,722 B2 | 3/2017 | Lee et al. | |
| 10,761,630 B2 | 9/2020 | Shin et al. | |
| 2009/0160319 A1* | 6/2009 | Song | H10K 50/155 313/504 |
| 2012/0018709 A1* | 1/2012 | Terao | H10K 50/828 257/E51.024 |
| 2016/0056387 A1 | 2/2016 | Kim et al. | |
| 2017/0271610 A1 | 9/2017 | Takahashi | |
| 2018/0151630 A1* | 5/2018 | Yamaoka | H10K 50/13 |
| 2018/0182977 A1* | 6/2018 | Hirose | H10K 50/115 |
| 2019/0103567 A1 | 4/2019 | Kim et al. | |
| 2019/0165279 A1 | 5/2019 | Fujita | |
| 2019/0207112 A1 | 7/2019 | Hatakeyama et al. | |
| 2019/0334108 A1* | 10/2019 | Shin | H10K 59/80518 |
| 2020/0176692 A1* | 6/2020 | Watabe | H01L 33/26 |
| 2020/0194707 A1* | 6/2020 | Park | H10K 50/11 |
| 2020/0350373 A1* | 11/2020 | Ohsawa | H10K 50/856 |
| 2021/0384442 A1* | 12/2021 | Watabe | H10K 85/342 |
| 2023/0354635 A1* | 11/2023 | Kim | H10K 59/12 |

FOREIGN PATENT DOCUMENTS

| | | | | |
|---|---|---|---|---|
| JP | 2007-500661 A | 1/2007 | | |
| JP | 2017-175128 A | 9/2017 | | |
| KR | 10-2005-0122456 A | 12/2005 | | |
| KR | 10-0565587 B1 | 3/2006 | | |
| KR | 10-0480334 B1 | 4/2008 | | |
| KR | 10-2016-0023992 A | 3/2016 | | |
| KR | 10-2016-0064320 A | 6/2016 | | |
| KR | 10-1911586 B1 | 10/2018 | | |
| KR | 10-2018-0134850 A | 12/2018 | | |
| KR | 10-2019-0038731 A | 4/2019 | | |
| KR | 10-2019-0062177 A | 6/2019 | | |
| WO | WO 2005/040044 A2 | 5/2005 | | |
| WO | WO-2019053559 A1 * | 3/2019 | | G09F 9/33 |

OTHER PUBLICATIONS

Kang, Song Kyu, et al. "Work function-tunable ZnO/Ag/ZnO film as an effective hole injection electrode prepared via nickel doping for thermally activated delayed fluorescence-based flexible blue organic light-emitting diodes." Applied Surface Science 538 (2021): 148202. (Year: 2021).*

Wen, Chao, and Mario Lanza. "Calcium fluoride as high-k dielectric for 2D electronics." Applied Physics Reviews 8.2 (2021). (Year: 2021).*

Abstract of Korean Publication No. 10-2005-0070834, Dated Jul. 7, 2005, Corresponding to Korean Patent No. 10-0565587 B1, Dated Mar. 30, 2006, 2 Pages.

Abstract of Korean Publication No. 20040051072 A, Dated Jun. 18, 2004, Corresponding to Korean Patent No. 10-0480334 B1, Dated Apr. 6, 2005, 1 Page.

Abstract of Korean Publication No. 20170001897 A, Dated Jan. 5, 2017, Corresponding to Korean Patent No. 10-1911586 B1, Dated Oct. 25, 2018, 1 Page.

Ji Cui, et al., Indium Tin Oxide Alternatives—High Work Function Transparent Conducting Oxides as Anodes for Organic Light-Emitting Diodes, Advanced Materials, 2001, pp. 1476-1480, vol. 13, No. 19, Wiley-VCH Verlag GmbH, Weinheim, Germany.

* cited by examiner

*Primary Examiner* — Robert S Loewe
(74) *Attorney, Agent, or Firm* — Womble Bond Dickinson (US) LLP

(57) ABSTRACT

A light-emitting device includes: a first electrode; a second electrode facing the first electrode; and an interlayer located between the first electrode and the second electrode and including an emission layer, wherein the interlayer includes a hole transport region located between the first electrode and the emission layer, the hole transport region includes a hole injection layer, the first electrode includes a conductive oxide and a first inorganic material, and the hole injection layer includes a second inorganic material. An electronic apparatus includes the light-emitting device.

20 Claims, 3 Drawing Sheets

LIGHT-EMITTING DEVICE AND ELECTRONIC APPARATUS INCLUDING THE SAME

CROSS-REFERENCE TO RELATED APPLICATION

This application claims priority to and the benefit of Korean Patent Application No. 10-2021-0004926, filed on Jan. 13, 2021, in the Korean Intellectual Property Office, the disclosure of which is incorporated by reference herein in its entirety.

BACKGROUND

1. Field

One or more embodiments relate to a light-emitting device and an electronic apparatus including the same.

2. Description of the Related Art

Among light-emitting devices, self-emissive devices have wide viewing angles, high contrast ratios, short response times, and/or suitable (e.g., excellent) characteristics in terms of luminance, driving voltage, and/or response speed.

In a light-emitting device, a first electrode may be located on a substrate, and a hole transport region, an emission layer, an electron transport region, and a second electrode may be sequentially arranged on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. The excitons transition from an excited state to a ground state to thereby generate light.

SUMMARY

Aspects according to one or more embodiments are directed toward a light-emitting device having a low driving voltage, high efficiency, and a long lifespan.

Additional aspects will be set forth in part in the description, which follows and, in part, will be apparent from the description, or may be learned by practice of the presented embodiments of the disclosure.

According to one or more embodiments, a light-emitting device includes:
a first electrode,
a second electrode facing the first electrode, and
an interlayer between the first electrode and the second electrode and including an emission layer,
wherein the interlayer includes a hole transport region between the first electrode and the emission layer,
the hole transport region includes a hole injection layer,
the first electrode includes a conductive oxide and a first inorganic material,
the hole injection layer includes a second inorganic material,
the first inorganic material includes tantalum (Ta), molybdenum (Mo), vanadium (V), niobium (Nb), silver (Ag), zinc (Zn), tin (Sn), chromium (Cr), cobalt (Co), rhodium (Rh), tungsten (W), iron (Fe), copper (Cu), gold (Au), ruthenium (Ru), osmium (Os), titanium (Ti), nickel (Ni), rhenium (Re), palladium (Pd), iridium (Ir), platinum (Pt), $In_2O_3$, $GeO_2$, $SnO_2$, $MoO_2$, $MoO_3$, $WO_3$, $CuO$, $TiO_2$, $V_2O_5$, $NiO_x$ ($0 \leq x \leq 3/2$), $CrO_{3-x}$ ($0 \leq x \leq 2$), $Ta_2O_5$, $Co_3O_4$, or any combination thereof, and
the second inorganic material includes calcium (Ca), scandium (Sc), titanium (Ti), strontium (Sr), ytterbium (Y), zirconium (Zr), niobium (Nb), barium (Ba), hafnium (Hf), tantalum (Ta), lanthanum (La), neodymium (Nd), gadolinium (Gd), $HfO_x$ ($0 < x \leq 2$), $ZrO_x$ ($0 < x \leq 2$), $LaO_x$ ($0 < x \leq 3/2$), $LaAlO_x$ ($0 < x \leq 3$), $TaO_x$ ($0 < x \leq 5/2$), $AlO_x$ ($0 < x \leq 3/2$), $SiO_2$, $ZrSiO_4$, $HfSiO_4$, SrO, $Y_2O_3$, CaO, BaO, $BaZrO_3$, MgO, $TiO_2$, $Si_3N_4$, or any combination thereof.

According to another embodiment, an electronic apparatus includes the light-emitting device.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
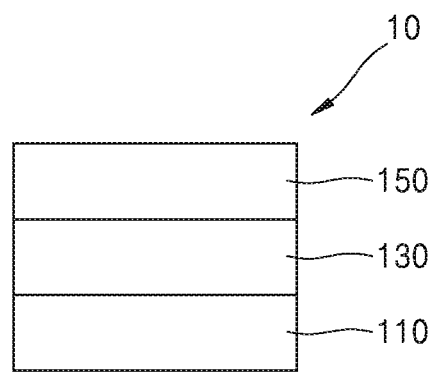
FIG. 1 is a schematic cross-sectional view of a light-emitting device according to an embodiment.

Reference will now be made in more detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diversely modified embodiments, example embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. The components that are the same or are in correspondence with each other are rendered the same reference numeral regardless of the figure number, and redundant explanations are omitted.

An expression used in the singular encompasses the expression of the plural, unless it has a clearly different meaning in the context.

It will be further understood that the terms "comprises" and/or "comprising" as used herein specify the presence of stated features or elements, but do not preclude the presence or addition of one or more other features or elements.

It will be understood that when a layer, region, or component is referred to as being "on" or "onto" another layer, region, or component, it may be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

The term "interlayer" as used herein refers to a single layer and/or a plurality of layers between a first electrode and a second electrode of a light-emitting device.

The expression "(an interlayer and/or a capping layer) includes at least one compound represented by Formula 1" as used herein may include a case in which "(an interlayer and/or a capping layer) includes identical compounds represented by Formula 1" and a case in which "(an interlayer and/or a capping layer) includes two or more different compounds represented by Formula 1".

Description of FIG. 1

FIG. 1 is a schematic cross-sectional view of a light-emitting device 10 according to an embodiment of the present disclosure. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

First Electrode 110

In FIG. 1, a substrate may be additionally located under the first electrode 110 or above the second electrode 150. As the substrate, a glass substrate or a plastic substrate may be utilized. In one or more embodiments, the substrate may be a flexible substrate, and may include plastics with suitable (e.g., excellent) heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. In an embodiment, the first electrode 110 may be an anode, which is a hole injection electrode. When the first electrode 110 is an anode, a material for forming the first electrode 110 may be a high work function material that facilitates injection of holes.

The first electrode 110 may be a reflective electrode, a semi-transmissive electrode, or a transmissive electrode. In an embodiment, the first electrode 110 may be a transmissive electrode.

The first electrode 110 may include a conductive oxide and a first inorganic material.

The first inorganic material may include tantalum (Ta), molybdenum (Mo), vanadium (V), niobium (Nb), silver (Ag), zinc (Zn), tin (Sn), chromium (Cr), cobalt (Co), rhodium (Rh), tungsten (W), iron (Fe), copper (Cu), gold (Au), ruthenium (Ru), osmium (Os), titanium (Ti), nickel (Ni), rhenium (Re), palladium (Pd), iridium (Ir), platinum (Pt), $In_2O_3$, $GeO_2$, $SnO_2$, $MoO_2$, $MoO_3$, $WO_3$, $CuO$, $TiO_2$, $V_2O_5$, $NiO_x$ ($0 \leq x \leq 3/2$), $CrO_{3-x}$ ($0 \leq x \leq 2$), $Ta_2O_5$, $Co_3O_4$, or any combination thereof.

In an embodiment, the first inorganic material may be a single material of $In_2O_3$, $MoO_3$, or $WO_3$; a mixture of $In_2O_3$, $GeO_2$, and $SnO_2$; or a mixture of $In_2O_3$ and $SnO_2$, but embodiments of the present disclosure are not limited thereto. When the first inorganic material includes a mixture of $In_2O_3$ and $SnO_2$, an amount of $SnO_2$ may be in a range of about 3 wt % to about 5 wt % based on the total weight of the first inorganic material.

In an embodiment, the conductive oxide may be a transparent conductive oxide. In this regard, the first electrode 110 may be a transmissive electrode.

In an embodiment, the conductive oxide may include indium tin oxide (ITO), indium zinc oxide (IZO), tin oxide ($SnO_2$), zinc oxide (ZnO), or any combination thereof.

Because the first electrode 110 includes the first inorganic material, an absolute value of a work function of the first electrode 110 may be increased. For example, as compared with a case in which only the conductive oxide is included as a material for forming the first electrode 110, the absolute value of the work function of the first electrode 110 may be greater when the first electrode 110 further includes the first inorganic material.

In the case of ITO, which is utilized as a material for forming an anode in a related art light-emitting device, the absolute value of the work function may be about 4.8 eV, and because the work function is not deep (e.g., not high enough), a hole injection barrier may exist between the anode and the hole injection layer, thereby decreasing luminescence efficiency. In the light-emitting device 10 according to an embodiment, the first inorganic material as described above may be applied to the first electrode 110 to improve hole injection characteristics, and thus, the absolute value of the work function of the first electrode 110 may be increased, thereby improving the hole injection characteristics.

In an embodiment, the absolute value of the work function of the first electrode 110 may be about 5.0 eV to about 5.3 eV.

In an embodiment, an amount of the first inorganic material in the first electrode 110 may be greater than 0 wt % and less than 50 wt % based on the total weight of the first electrode 110, for example, greater than 0.5 wt % and less than 50 wt %.

The first electrode 110 may have a single-layered structure consisting of a single layer or a multilayer structure including a plurality of layers. For example, the first electrode 110 may have a three-layered structure of ITO/Ag/ITO.

Interlayer 130

The interlayer 130 may be located on the first electrode 110. The interlayer 130 may include an emission layer, and may further include a hole transport region located between the first electrode 110 and the emission layer and an electron transport region located between the emission layer and the second electrode 150.

The interlayer 130 may further include, in addition to various suitable organic materials, a metal-containing compound such as an organometallic compound, an inorganic material such as quantum dots, and/or the like.

In one or more embodiments, the interlayer 130 may include, i) two or more emitting units sequentially stacked between the first electrode 110 and the second electrode 150 and ii) a charge generation layer located between two adjacent emitting units. When the interlayer 130 includes the two or more emitting units and the charge generation layer as described above, the light-emitting device 10 may be a tandem light-emitting device.

Hole Transport Region in Interlayer 130

The hole transport region may include a hole injection layer.

The hole transport region may further include a hole transport layer, an emission auxiliary layer, an electron blocking layer, or any combination thereof located between the hole injection layer and the emission layer.

In an embodiment, the hole transport region may have the hole injection layer/hole transport layer structure, the hole injection layer/hole transport layer/emission auxiliary layer structure, or the hole injection layer/hole transport layer/electron blocking layer structure, wherein, in each structure, constituting layers are sequentially stacked from the first electrode 110 in the respective stated order.

Hole Injection Layer

The hole injection layer may include a second inorganic material.

The second inorganic material may include calcium (Ca), scandium (Sc), titanium (Ti), strontium (Sr), ytterbium (Y), zirconium (Zr), niobium (Nb), barium (Ba), hafnium (Hf), tantalum (Ta), lanthanum (La), neodymium (Nd), gadolinium (Gd), $HfO_x$ ($0<x\leq2$), $ZrO_x$ ($0<x\leq2$), $LaO_x$ ($0<x\leq3/2$), $LaAlO_x$ ($0<x\leq3$), $TaO_x$ ($0<x\leq5/2$), $AlO_x$ ($0<x\leq3/2$), $SiO_2$, $ZrSiO_4$, $HfSiO_4$, SrO, $Y_2O_3$, CaO, BaO, $BaZrO_3$, MgO, $TiO_2$, $Si_3N_4$, or any combination thereof.

In an embodiment, the second inorganic material may include Ca, Sc, Ti, Sr, Y, Zr, Nb, Ba, Hf, Ta, La, Nd, Gd, $HfO_2$, $ZrO_2$, $La_2O_3$, $LaAlO_3$, $Ta_2O_5$, $Al_2O_3$, $SiO_2$, $ZrSiO_4$, $HfSiO_4$, SrO, $Y_2O_3$, CaO, BaO, $BaZrO_3$, MgO, $TiO_2$, $Si_3N_4$, or any combination thereof.

The second inorganic material may have a dielectric constant (k) of 4.0 to 60. In an embodiment, the second inorganic material may be a high dielectric constant material having a dielectric constant greater than or equal to a dielectric constant of $SiO_2$.

When the hole injection layer includes the second inorganic material, injection of holes into the emission layer may be increased due to the dipole effect of a high dielectric constant material. Accordingly, the light-emitting device 10 may have a low driving voltage, high efficiency, and/or a long lifespan by including the second inorganic material.

In the light-emitting device 10 according to an embodiment, because the first electrode 110 and the hole injection layer respectively include the first inorganic material and the second inorganic material as described above, high hole injection efficiency may be obtained. For example, the first inorganic material included in the first electrode 110 may reduce a hole injection barrier by increasing a work function of the first electrode 110, and injection of holes between the first electrode 110 and the hole injection layer may be enhanced (e.g., maximized) due to the dipole effect of the second inorganic material. Accordingly, the light-emitting device 10 according to an embodiment may have a low driving voltage, improved efficiency, and/or an improved lifespan.

In an embodiment, the hole injection layer may be in direct contact with the first electrode 110.

In an embodiment, the hole injection layer may consist of the second inorganic material, or the hole injection layer may include the second inorganic material and a hole transport material.

The hole transport material may include, for example, a compound represented by Formula 201, a compound represented by Formula 202, or any combination thereof:

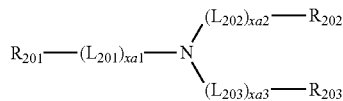

Formula 201

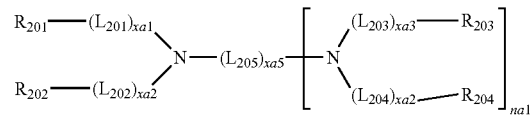

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and 0201 may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, the hole transport material may include at least one of the groups represented by Formulae CY201 to CY217. In one or more embodiments, each of Formulae 201 and 202 may include at least one of the groups represented by Formulae CY201 to CY217:

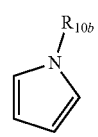

CY201

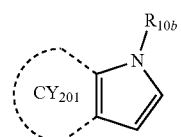

CY202

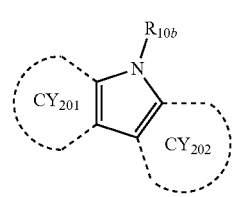

CY203

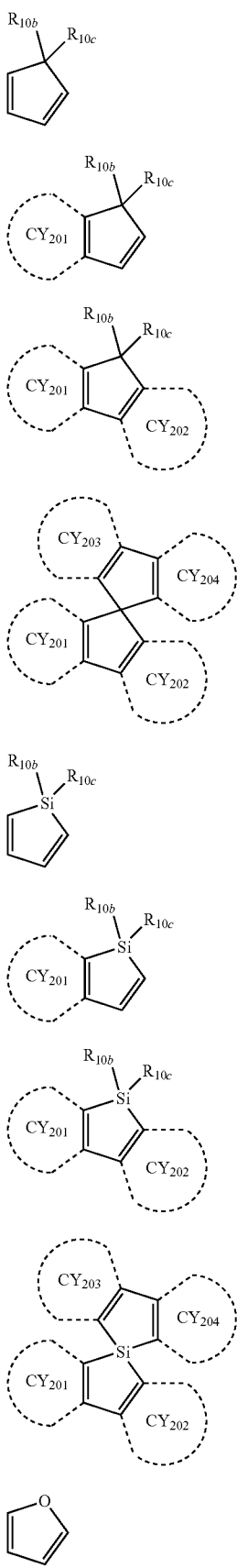

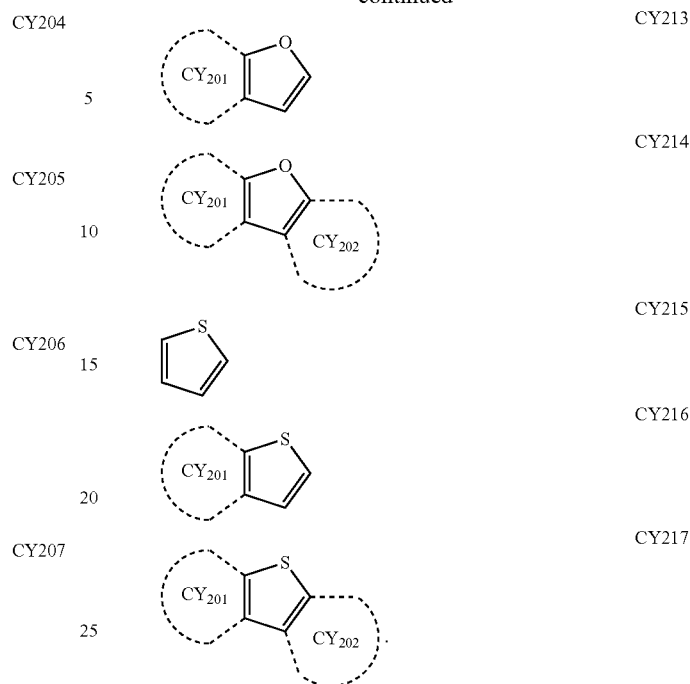

$R_{10b}$ and Rio in Formulae CY201 to CY217 are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include any of the groups represented by Formulae CY201 to CY203.

In one or more embodiments, each of Formulae 201 and 202 may not include any of the groups represented by Formulae CY201 to CY203, and may include at least one of the groups represented by Formulae CY204 to CY217.

In one or more embodiments, each of Formulae 201 and 202 may not include any of the group represented by Formulae CY201 to CY217.

In an embodiment, when the hole injection layer includes the second inorganic material and the hole transport material, the absolute value of the work function of the first electrode may be greater than or equal to an absolute value of a highest occupied molecular orbital (HOMO) energy level of the hole transport material. When the condition described above is satisfied, holes may be efficiently injected from the first electrode 110 to the emission layer, and thus, the driving voltage of the light-emitting device 10 may be reduced.

In an embodiment, the hole injection layer may have a multi-layered structure including at least two different layers.

In an embodiment, the hole injection layer may include at least one single material layer (e.g., a layer consisting of a single material) and at least one mixed layer (e.g., a layer composed of a mixture of two or more materials), wherein the single material layer may consist of the second inorganic material, and the mixed layer may include the second inorganic material and the hole transport material. The single material layer and the mixed layer may be arranged alternately with each other.

In an embodiment, the hole injection layer may include a first single material layer and a first mixed layer sequentially arranged from the first electrode 110 in the stated order, the hole injection layer may include a first mixed layer and a first single material layer sequentially arranged from the first electrode 110 in the stated order, the hole injection layer may include a first single material layer, a first mixed layer, and a second single material layer sequentially arranged from the first electrode 110 in the stated order, or the hole injection layer may include a first mixed layer, a first single material layer, and a second mixed layer sequentially arranged from the first electrode 110 in the stated order.

In one or more embodiments, the hole injection layer may include at least one single material layer and at least one auxiliary layer, wherein the single material layer may be a layer consisting of the second inorganic material, and the auxiliary layer may be a layer consisting of the hole transport material. The single material layer and the auxiliary layer may be arranged alternately with each other. In an embodiment, the hole injection layer may include one single material layer and one auxiliary layer, and the auxiliary layer may be located between the first electrode 110 and the single material layer, or located between the single material layer and the second electrode 150. In one or more embodiments, the hole injection layer may include two single material layers and one auxiliary layer, and the auxiliary layer may be located between the two single material layers.

In an embodiment, among a plurality of layers included in the hole injection layer, a layer adjacent to the first electrode 110 may be in direct contact with the first electrode 110.

When the hole injection layer includes the second inorganic material and the hole transport material, an amount of the second inorganic material in the hole injection layer may be greater than 0 wt % and less than 50 wt % based on the total weight of the hole injection layer. In an embodiment, the amount of the second inorganic material may be in a range of about 0.5 wt % to about 20 wt % based on the total weight of the hole injection layer. When the amount of the second inorganic material is within the range described above, hole injection efficiency and luminescence efficiency may be improved.

In an embodiment, the hole transport material may include one of Compounds HT1 to HT71, m-MTDATA, TDATA, 2-TNATA, NPB(NPD), β-NPB, TPD, Spiro-TPD, Spiro-NPB, methylated NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

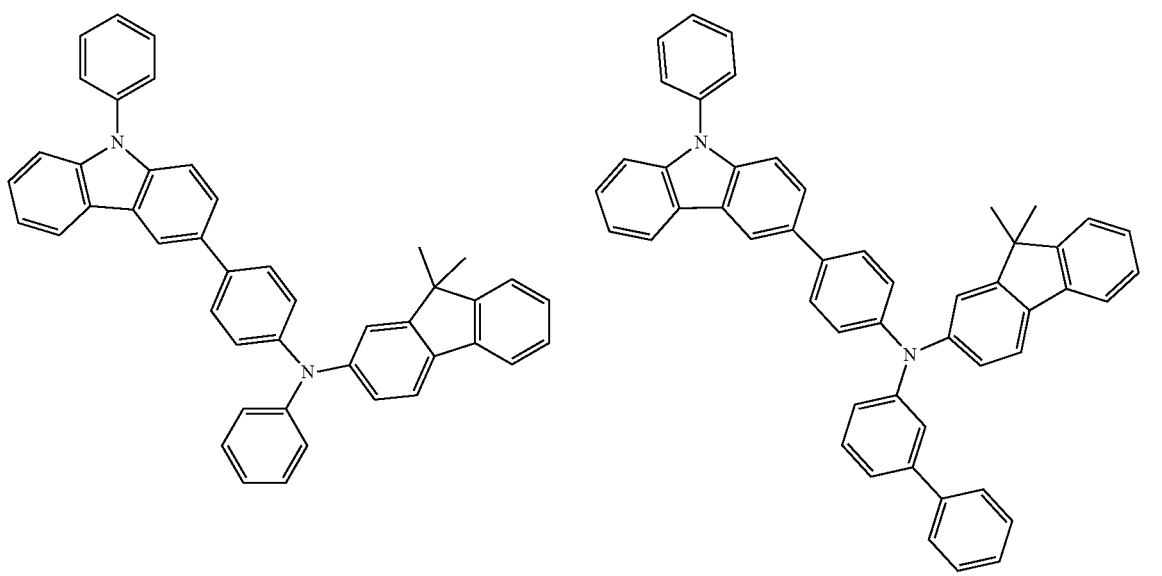

-continued
HT3
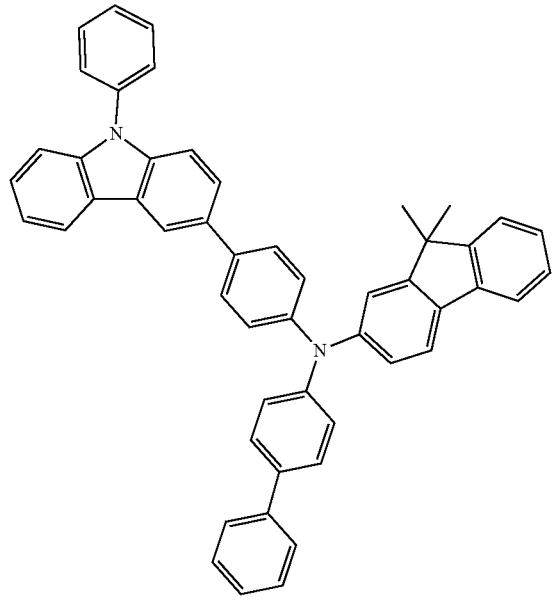
HT4
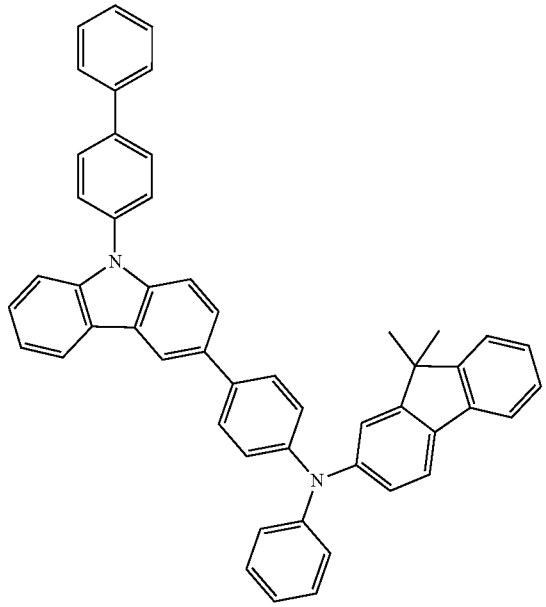
HT5
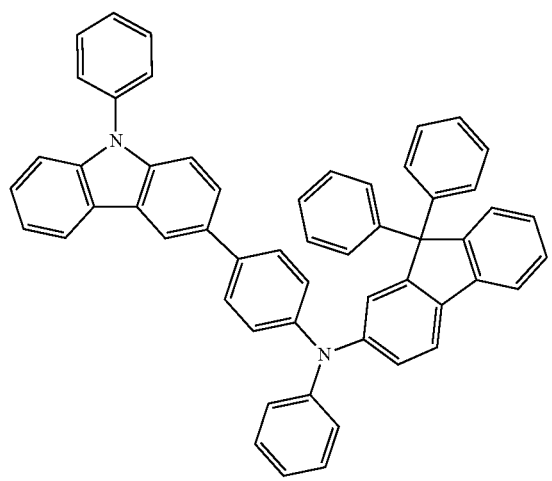
HT6
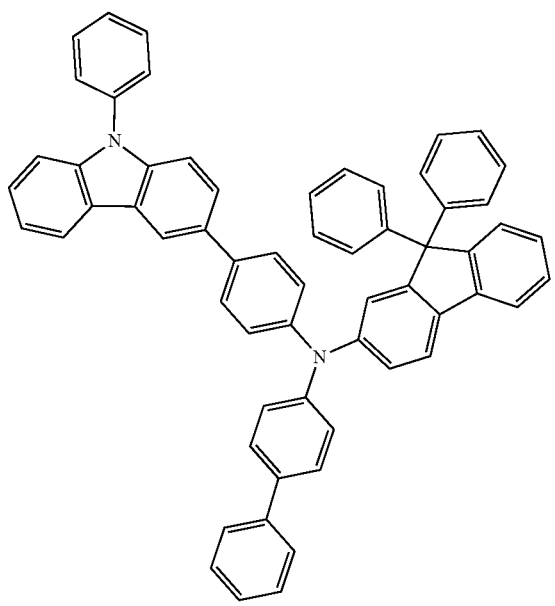

HT7
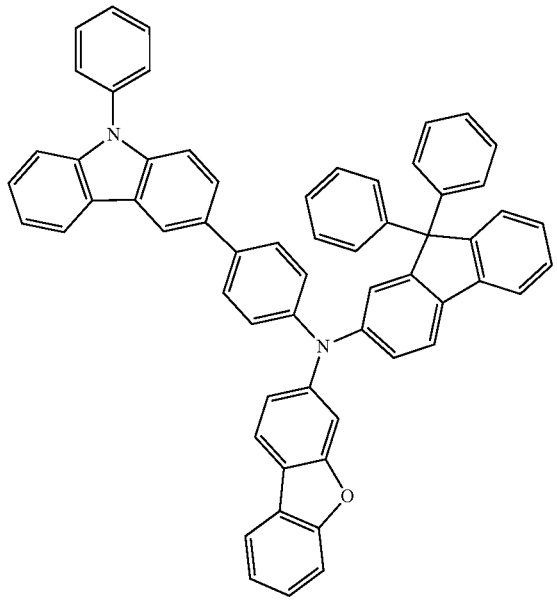
HT8
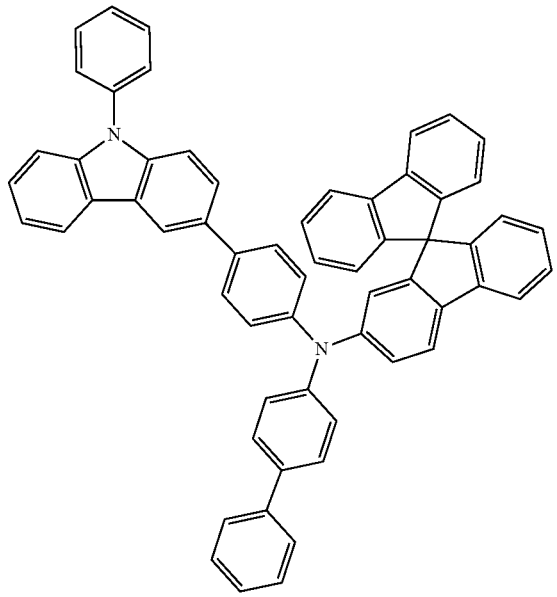
HT9
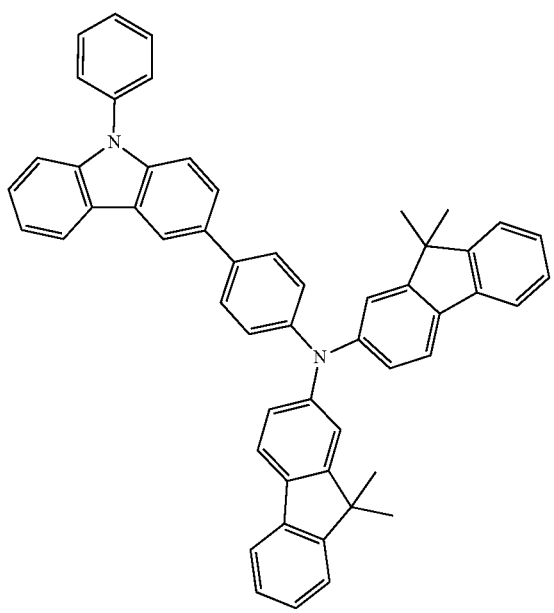
HT10
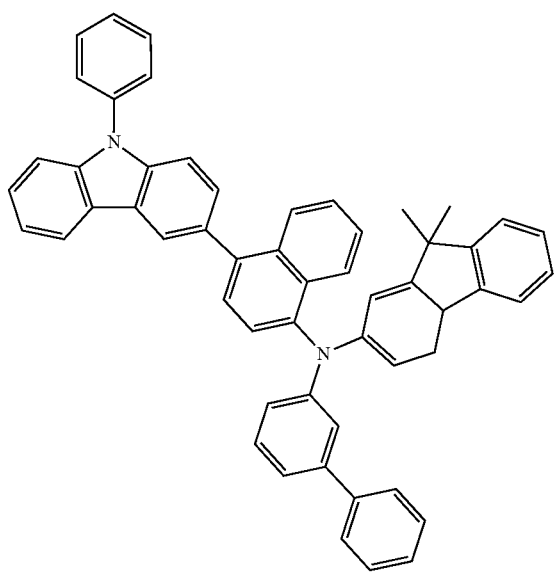

-continued
HT11
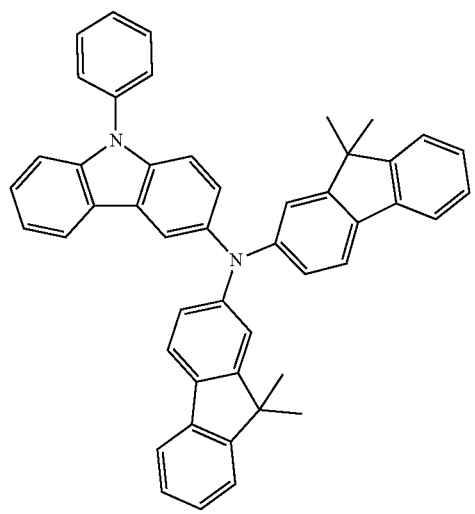
HT12
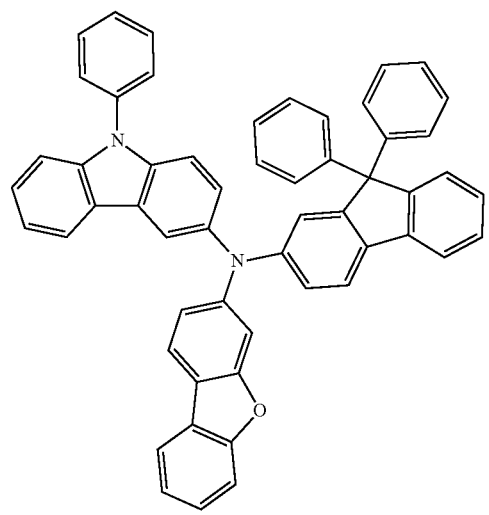
HT13
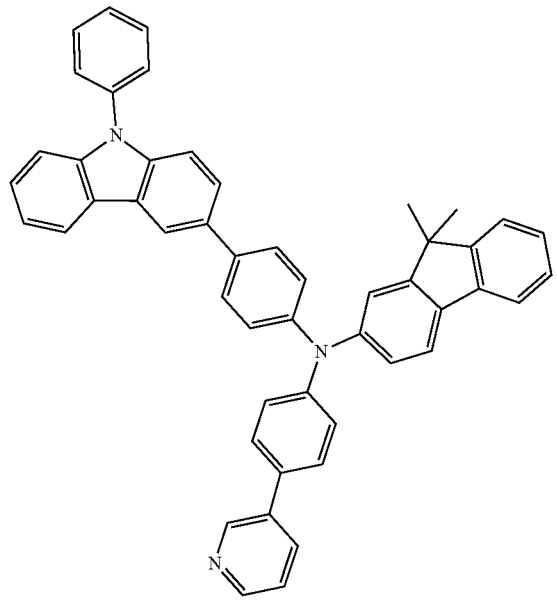
HT14
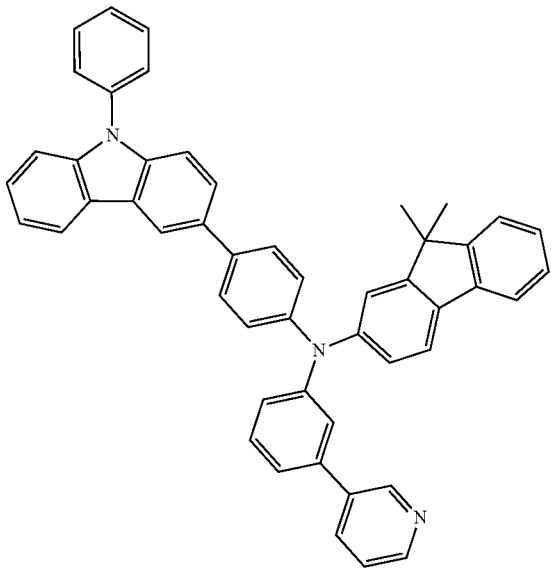
HT15
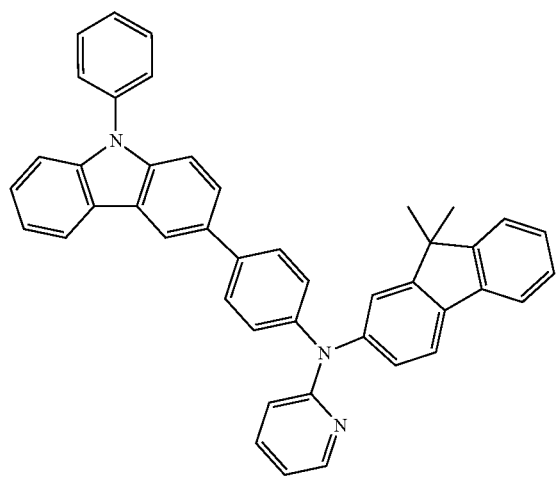
HT16
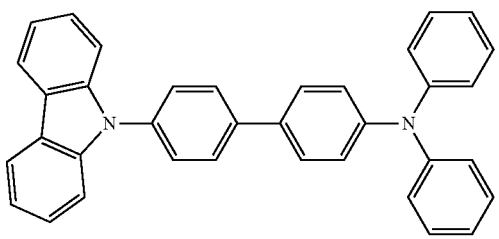

-continued
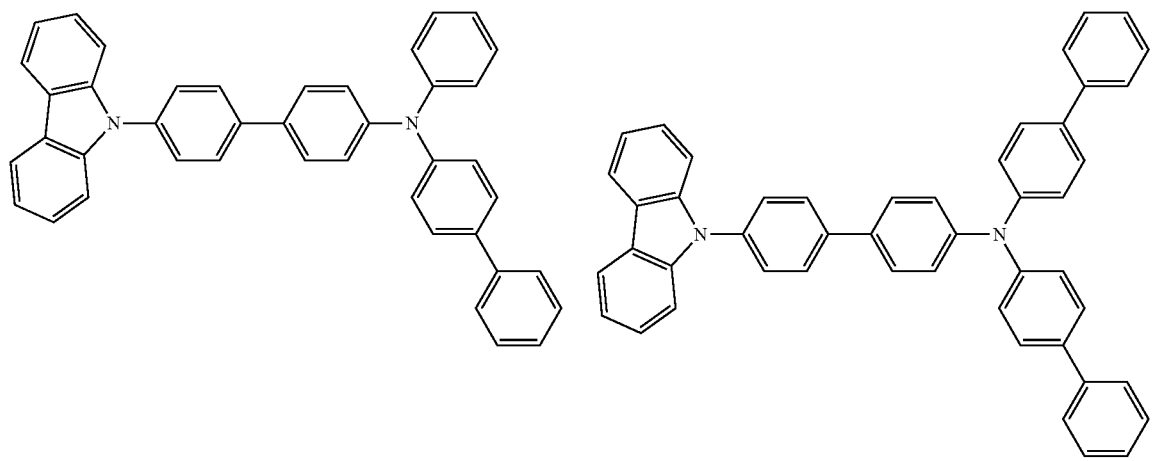
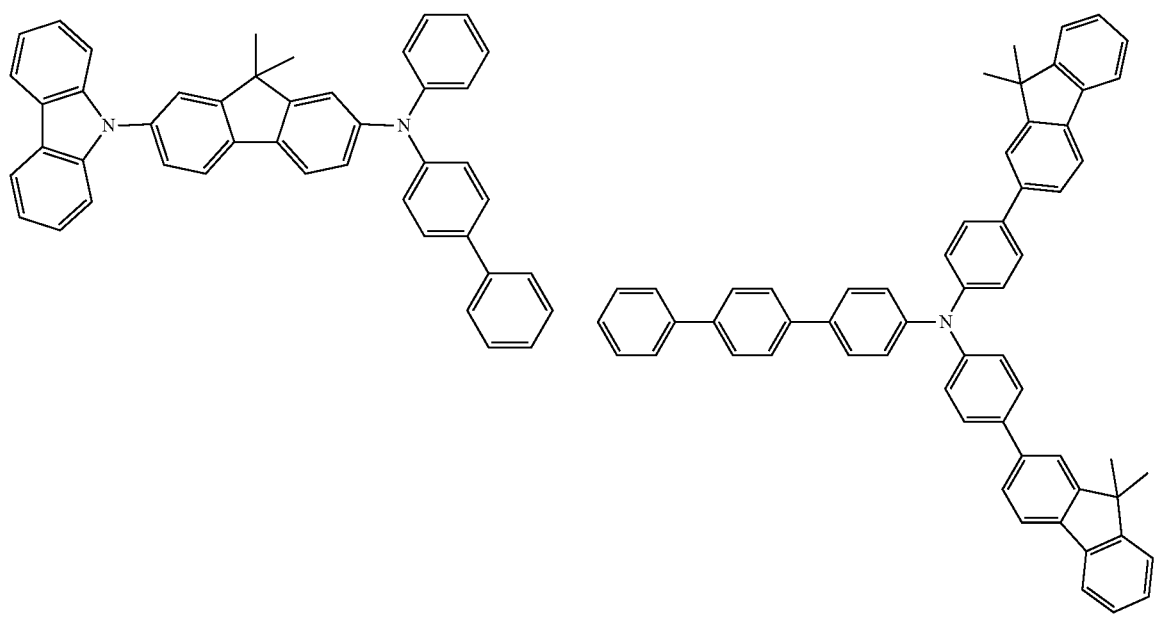

HT21
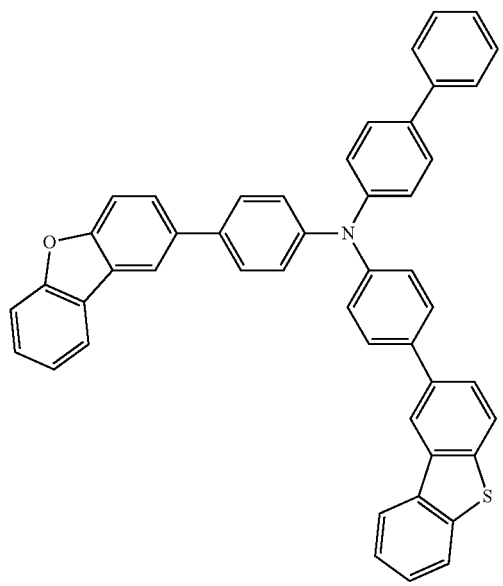
HT22
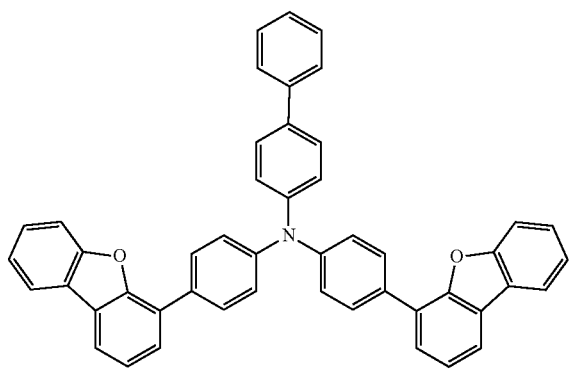
HT23
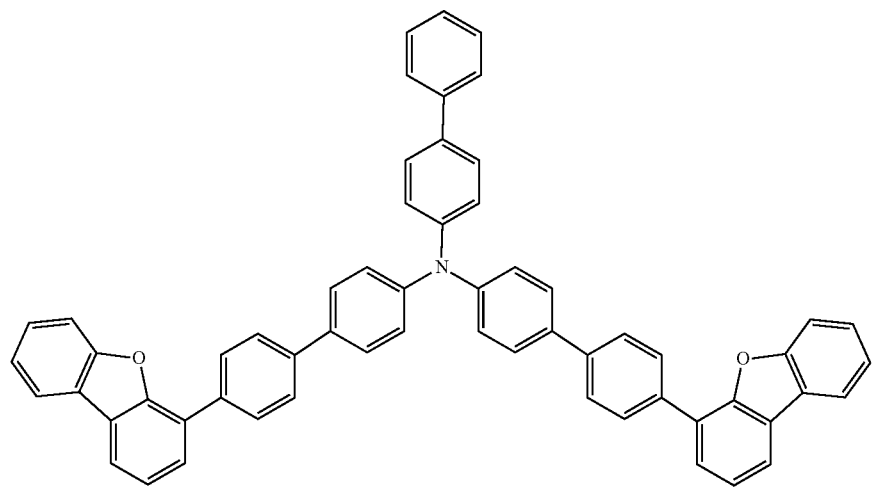

-continued
HT24
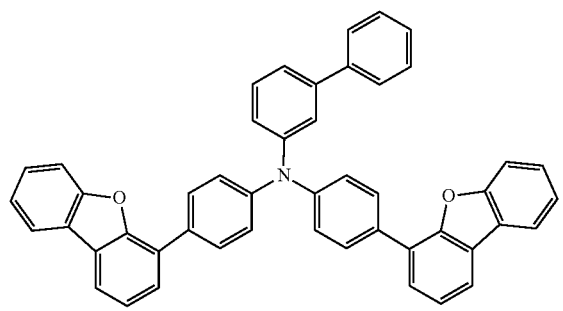
HT25
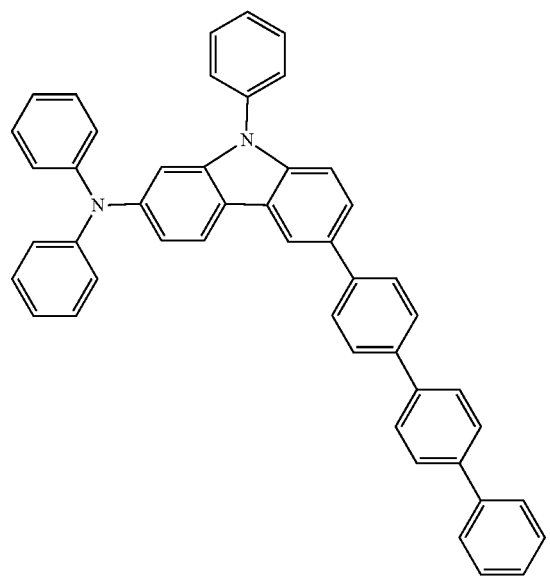
HT26
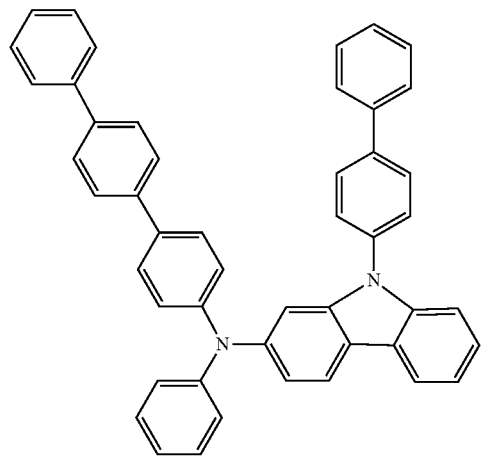
HT27
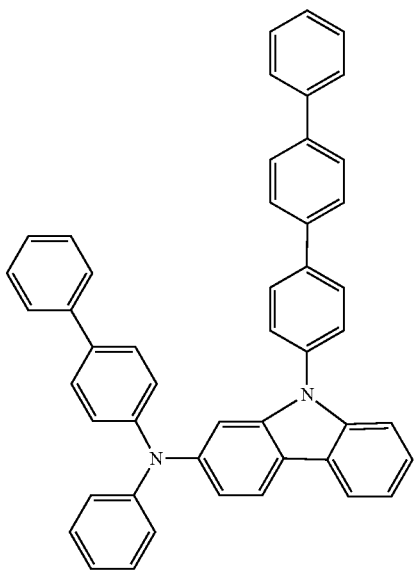
HT28
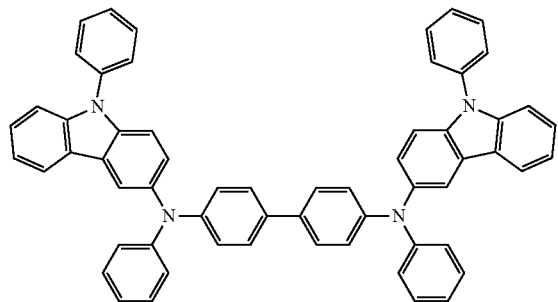
HT29
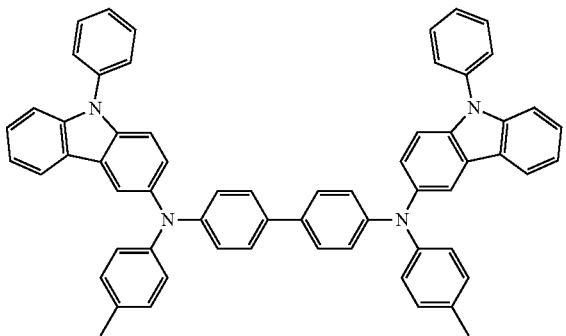

HT30
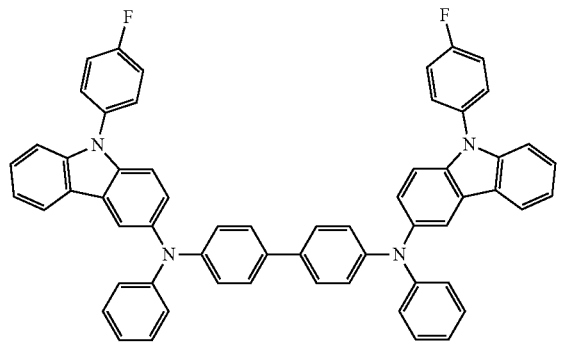
HT31
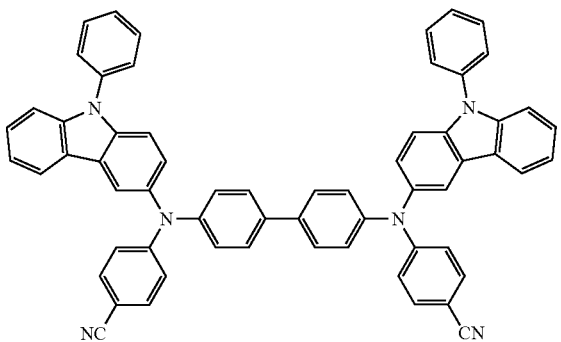
HT32
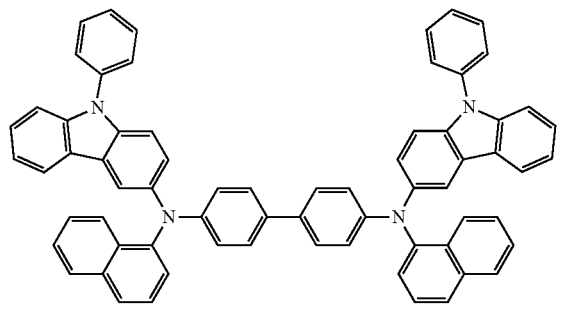
HT33
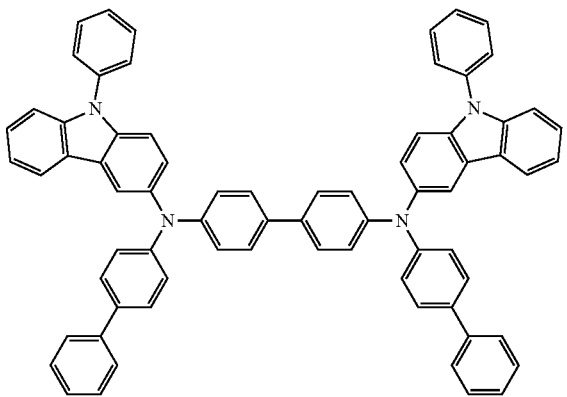
HT34
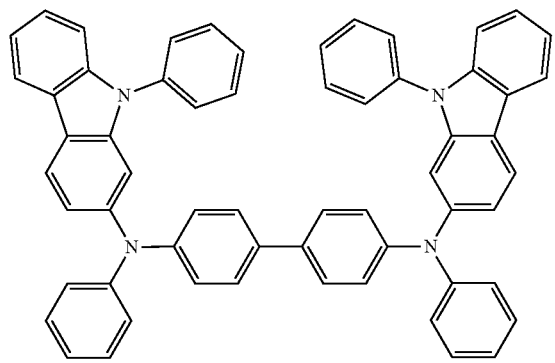
HT35
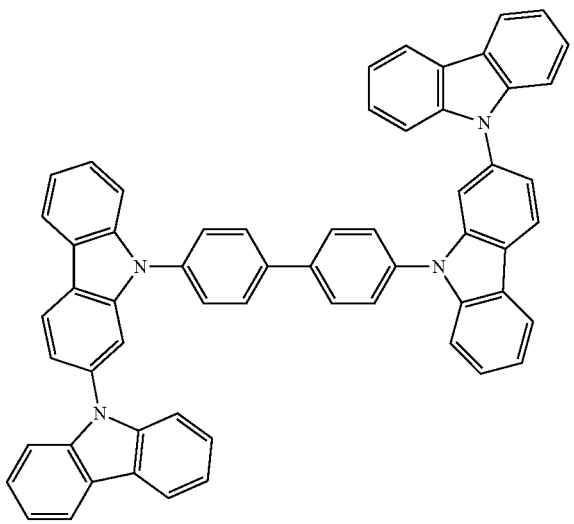

-continued
HT36
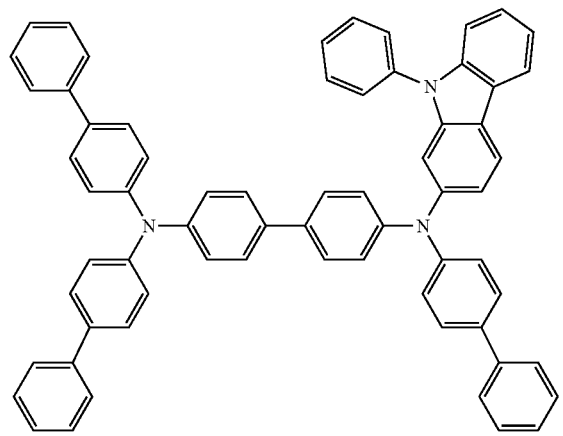
HT37
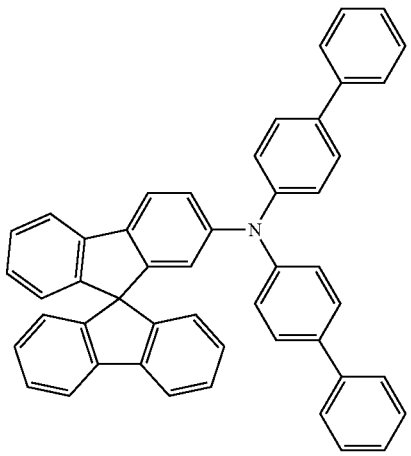
HT38
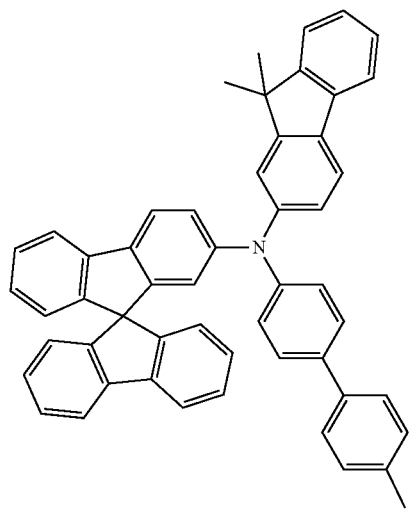
HT39
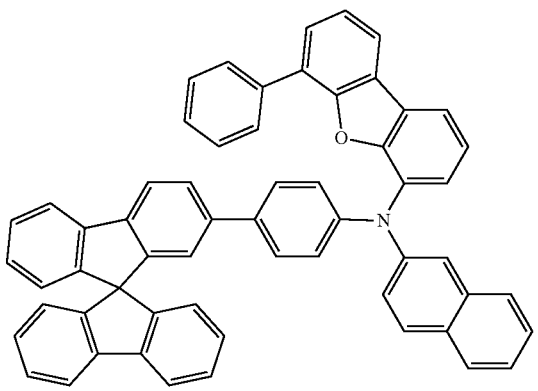
HT40
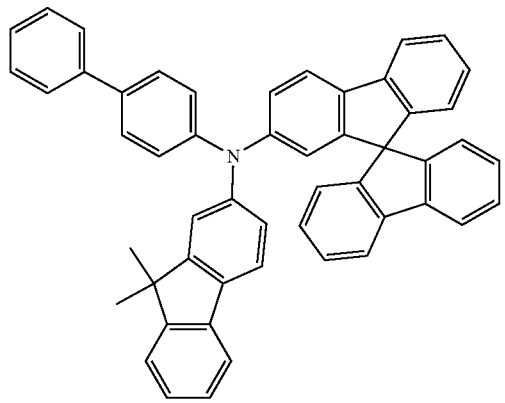
HT41
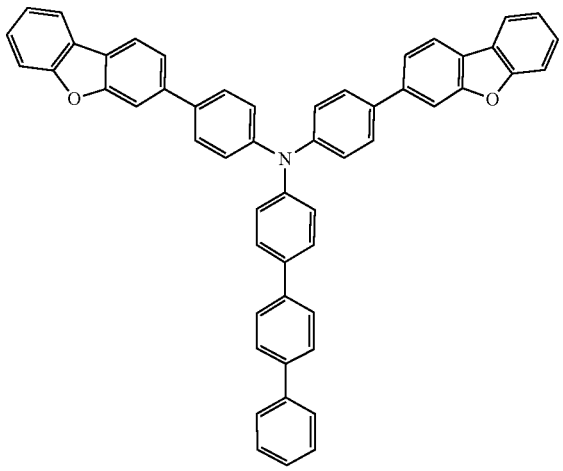

-continued
HT42
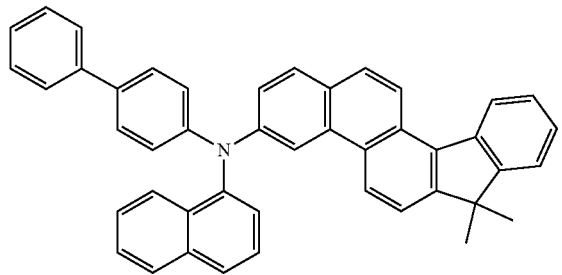
HT43
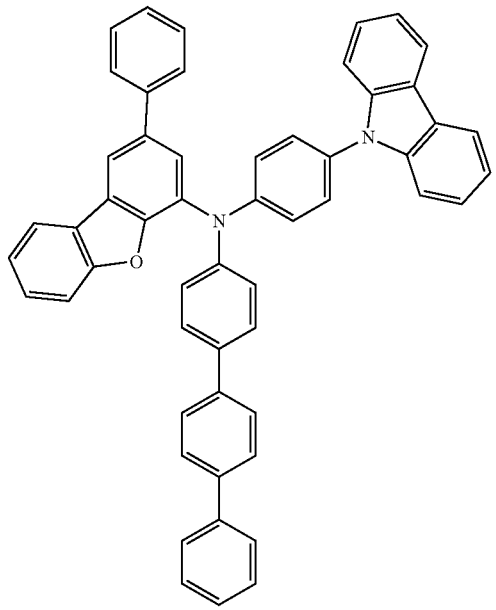
HT44
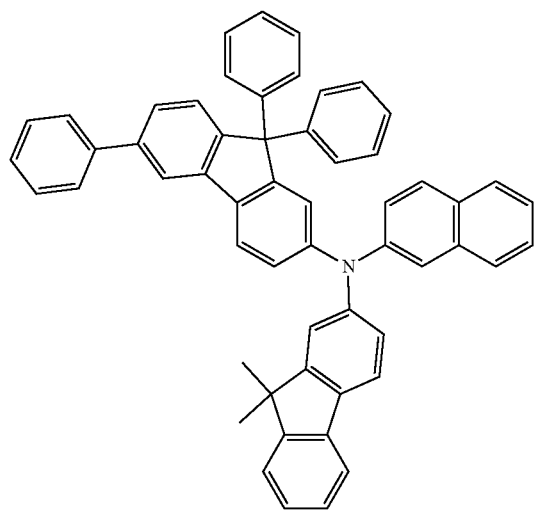
HT45
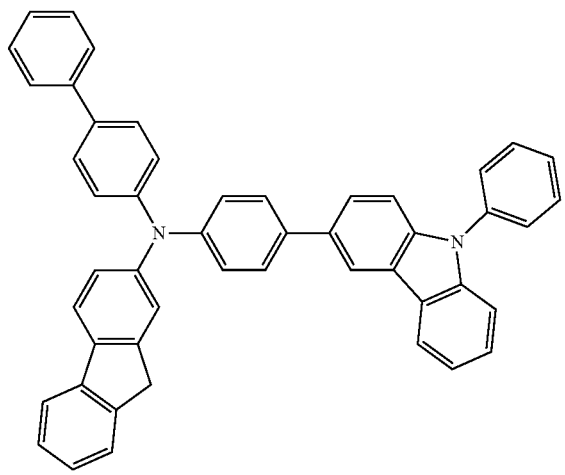
HT46
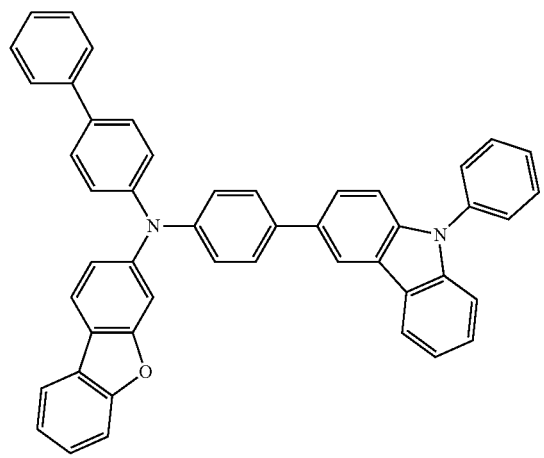
HT47
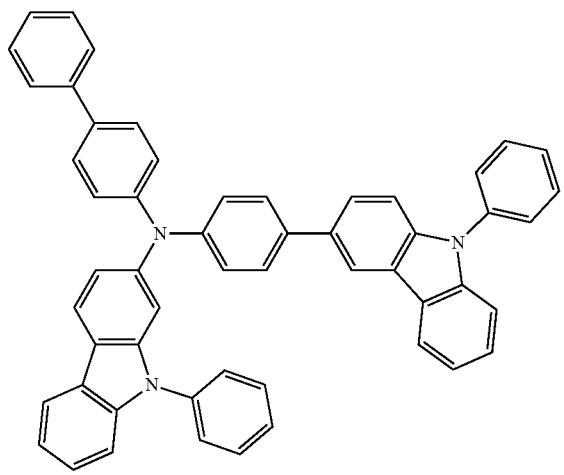

-continued
HT48
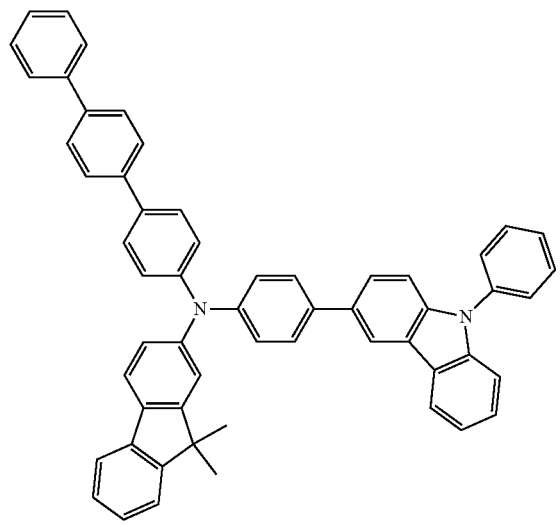
HT49
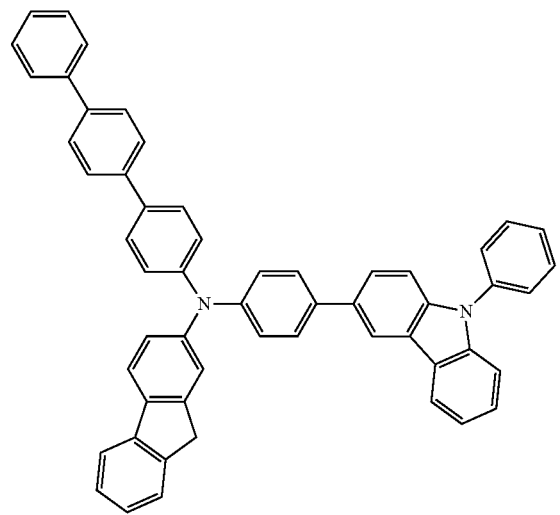
HT50
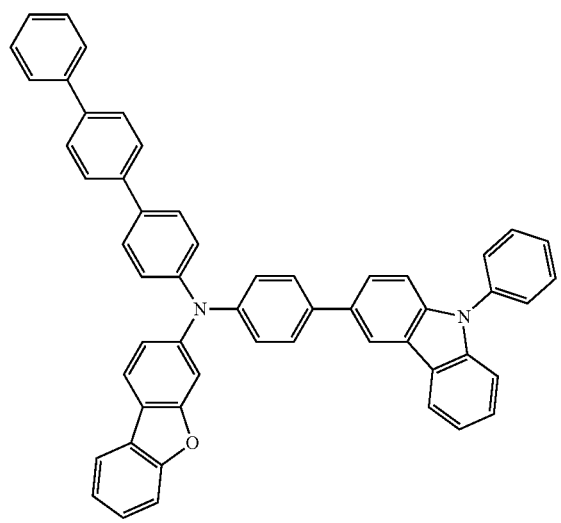
HT51
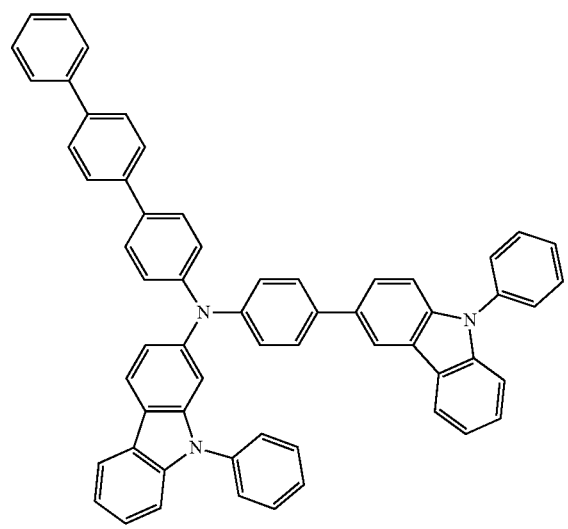
HT52
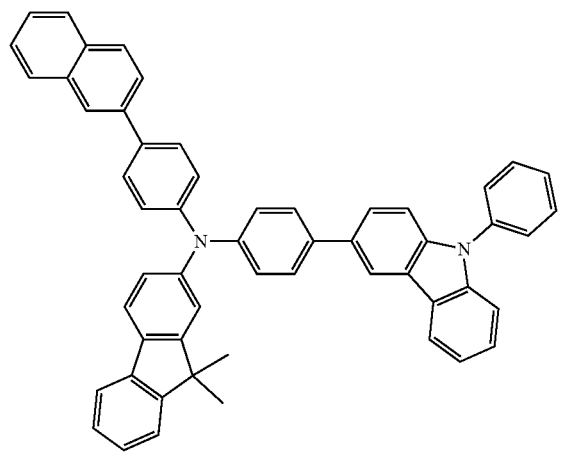
HT53
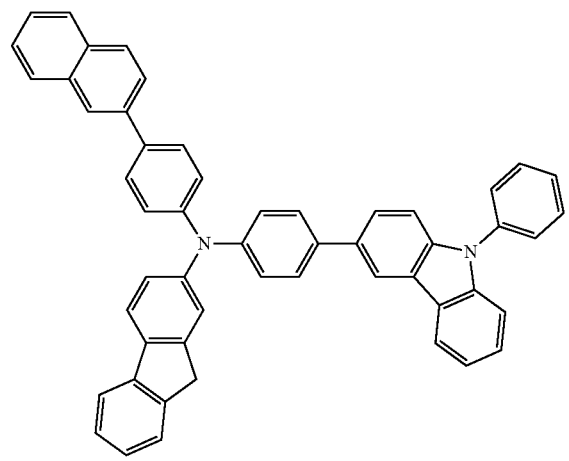

-continued
HT54
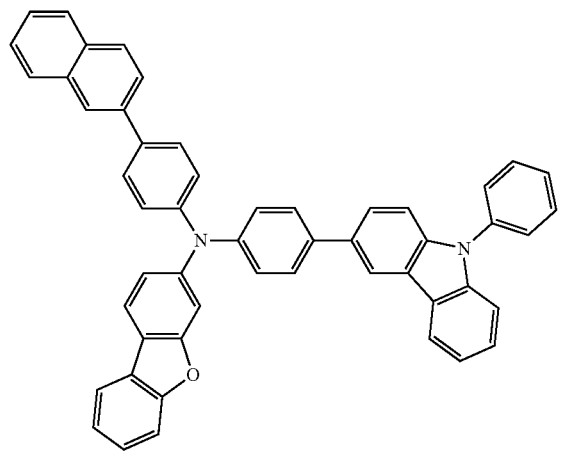
HT55
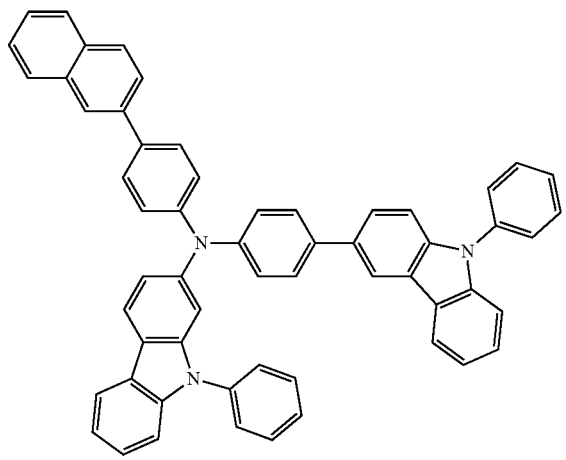
HT56
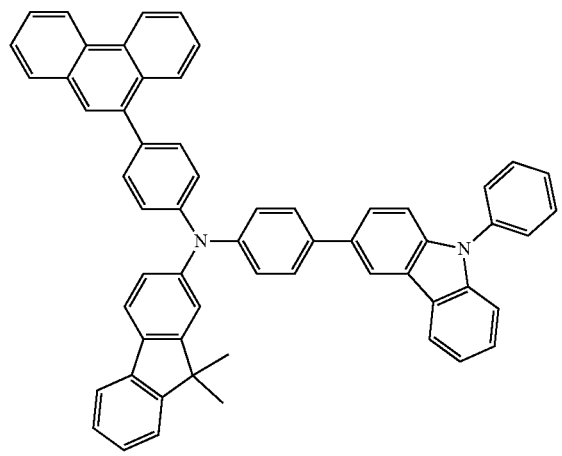
HT57
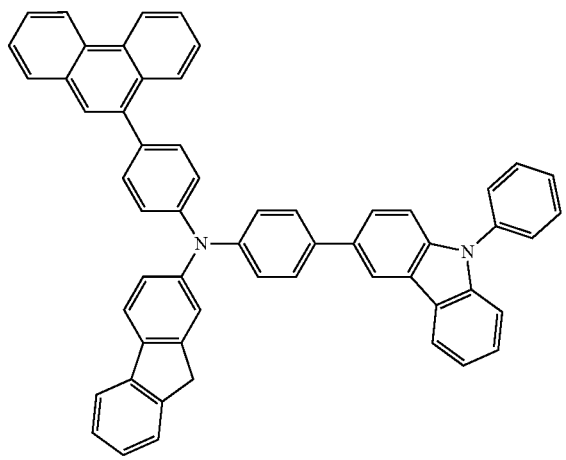
HT58
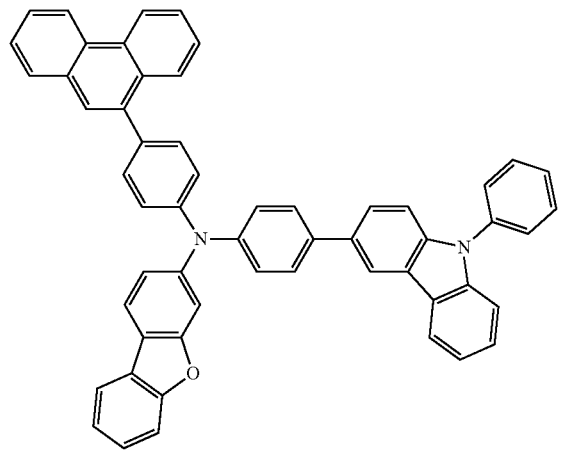
HT59
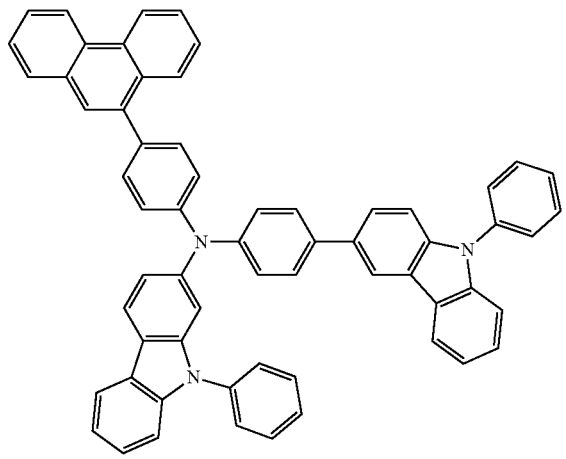

-continued
HT60
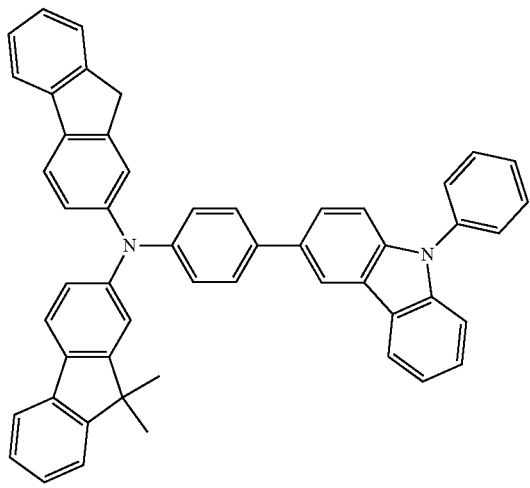
HT61
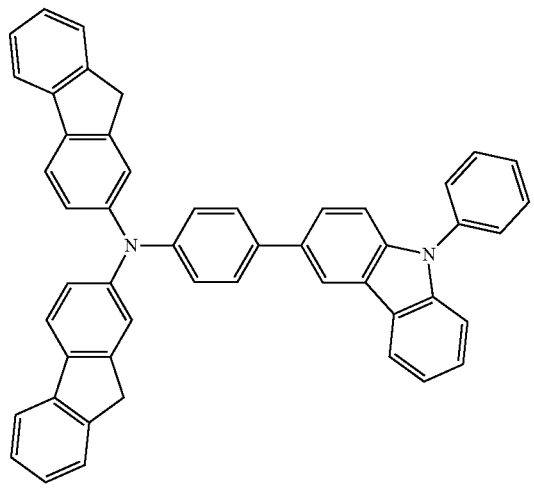
HT62
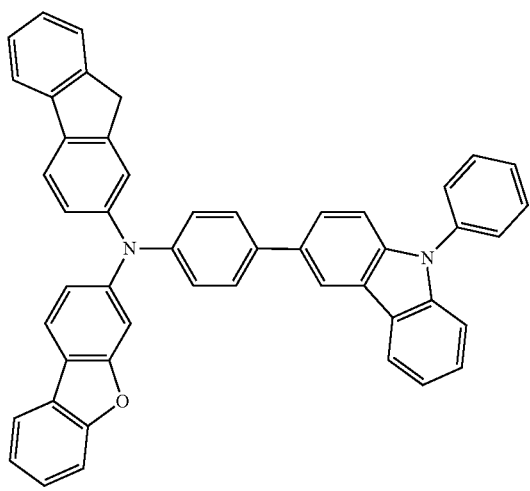
HT63
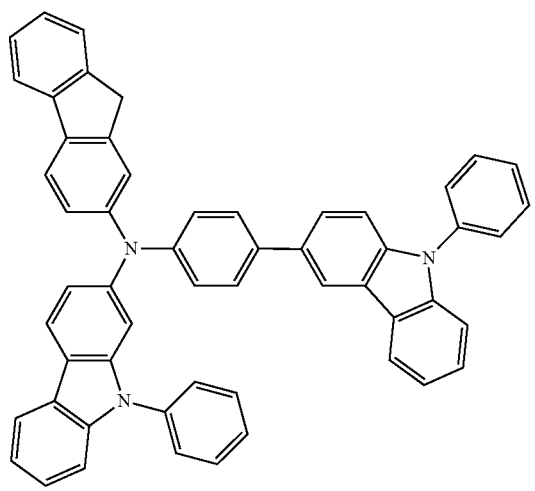
HT64
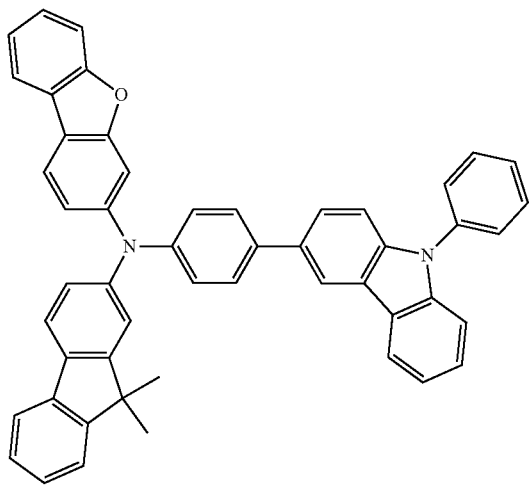
HT65
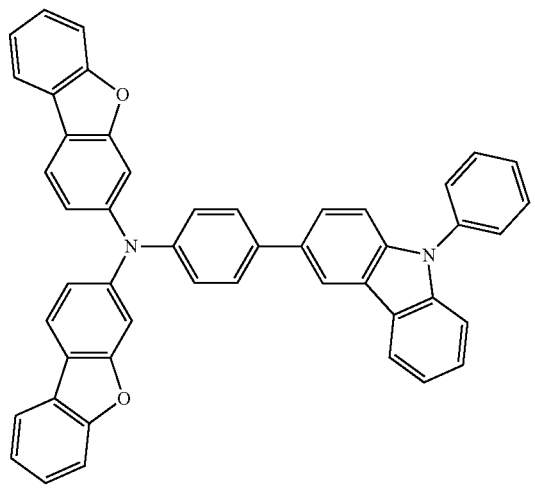

-continued
HT66
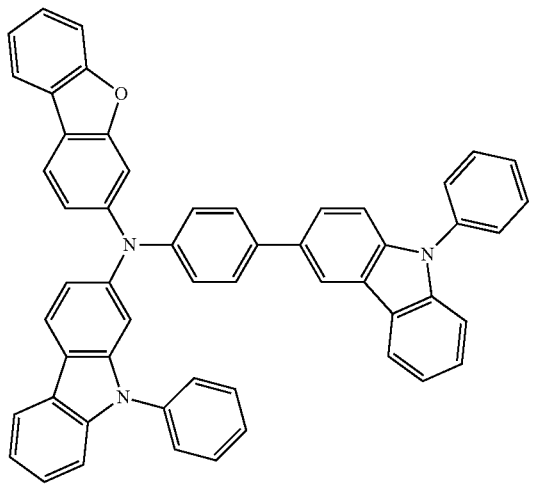
HT67
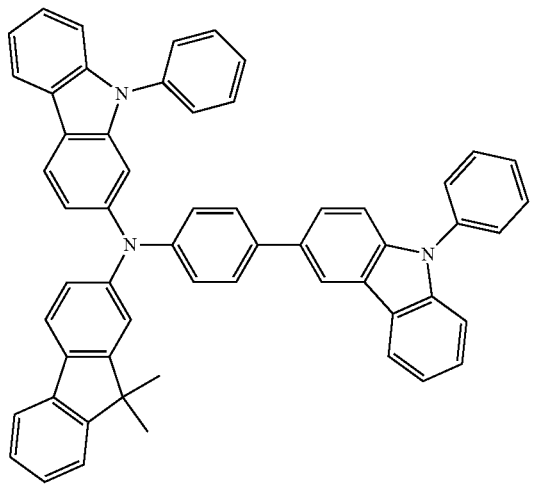
HT68
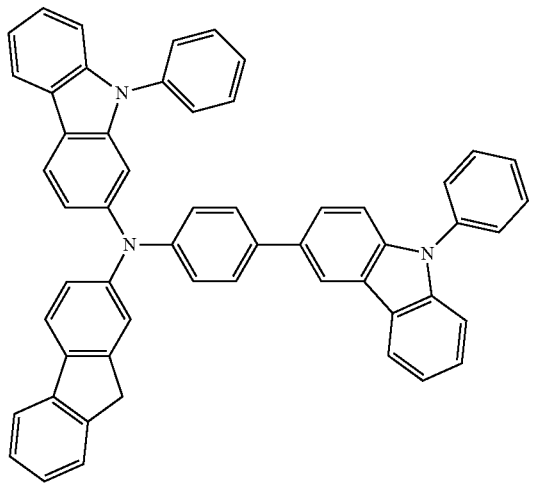
HT69
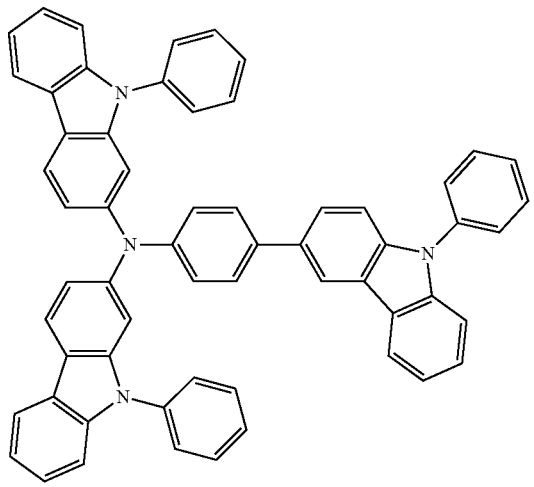
HT70
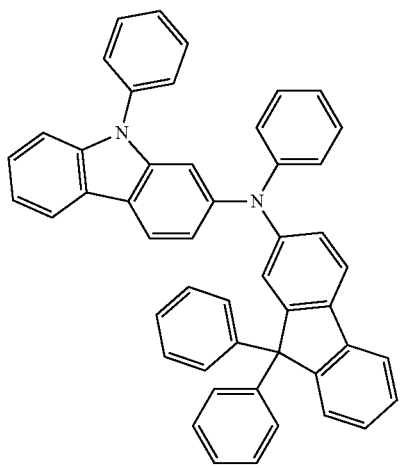
HT71
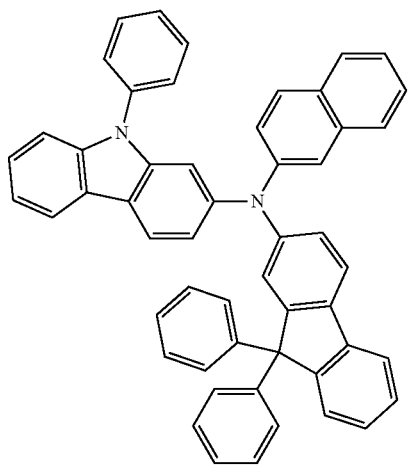

-continued
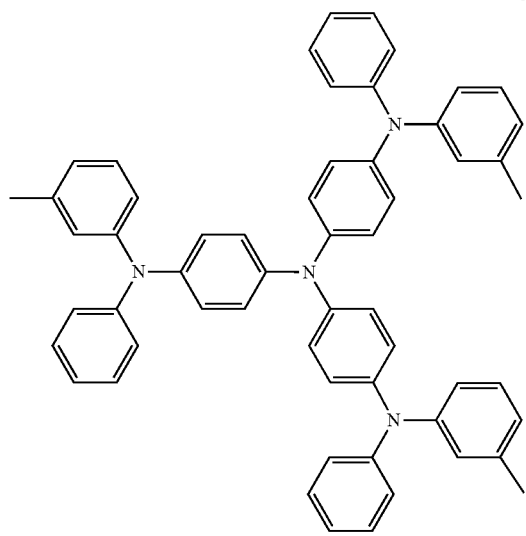
m-MTDATA
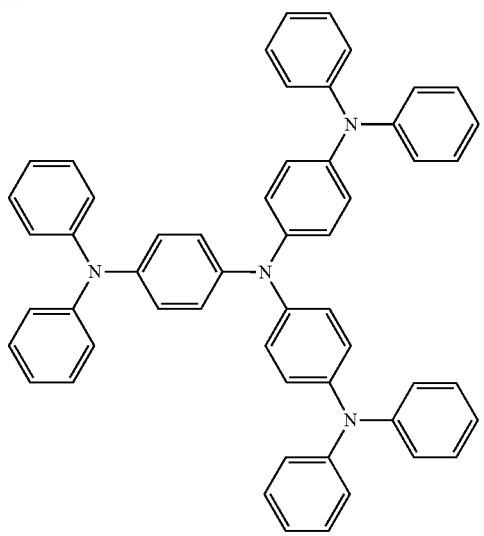
TDATA
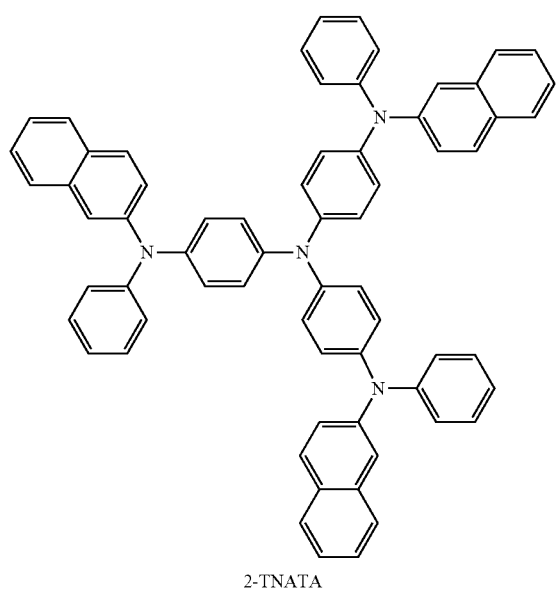
2-TNATA
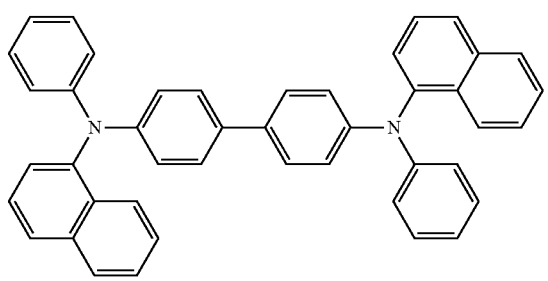
NPB
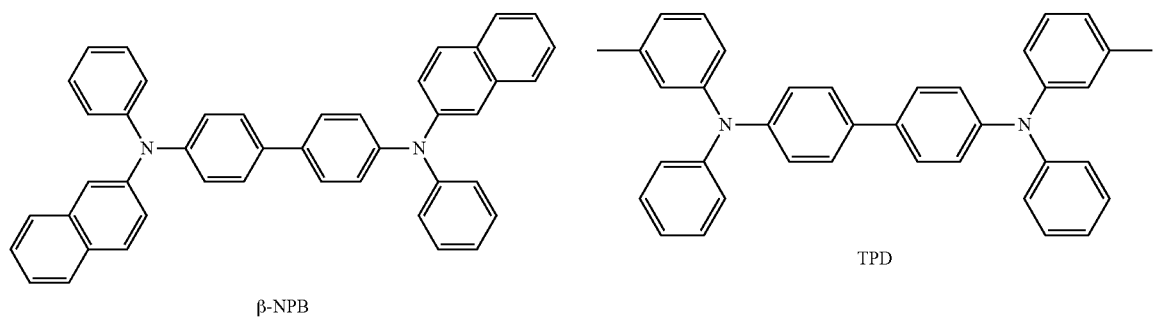
β-NPB
TPD -continued

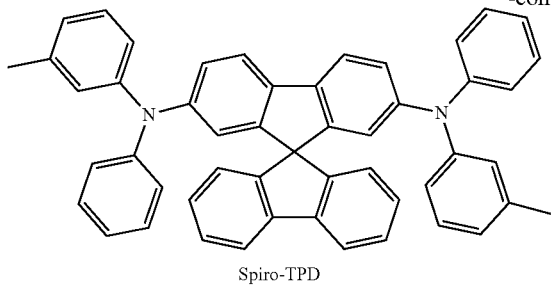
Spiro-TPD

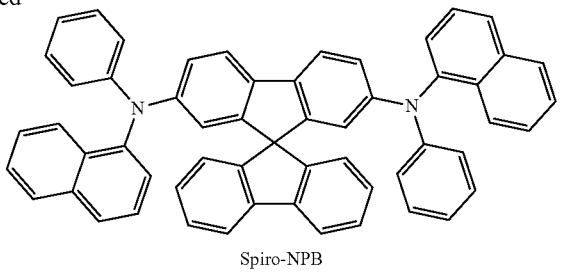
Spiro-NPB

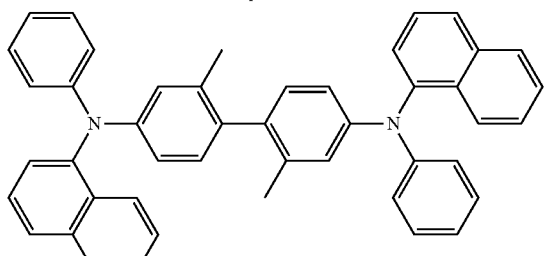
methylated-NPB

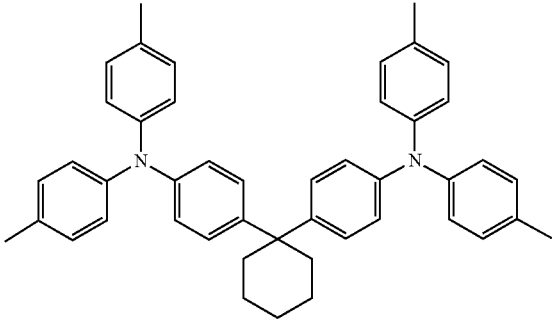
TAPC

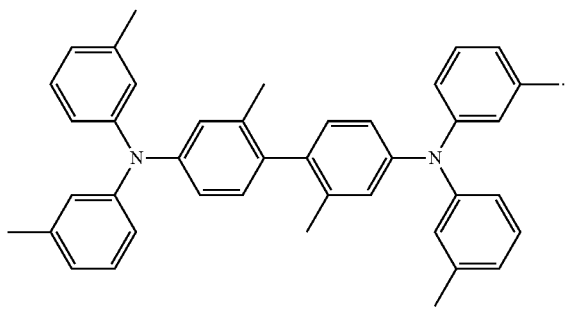
HMTPD

Each layer included in the hole transport region, for example, the hole transport layer, the emission auxiliary layer, the electron blocking layer, or any combination thereof may include the hole transport material as described above.

In an embodiment, the hole transport region may further include a hole transport layer located between the hole injection layer and the emission layer, and the hole transport layer may include the hole transport material as described above. When the hole injection layer includes the hole transport material, the hole transport material included in the hole injection layer and the hole transport material included in the hole transport layer may be identical to each other.

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block the flow of electrons from an electron transport region. The emission auxiliary layer and the electron blocking layer may include the materials as described above.

p-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In one or more embodiments, the lowest unoccupied molecular orbital (LUMO) energy level of the p-dopant may be −3.5 eV or less.

In one or more embodiments, the p-dopant may include a quinone derivative, a cyano group-containing compound, a compound containing element EL1 and element EL2 (to be described in more detail below), or any combination thereof.

Examples of the quinone derivative may include (e.g., may be) TCNQ, F4-TCNQ, etc.

Examples of the cyano group-containing compound may include (e.g., may be) HAT-CN, and a compound represented by Formula 221 below.

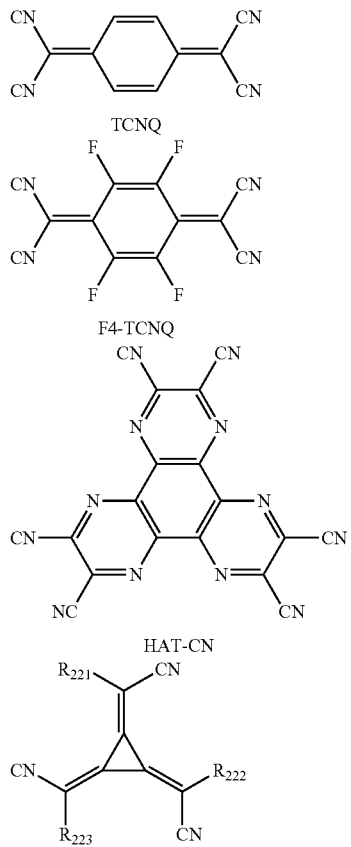

Formula 221

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be a non-metal, a metalloid, or a combination thereof.

Examples of the metal may include (e.g., may be) an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include (e.g., may be) silicon (Si), antimony (Sb), and tellurium (Te).

Examples of the non-metal may include (e.g., may be) oxygen (O) and halogen (for example, F, Cl, Br, I, etc.).

In one or more embodiments, examples of the compound containing element EL1 and element EL2 may include (e.g., may be) a metal oxide, a metal halide (for example, a metal fluoride, a metal chloride, a metal bromide, and/or a metal iodide), a metalloid halide (for example, a metalloid fluoride, a metalloid chloride, a metalloid bromide, and/or a metalloid iodide), a metal telluride, or any combination thereof.

Examples of the metal oxide may include (e.g., may be) tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include (e.g., may be) alkali metal halide, alkaline earth metal halide, transition metal halide, post-transition metal halide, and lanthanide metal halide.

Examples of the alkali metal halide may include (e.g., may be) LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include (e.g., may be) $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include (e.g., may be) titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsC_{12}$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include (e.g., may be) zinc halide (for example, $ZnF_2$, $ZnCl_2$, $ZnBr_2$, $ZnI_2$, etc.), indium halide (for example, $InI_3$, etc.), and tin halide (for example, $Sn_{12}$, etc.).

Examples of the lanthanide metal halide may include (e.g., may be) YbF, YbF$_2$, YbF$_3$, SmF$_3$, YbCl, YbCl$_2$, YbCl$_3$ SmCl$_3$, YbBr, YbBr$_2$, YbBr$_3$ SmBr$_3$, YbI, YbI$_2$, YbI$_3$, and SmI$_3$.

An example of the metalloid halide may include (e.g., may be) antimony halide (for example, SbCl$_5$, etc.).

Examples of the metal telluride may include (e.g., may be) alkali metal telluride (for example, Li$_2$Te, a Na$_2$Te, K$_2$Te, Rb$_2$Te, Cs$_2$Te, etc.), alkaline earth metal telluride (for example, BeTe, MgTe, CaTe, SrTe, BaTe, etc.), transition metal telluride (for example, TiTe$_2$, ZrTe$_2$, HfTe$_2$, V$_2$Te$_3$, Nb$_2$Te$_3$, Ta$_2$Te$_3$, Cr$_2$Te$_3$, Mo$_2$Te$_3$, W$_2$Te$_3$, MnTe, TcTe, ReTe, FeTe, RuTe, OsTe, CoTe, RhTe, IrTe, NiTe, PdTe, PtTe, Cu$_2$Te, CuTe, Ag$_2$Te, AgTe, Au$_2$Te, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be from about 0.01 to about 15 parts by weight based on 100 parts by weight of the host.

In one or more embodiments, the emission layer may include a quantum dot.

In one or more embodiments, the emission layer may include a delayed fluorescence material. The delayed fluorescence material may act (e.g., serve) as a host or a dopant in the emission layer.

In an embodiment, the emission layer may include a host and a dopant, the host may be an anthracene compound, and the dopant may be a boron-containing condensed cyclic compound.

A thickness of the emission layer may be in a range of about 100 Å to about 1,000 Å, for example, about 200 Å to about 600 Å. When the thickness of the emission layer is within these ranges, suitable (e.g., excellent) light-emission characteristics may be obtained without a substantial increase in driving voltage.

Host

The host may include a compound represented by Formula 301:

$$[Ar_{301}]_{xb11}-[(L_{301})_{xb1}-R_{301}]_{xb21} \quad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be the same as described in connection with $Q_1$ (to be described in more detail below).

In one or more embodiments, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, an anthracene compound represented by Formula 301-3, or any combination thereof:

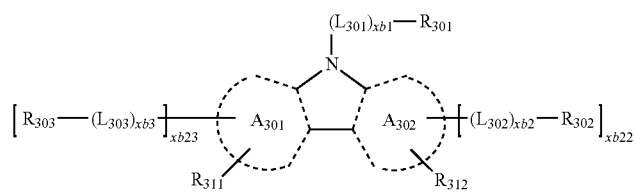

Formula 301-1

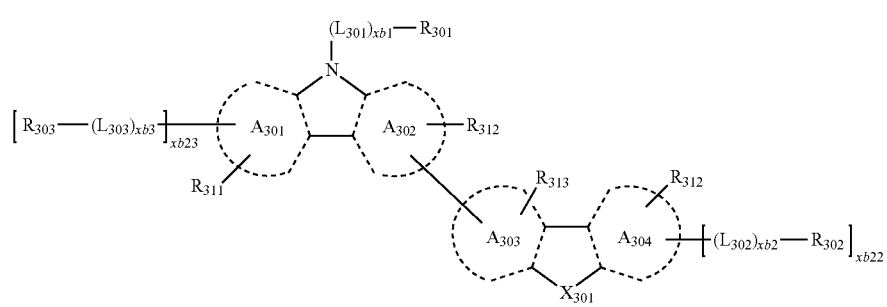

Formula 301-2

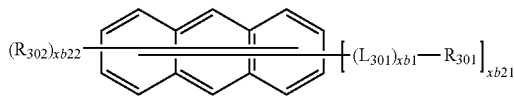

Formula 301-3 wherein, in Formulae 301-1 to 301-3,
ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
$X_3O_1$ may be O, S, N-[$(L_{304})_{xb4}$-$R_{304}$], C($R_{304}$)($R_{305}$), or Si($R_{304}$)($R_{305}$),
xb22 and xb23 may each independently be 0, 1, or 2,
$L_{301}$, xb1, xb21, and $R_{301}$ may each be the same as respectively described in the present specification,
$L_{302}$ to $L_{304}$ may each independently be the same as described in connection with $L_{301}$,
xb2 to xb4 may each independently be the same as described in connection with xb1, and
$R_{302}$ to $R_{305}$ and $R_{311}$ to $R_{314}$ may each independently be the same as described in connection with $R_{301}$.

In an embodiment, the host may be an anthracene compound represented by Formula 301-3A.

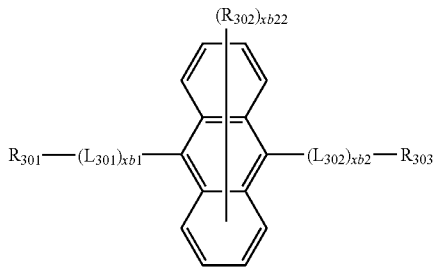

Formula 301-3A

In Formula 301-3A,
$L_{301}$, $L_{302}$, xb1, xb2, $R_{301}$ to $R_{303}$, and xb22 may each independently be the same as respectively described in the present specification.

In an embodiment, at least one of $R_{301}$ or $R_{303}$ in Formula 301-3A may be a π electron-rich $C_3$-$C_{60}$ cyclic group unsubstituted or substituted with at least one $R_{10a}$ or —N($Q_{301}$) ($Q_{302}$).

In an embodiment, at least one of $R_{301}$ or $R_{303}$ in Formula 301-3A may be a group represented by Formula 3A, Formula 3B, or —N($Q_{301}$)($Q_{302}$):

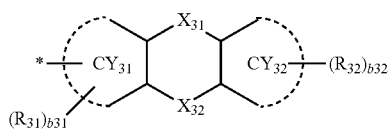

Formula 3A

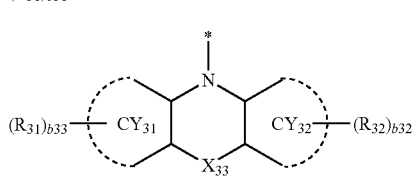

Formula 3B wherein, in Formulae 3A and 3B,
CY31 and CY32 may each independently be a $C_3$-$C_{60}$ carbocyclic group or a $C_1$-$C_{60}$ heterocyclic group,
$X_{31}$ may be selected from O, S, and N($R_{33}$),
$X_{32}$ and $X_{33}$ may each independently be a single bond, O, S, N($R_{34}$), C($R_{34}$)($R_{35}$), or Si($R_{34}$)($R_{35}$),
$R_{31}$ to $R_{35}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$),
b31 may be an integer from 1 to 3,
b32 and b33 may each independently be an integer from 1 to 4,
$R_{10a}$ and $Q_1$ to $Q_3$ may each independently be the same as to be described below, and
* indicates a binding site to a neighboring atom.

In an embodiment, at least one of $R_{301}$ or $R_{303}$ in Formula 301-3A may be one of the groups represented by Formulae 3A-1 to 3A-12 and 3B-1:

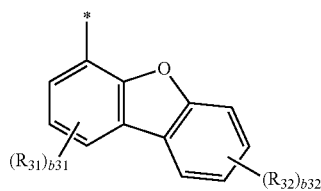

Formula 3A-1

Formula 3A-2

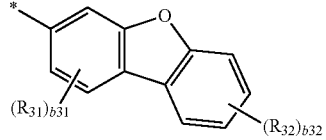

Formula 3A-3

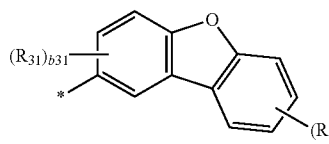

Formula 3A-4

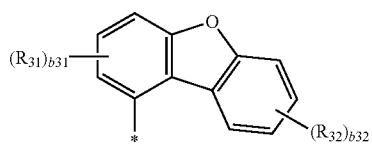

Formula 3A-5

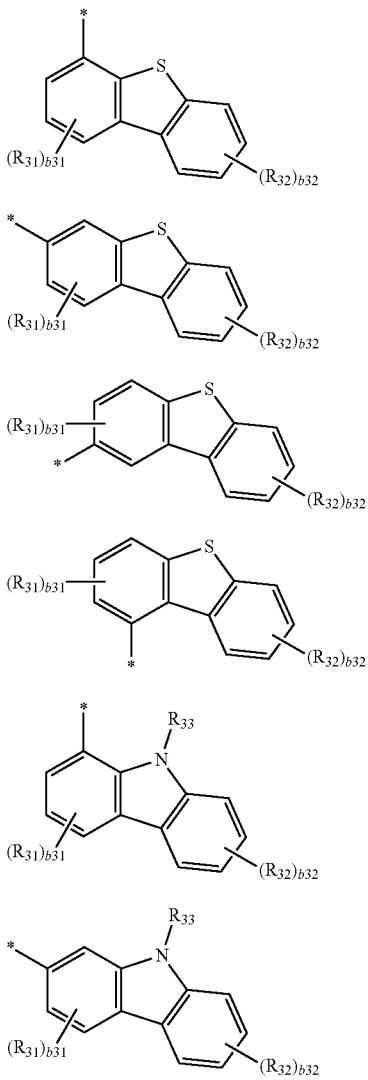

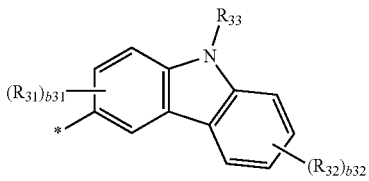

Formula 3A-11

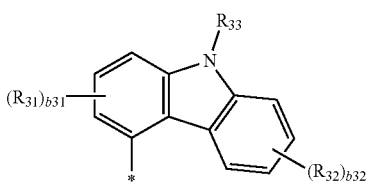

Formula 3A-12

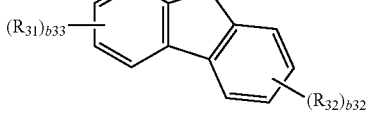

Formula 3B-1 wherein, in Formulae 3A-1 to 3A-12 and 3B-1, $R_{31}$ to $R_{33}$ and b31 to b33 may each independently be the same as respectively described above, and

* indicates a binding site to a neighboring atom.

In one or more embodiments, the host may include an alkaline earth-metal complex. In one or more embodiments, the host may include a Be complex (for example, Compound H55), a Mg complex, a Zn complex, or a combination thereof.

In one or more embodiments, the host may include one of Compounds BH1 to BH13, one of Compounds H1 to H124, 9,10-Di(2-naphthyl)anthracene (ADN), 2-methyl-9,10-bis (naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

BH1

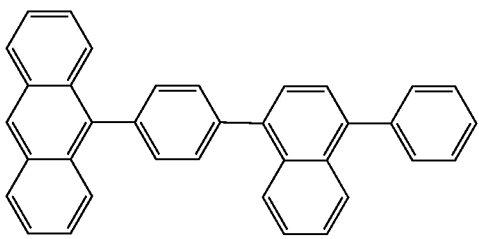

BH2

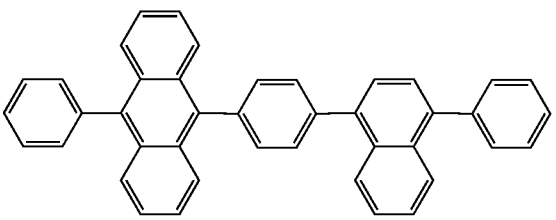

BH3

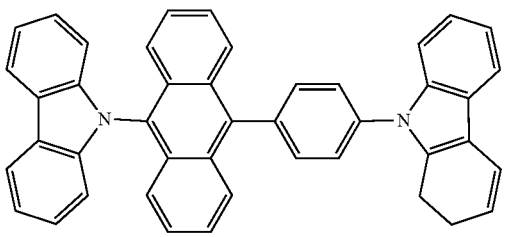

BH4

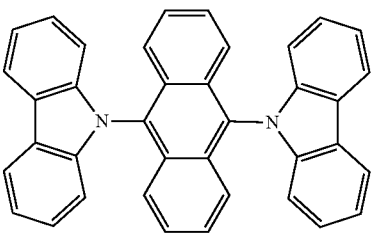

-continued
BH5
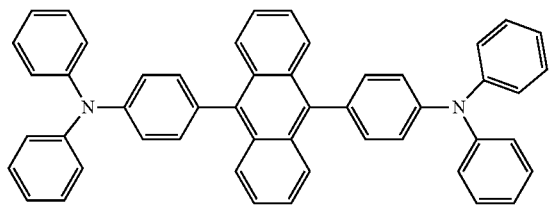
BH6
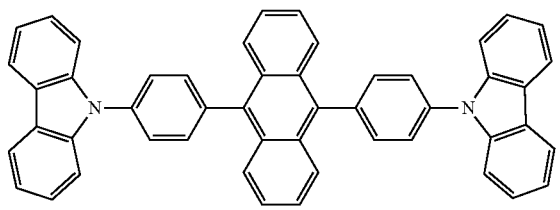
BH7
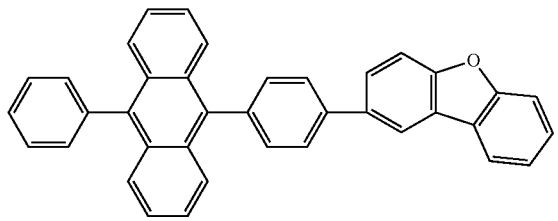
BH8
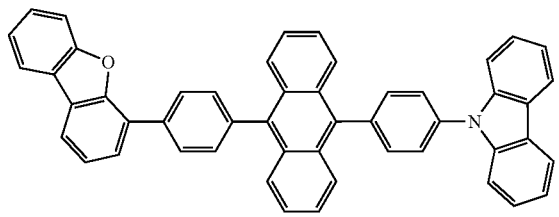
BH9
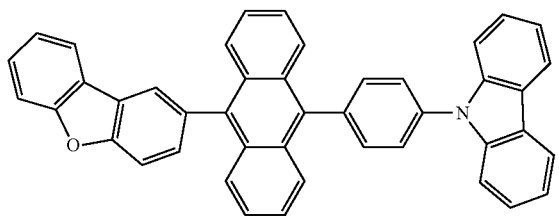
BH10
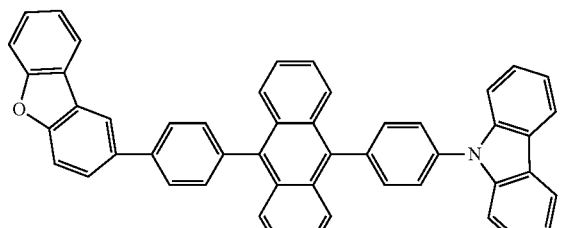
BH11
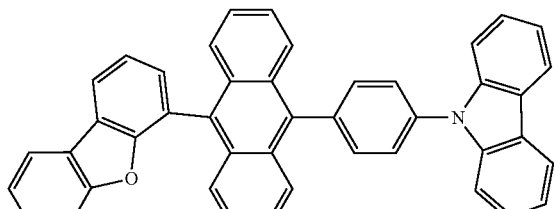
BH12
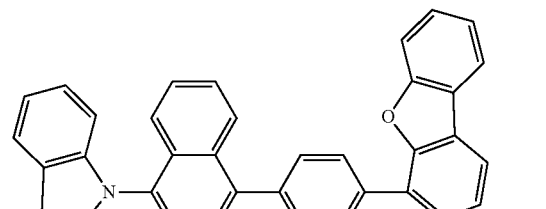
BH13
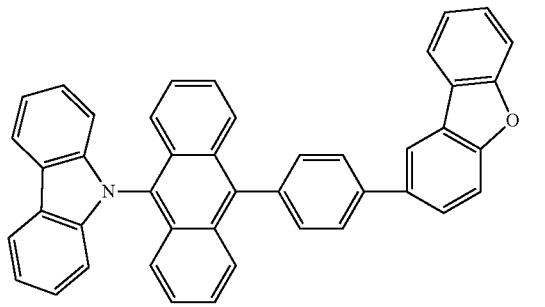
H1
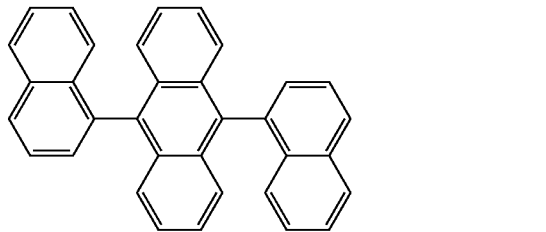

-continued
H2
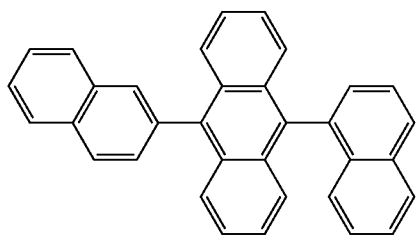
H3
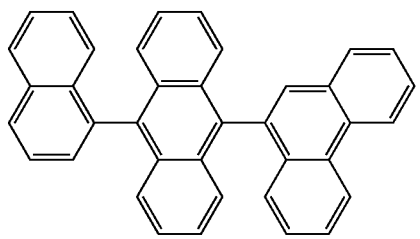
H4 H5
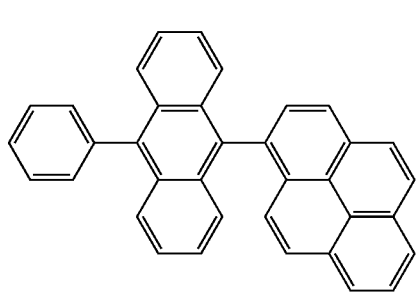
H6 H7
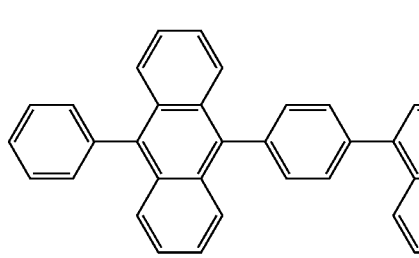
H8
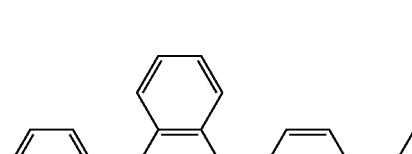
H9
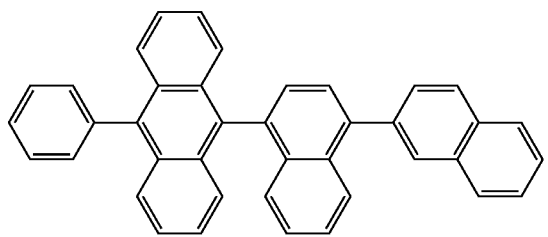
H10 H11
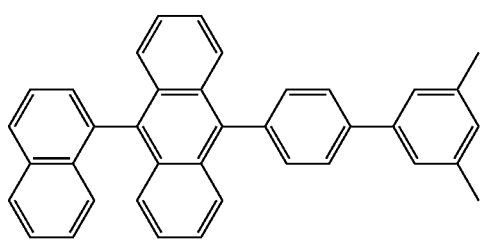
H12
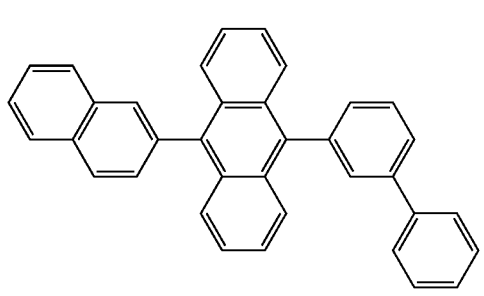
H13
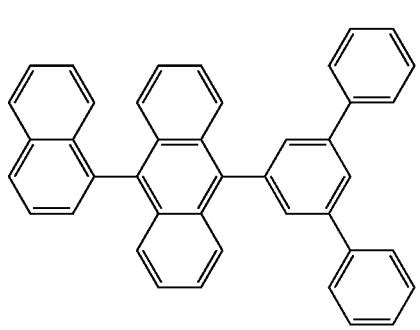

-continued
H14
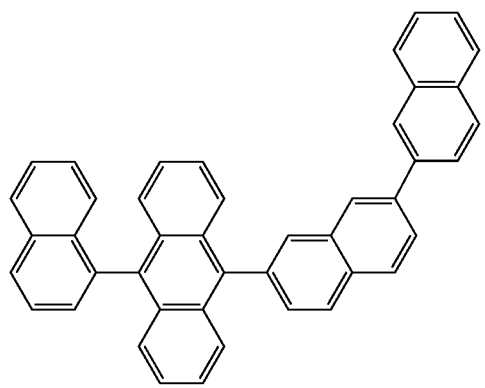
H15
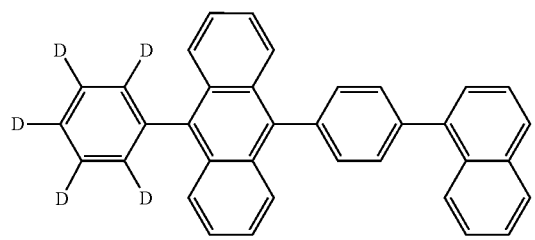
H16
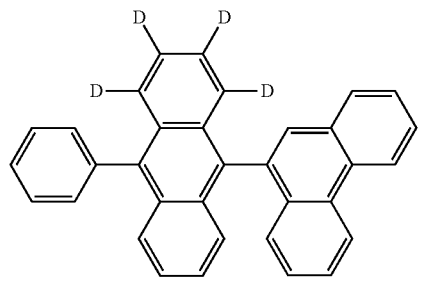
H17
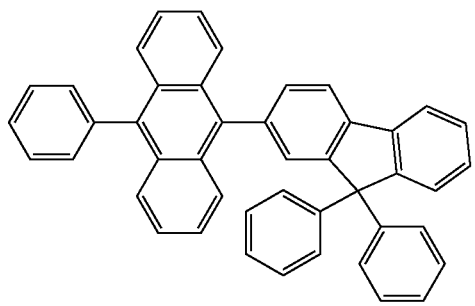
H18
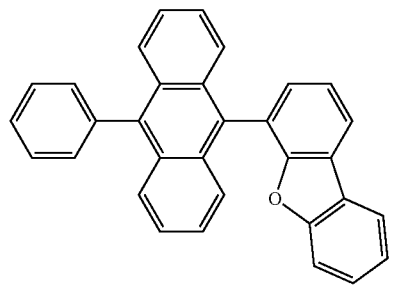
H19
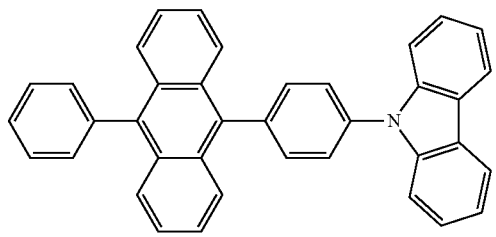
H20
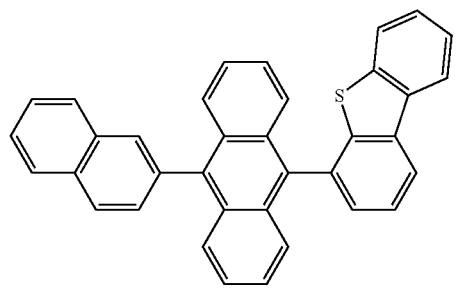
H21
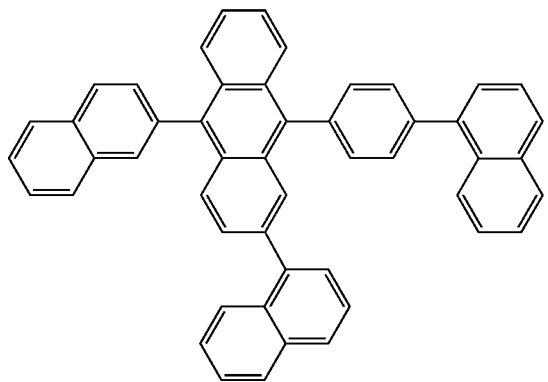

H22
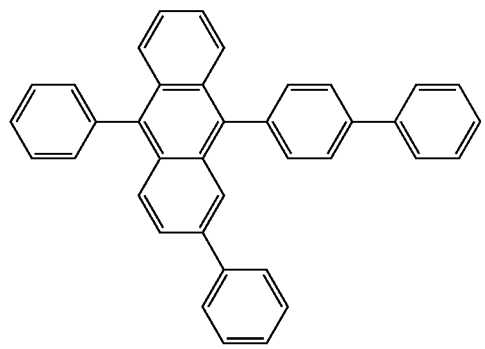
H23
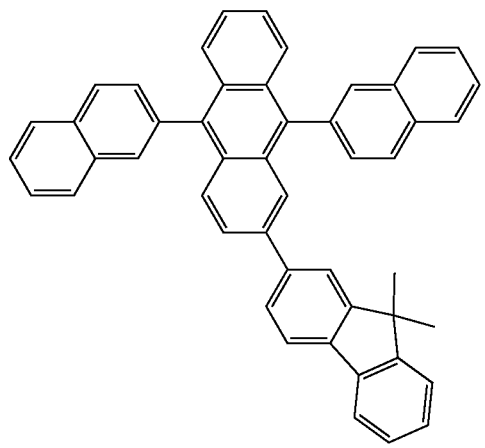
H24
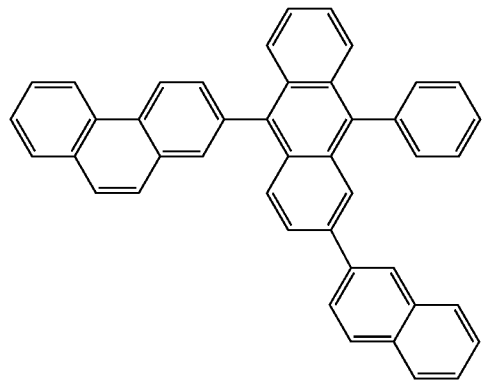
H25
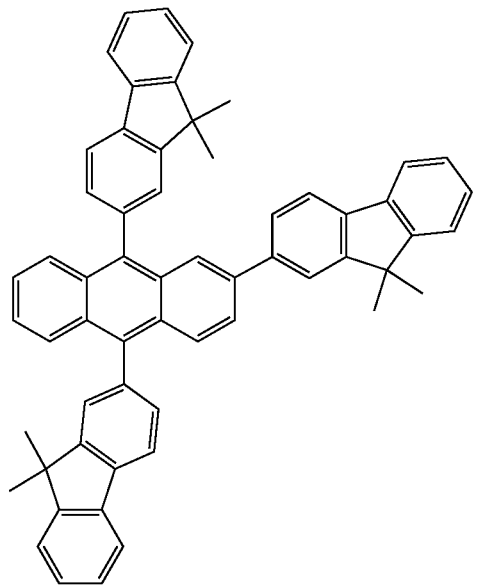

-continued
H26
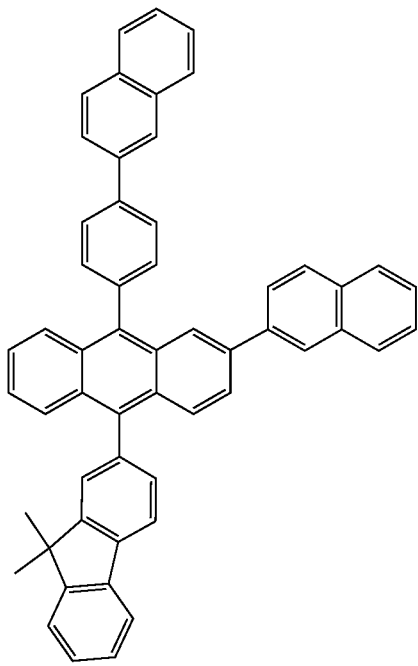
H27
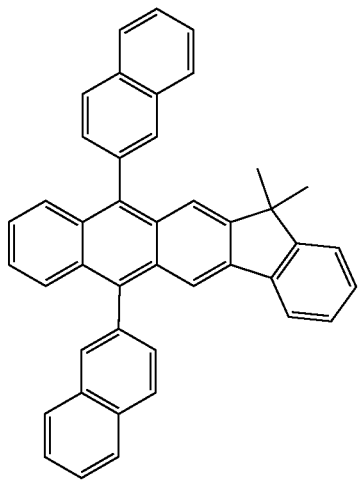
H28
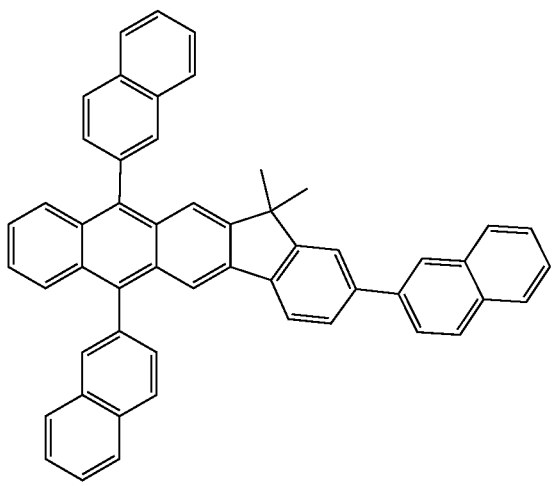
H29
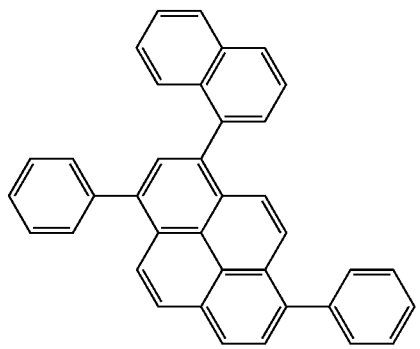
H30
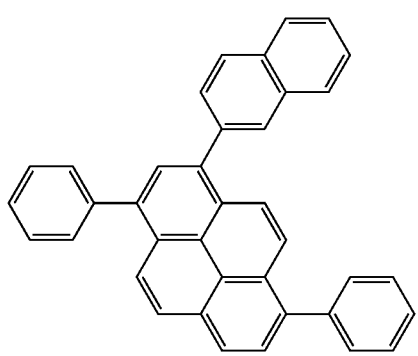
H31
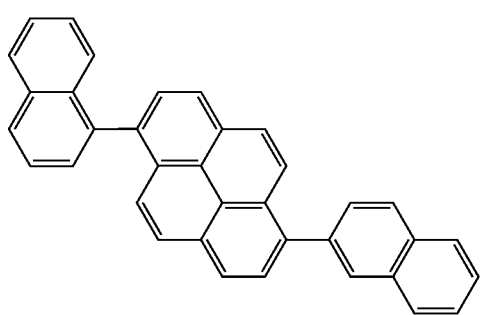

-continued
H32
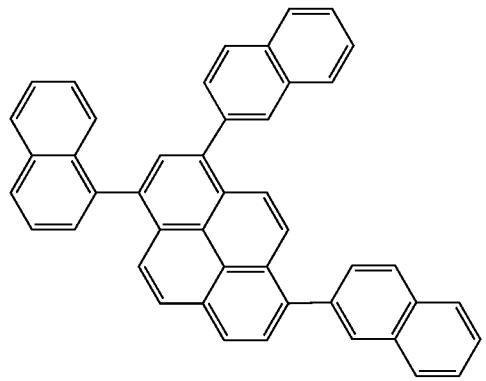
H33
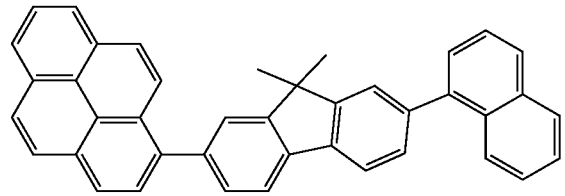
H34
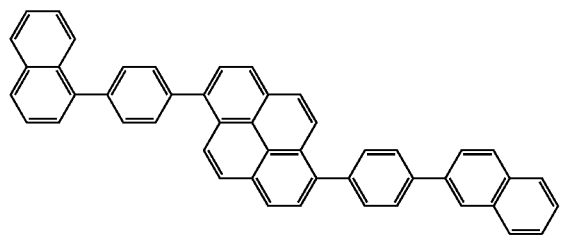
H35
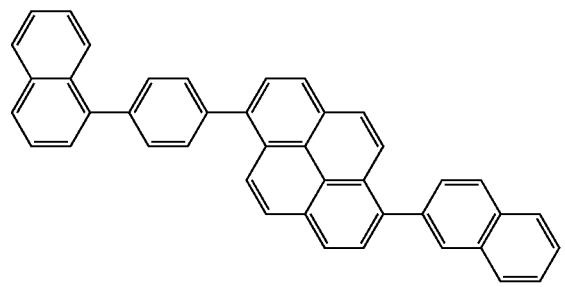
H36
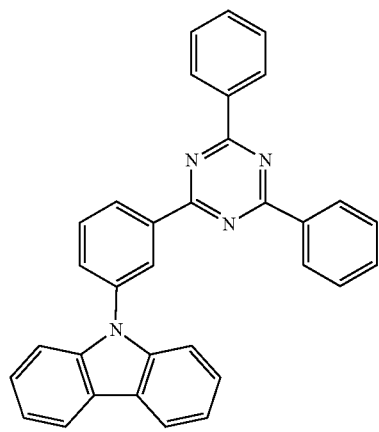
H37
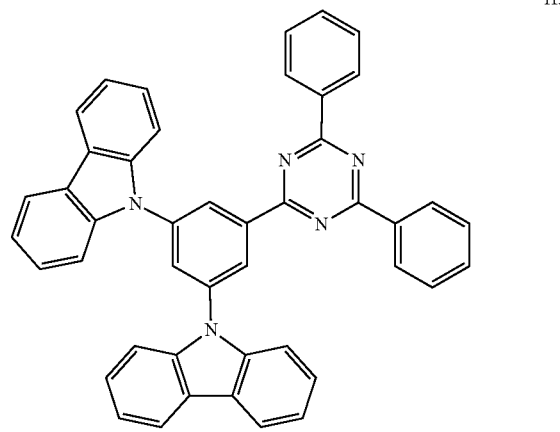
H38
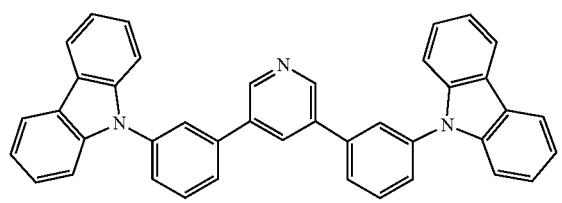
H39
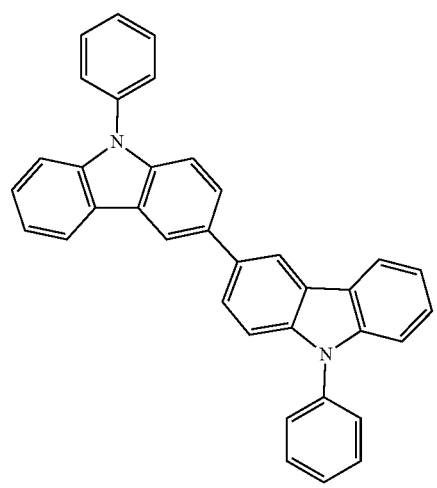

-continued
H40
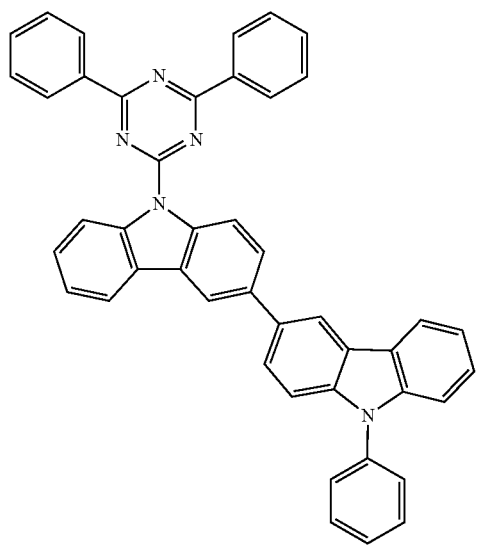
H41
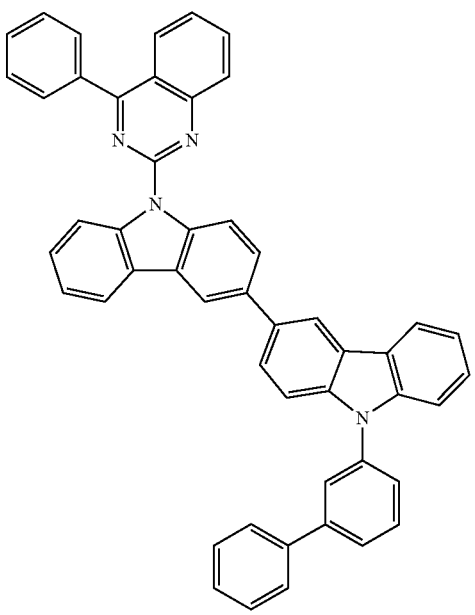
H42
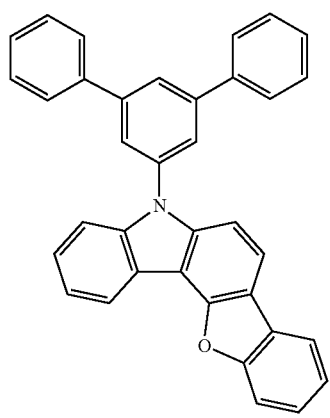
H43
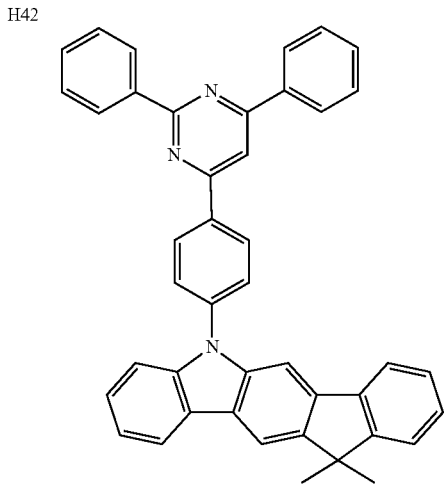
H44
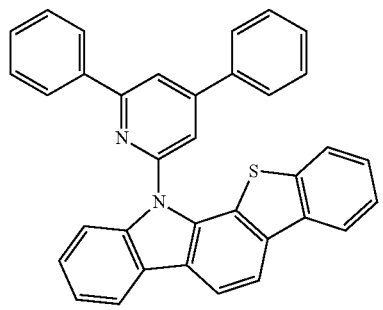
H45
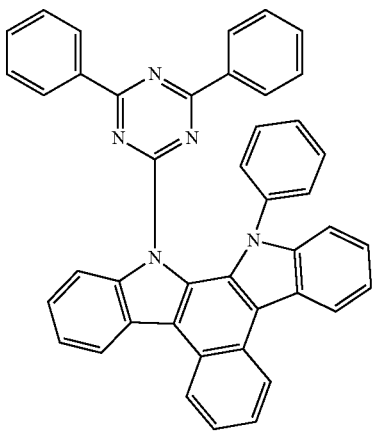

-continued
H46
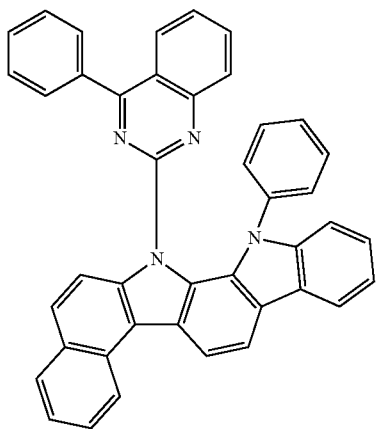
H47
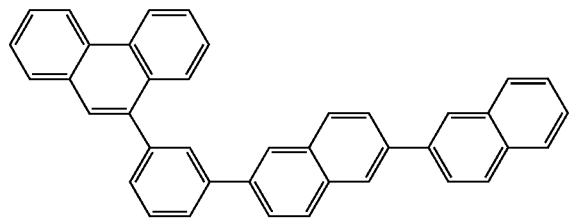
H48
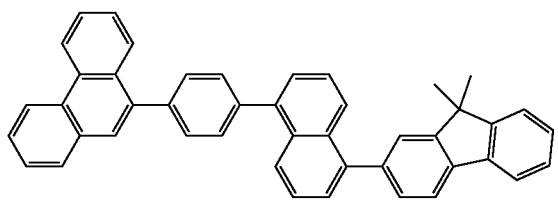
H49
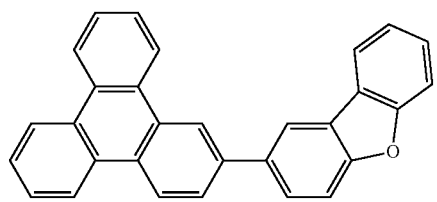
H50
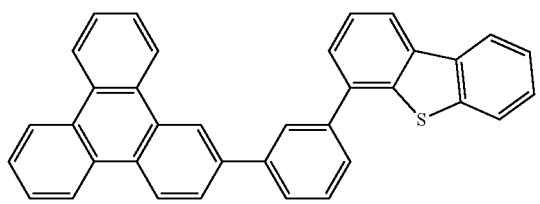
H51
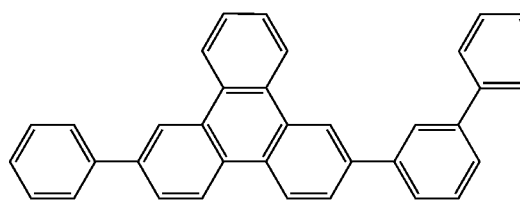
H52
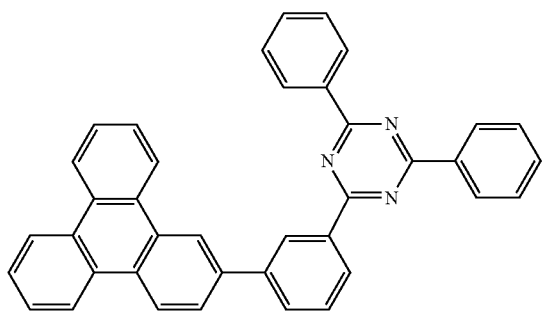
H53
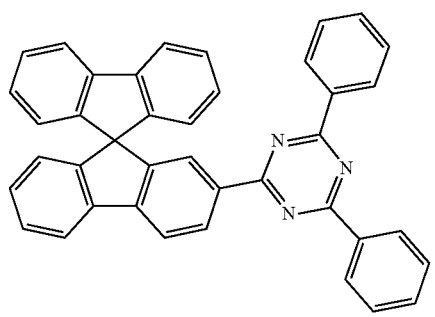
H54
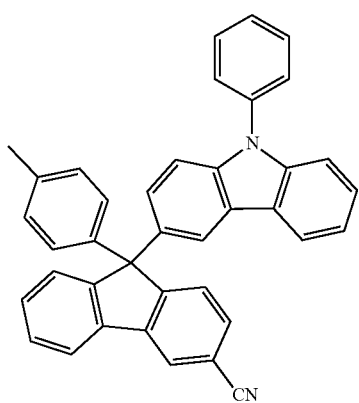
H55
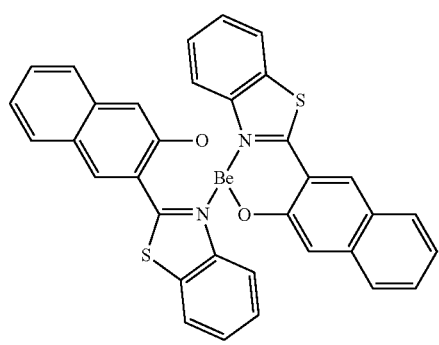

-continued
H56 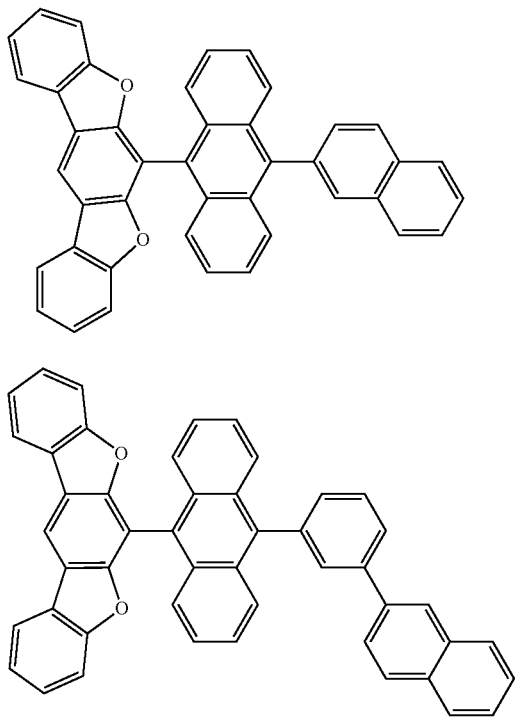 H57 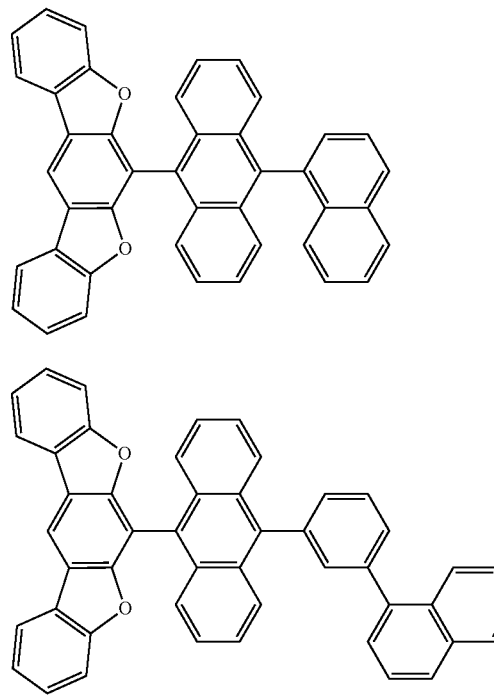
H58 H59
H60 H61
H62 H63
H64 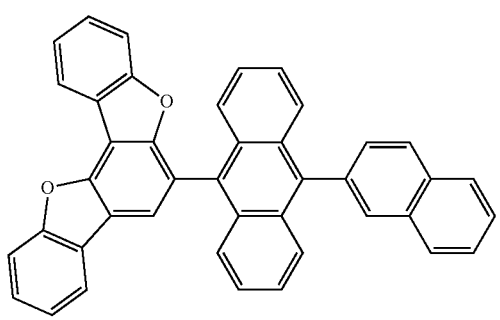 H65 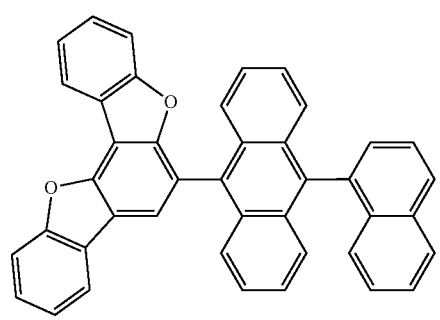

-continued
H66
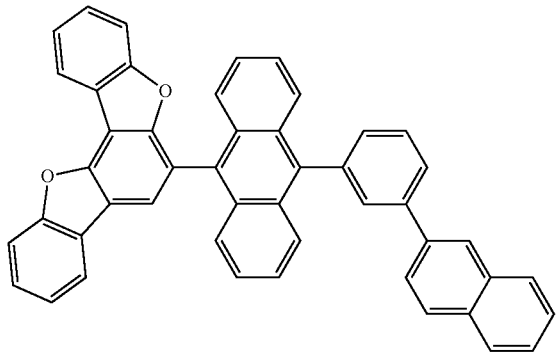
H67
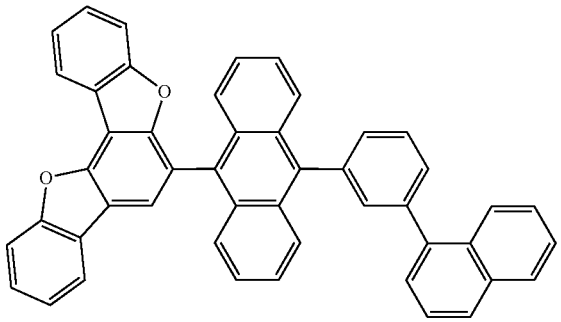
H68
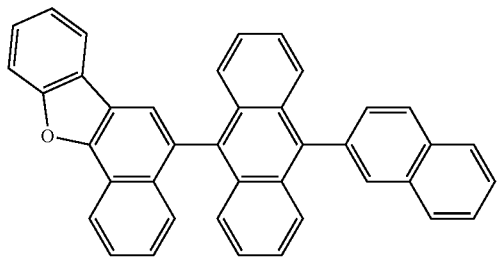
H69
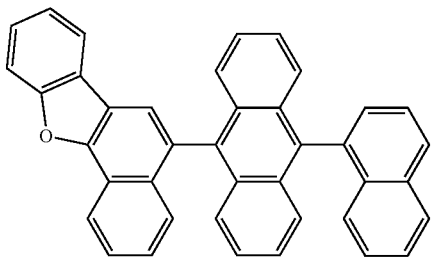
H70
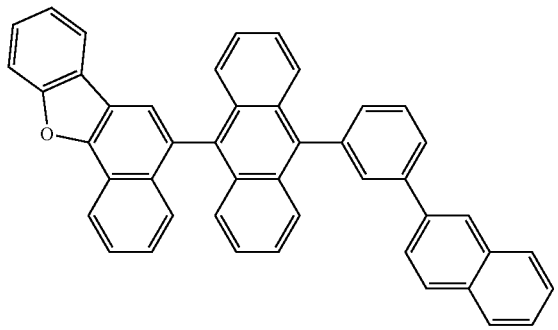
H71
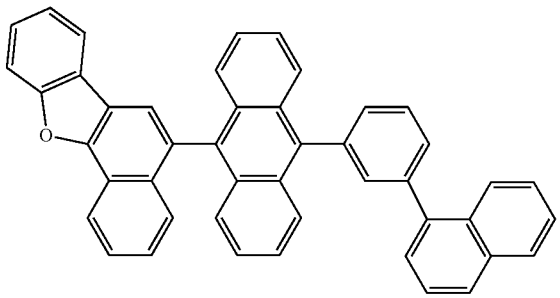
H72
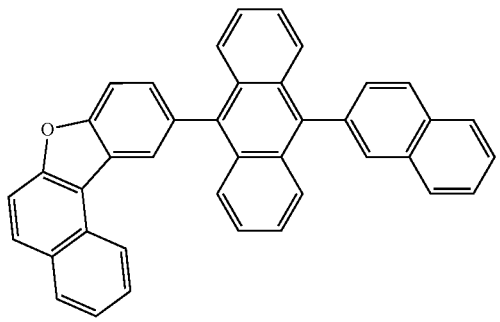
H73
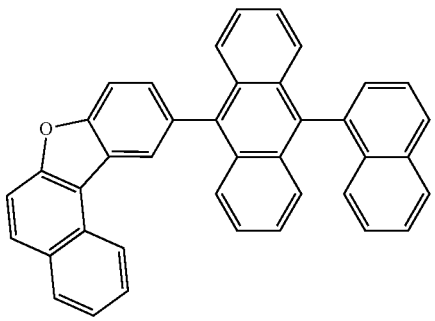

-continued
H74
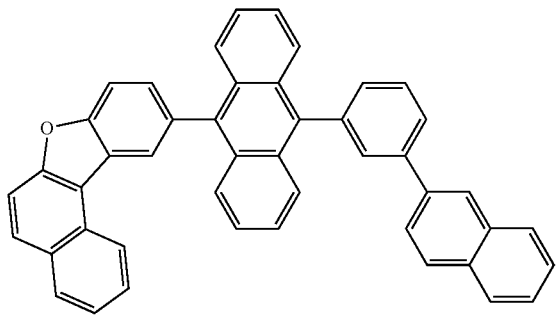
H75
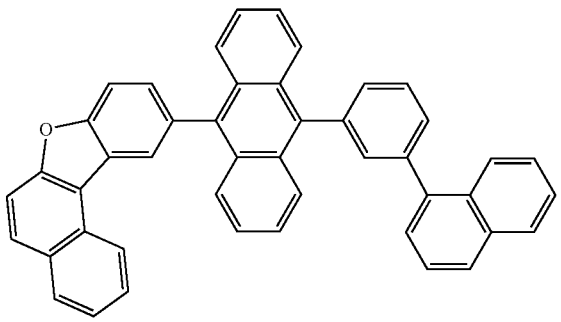
H76
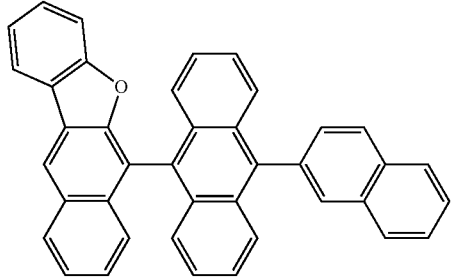
H77
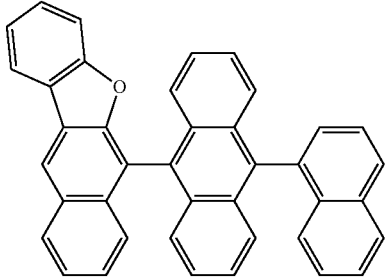
H78
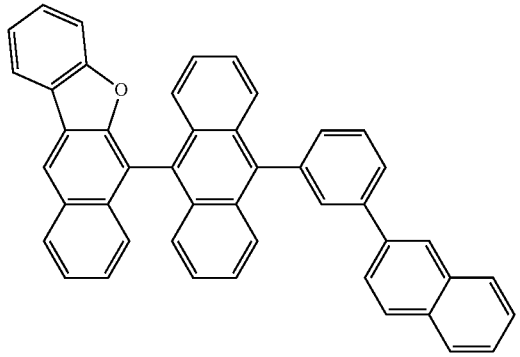
H79
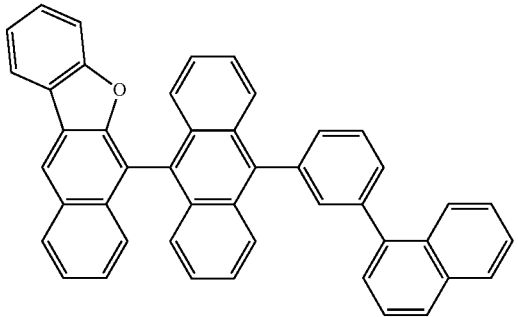
H80
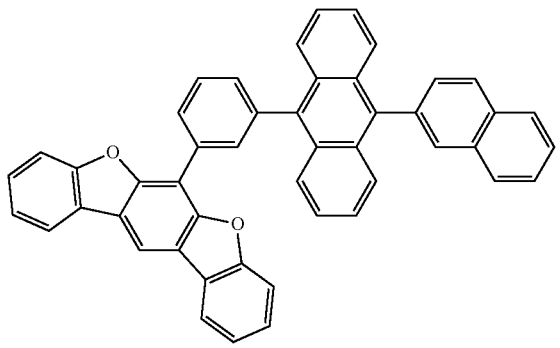
H81
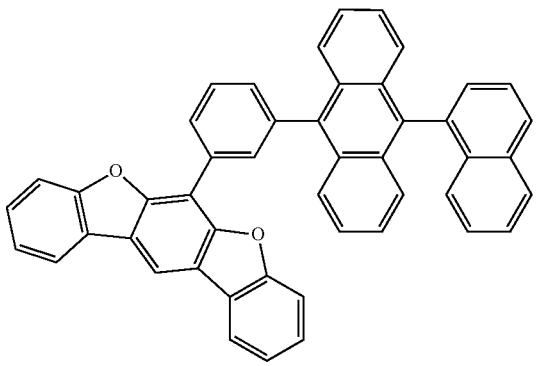

-continued
H82
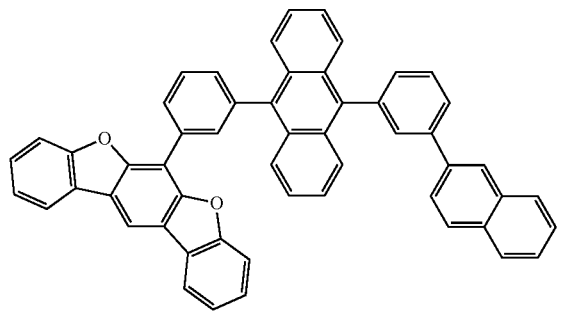
H83
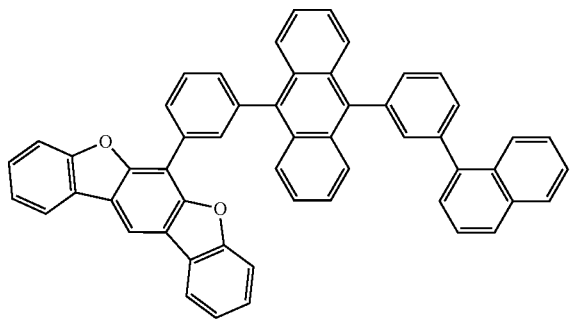
H84
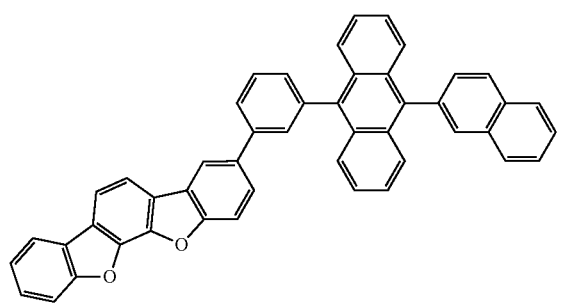
H85
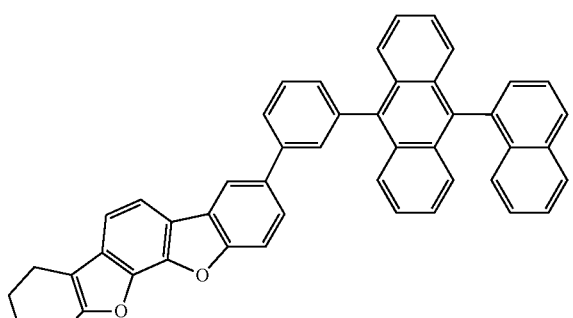
H86
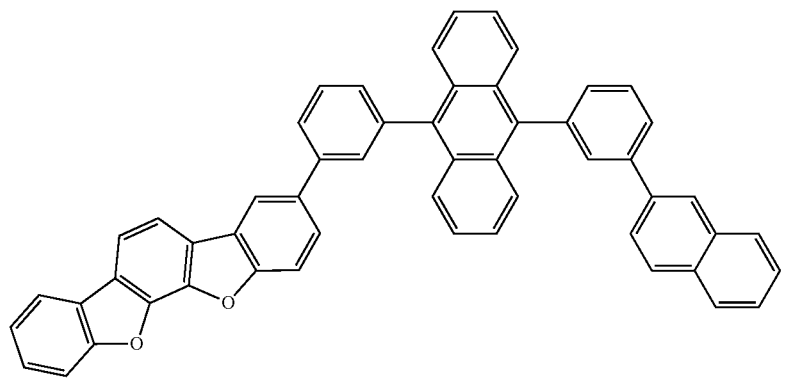
H87
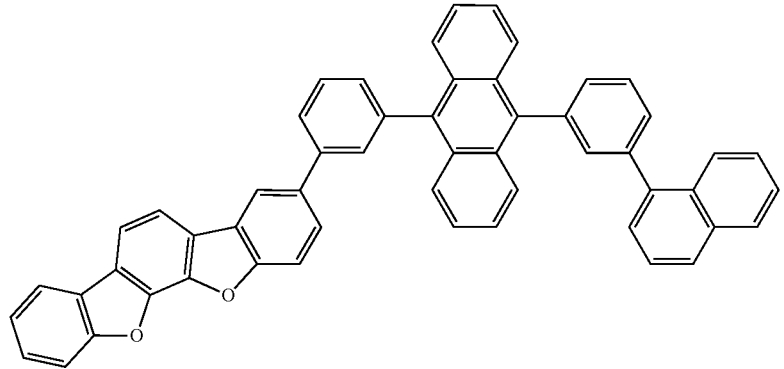

-continued
H88
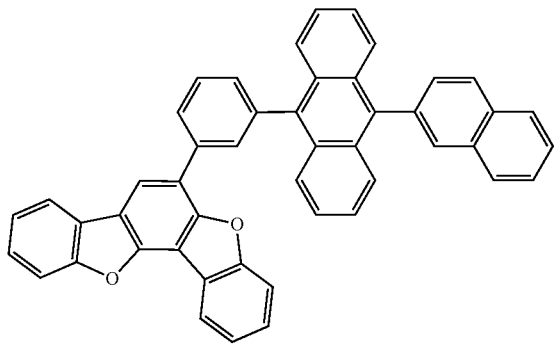
H89
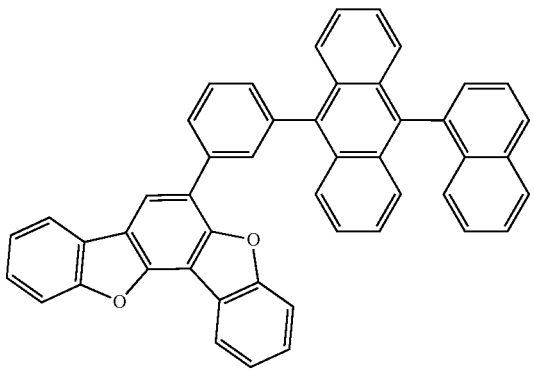
H90
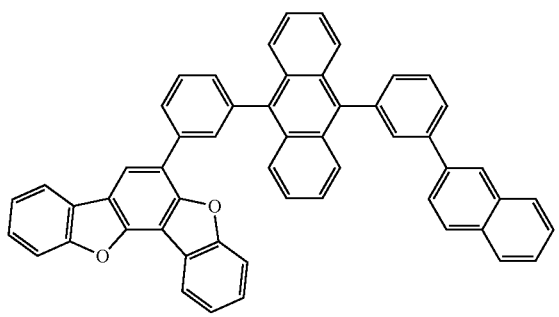
H91
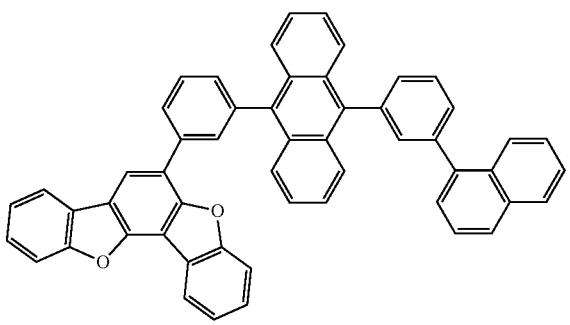
H92
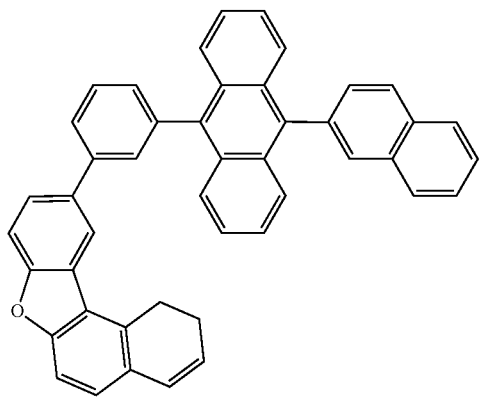
H93
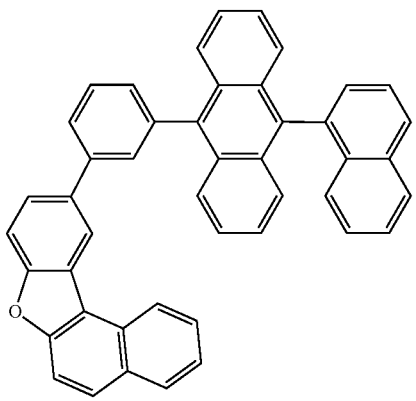
H94
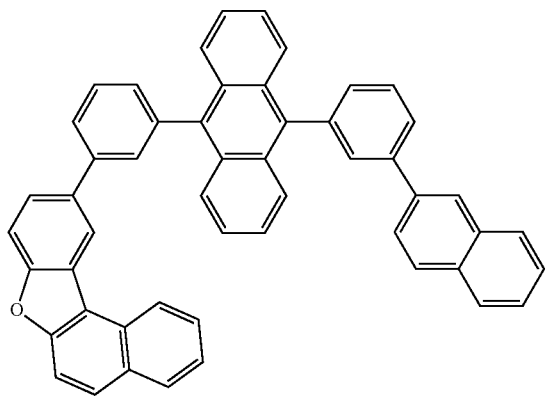
H95
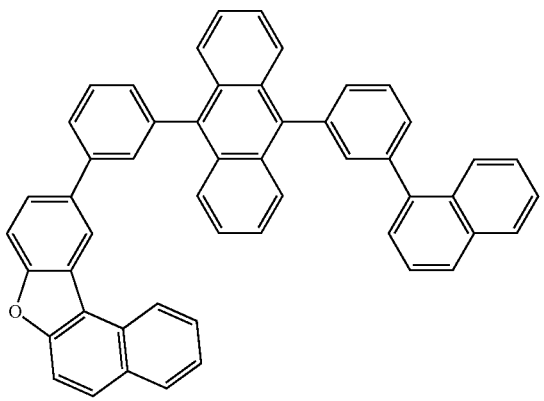

-continued
H96
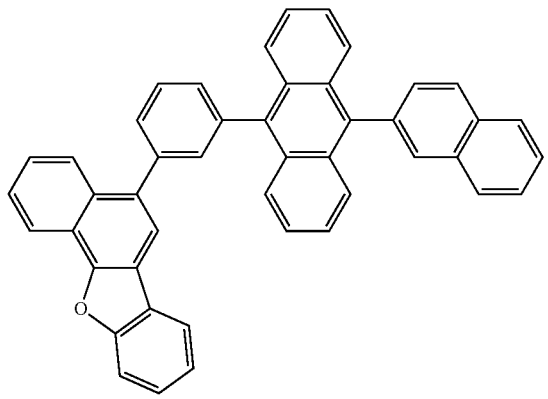
H97
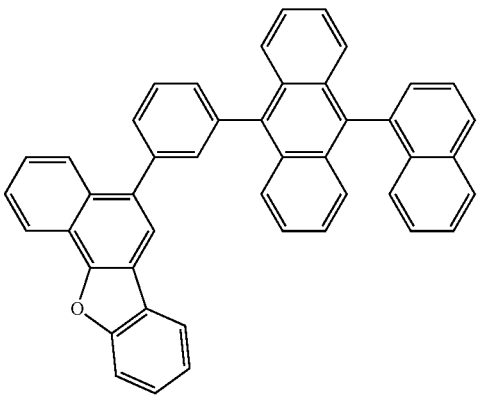
H98
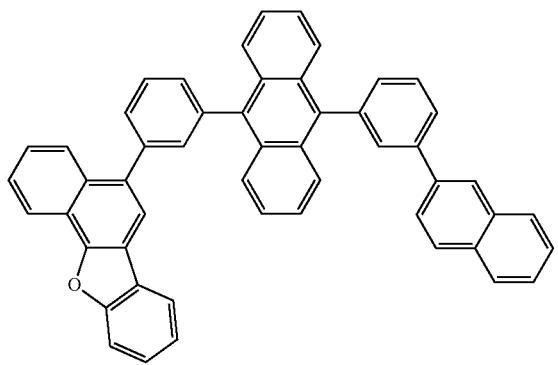
H99
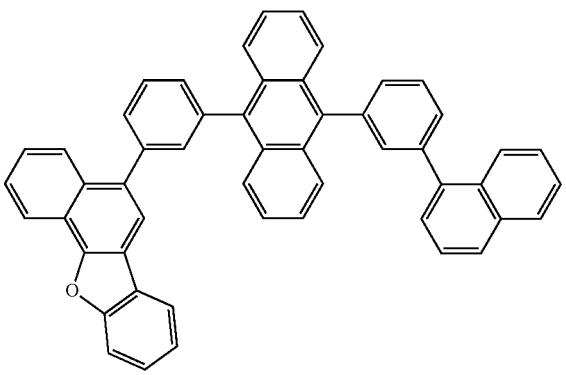
H100
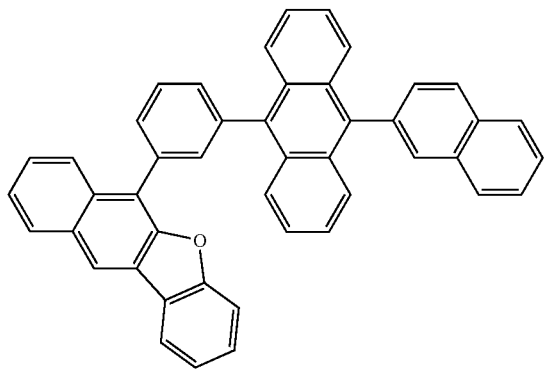
H101
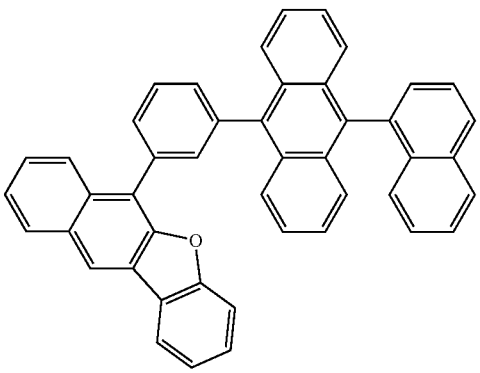
H102
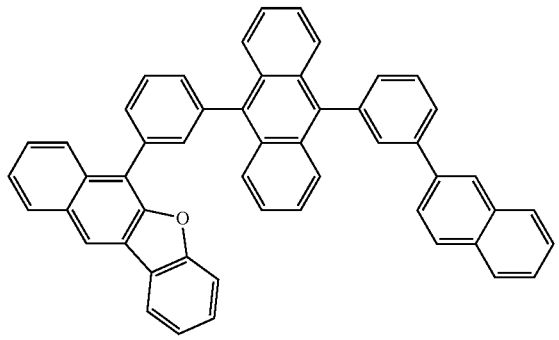
H103
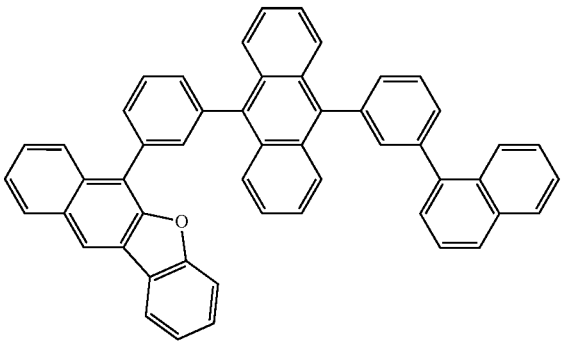

-continued
H104
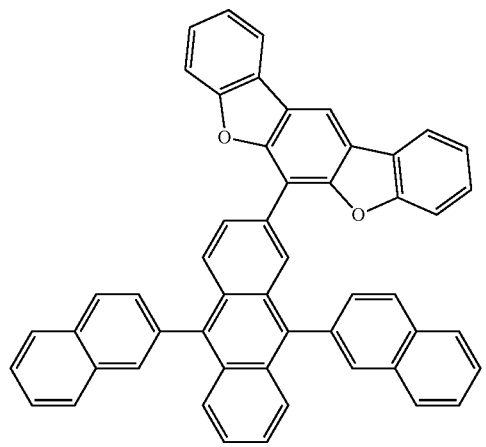
H105
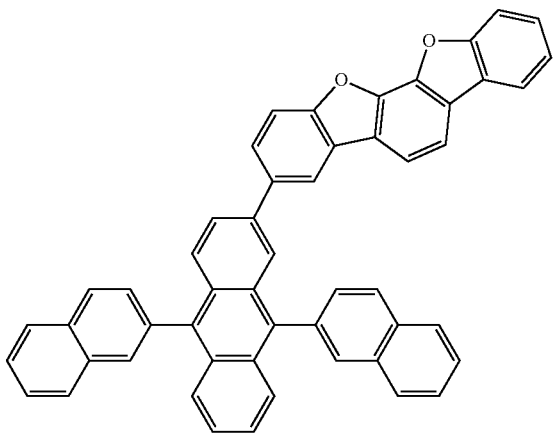
H106
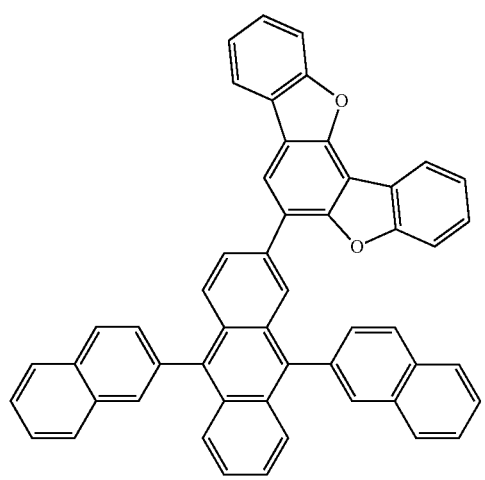
H107
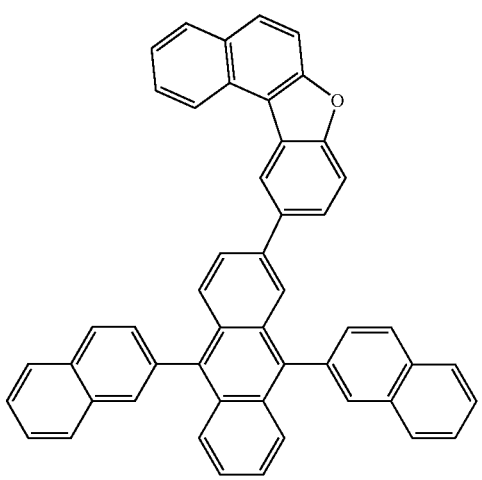
H108
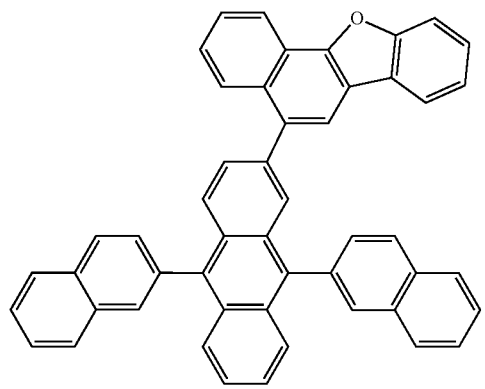
H109
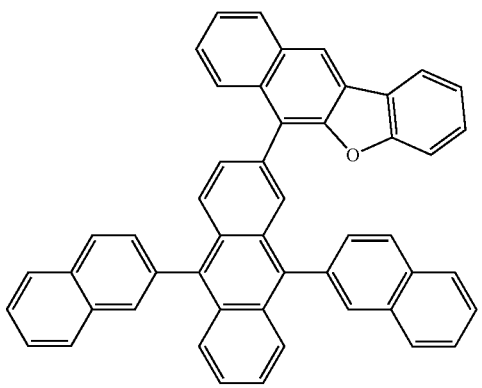

-continued
H110
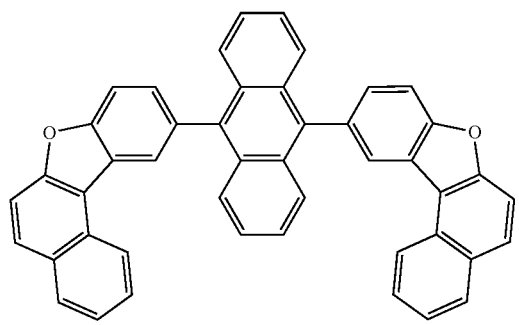
H111
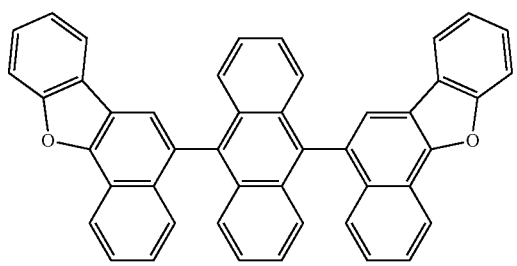
H112
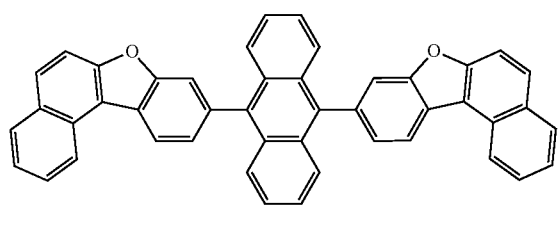
H113
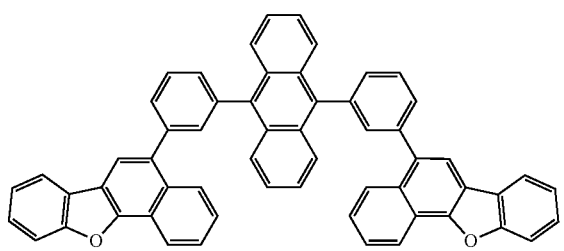
H114
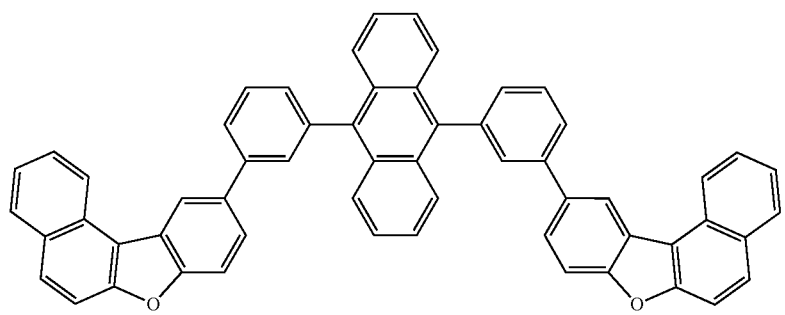
H115
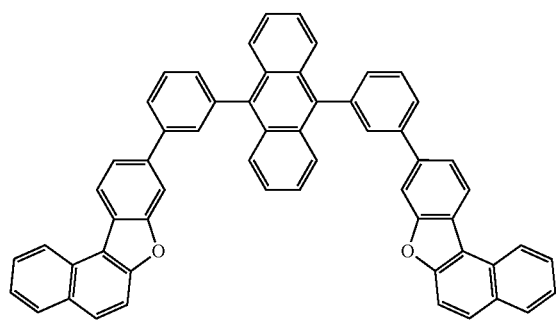
H116
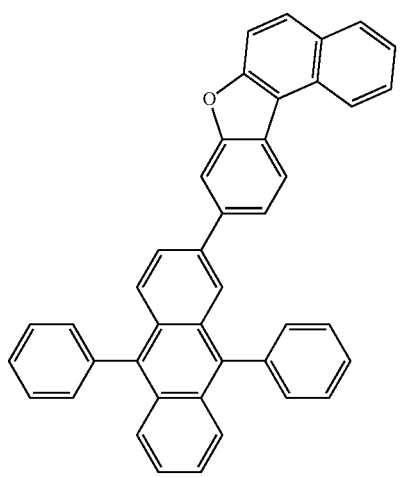

-continued
H117
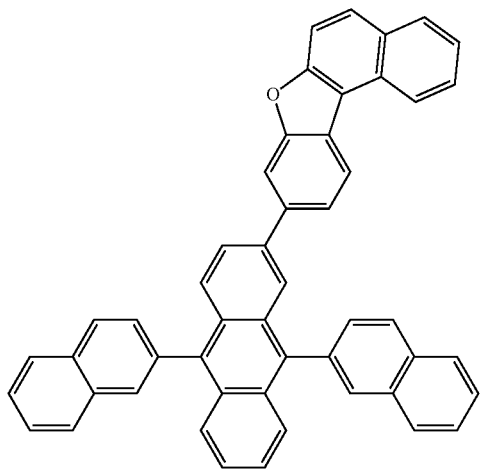
H118
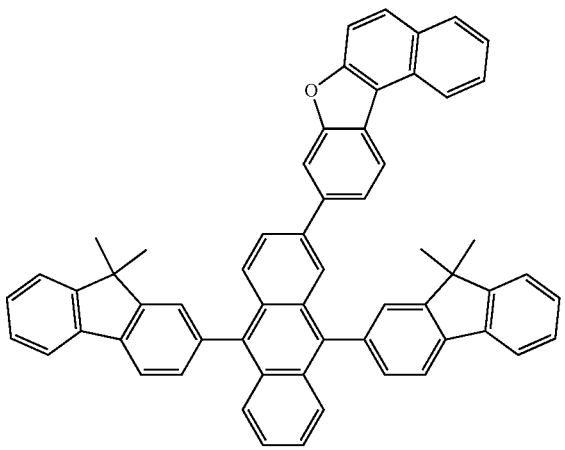
H119
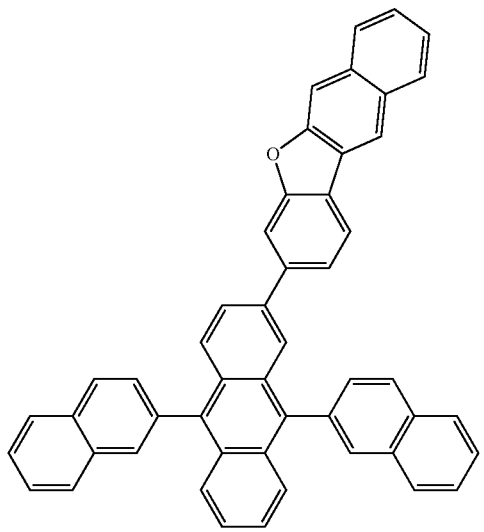
H120
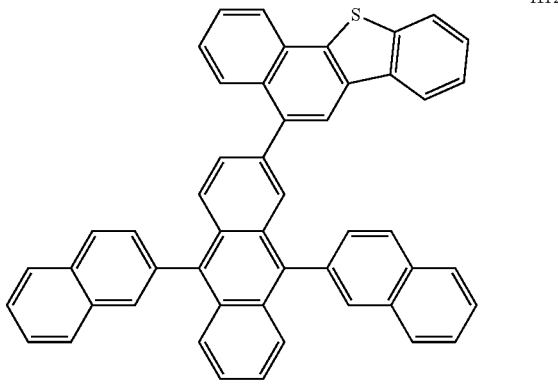
H121
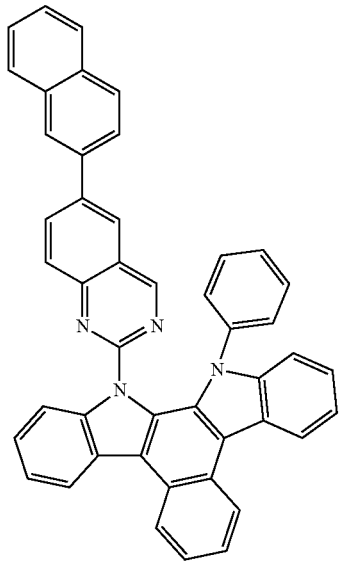
H122
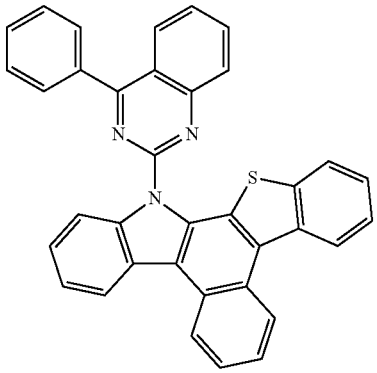

H123        H124

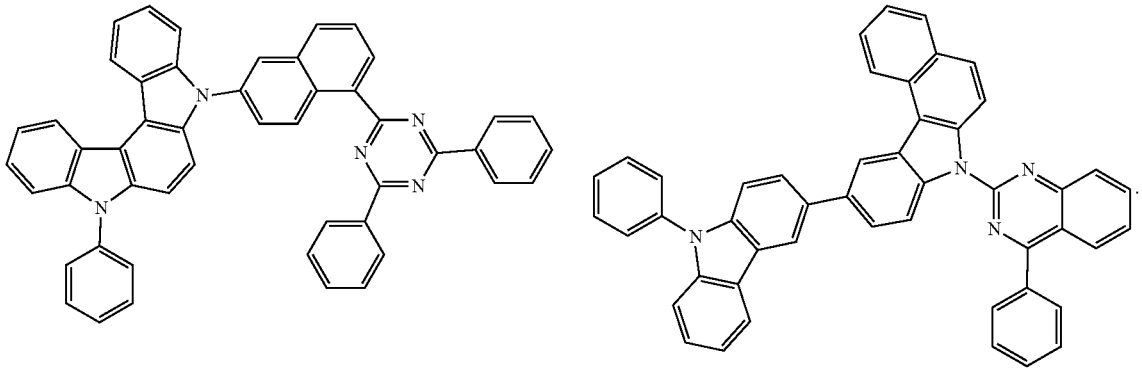

Phosphorescent Dopant

The phosphorescent dopant may include at least one transition metal as a central metal (e.g., a central metal atom).

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

$$M(L_{401})_{xc1}(L_{402})_{xc2}$$  Formula 401

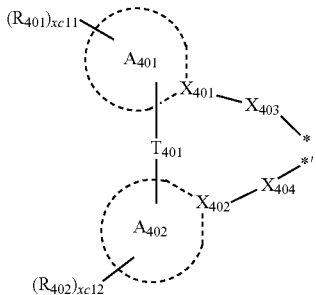 Formula 402 wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$ (to be described in more detail below), $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$(s) in two or more of $L_{401}$(s) may be optionally linked to each other via $T_{402}$, which is a linking group, and/or two ring $A_{402}$(s) in two or more of $L_{401}$(s) may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of compounds PD1 to PD25, or any combination thereof:

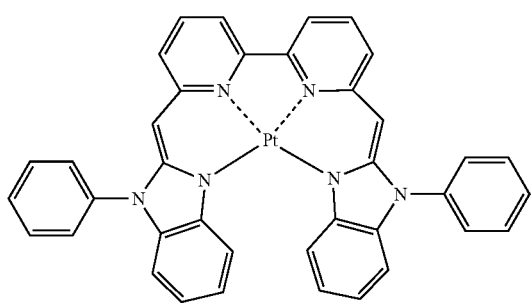
PD1
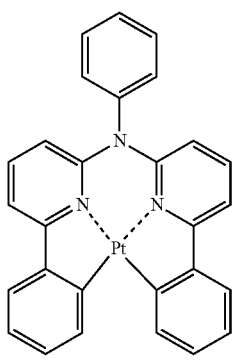
PD2
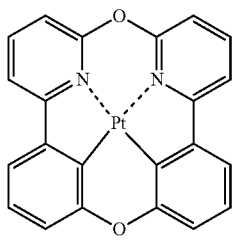
PD3
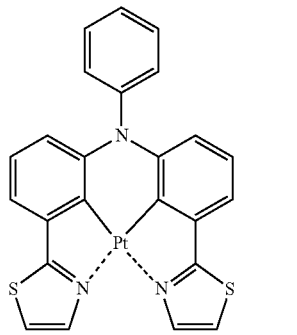
PD4
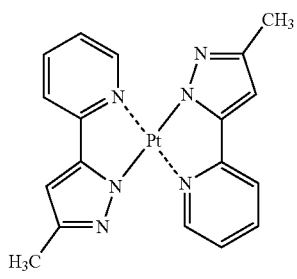
PD5
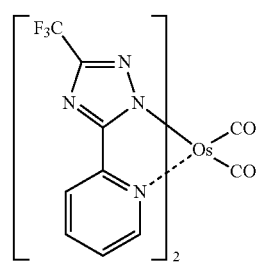
PD6
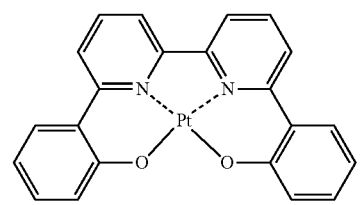
PD7
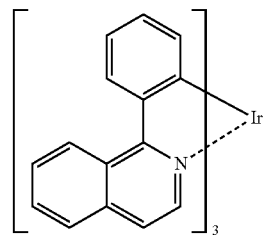
PD8
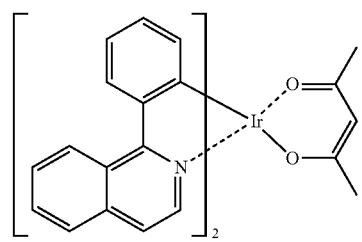
PD9
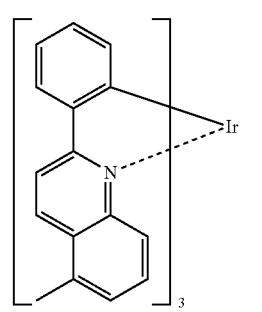
PD10
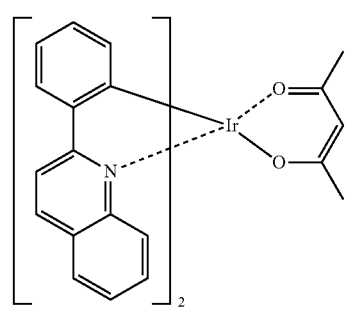
PD11

PD12 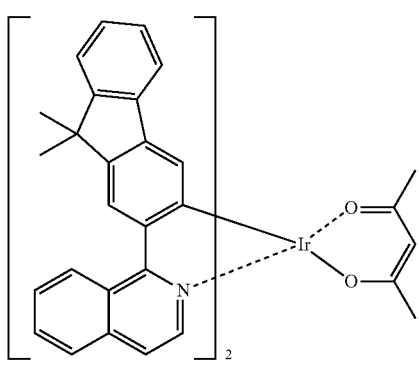
PD13 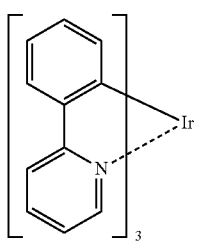
PD14 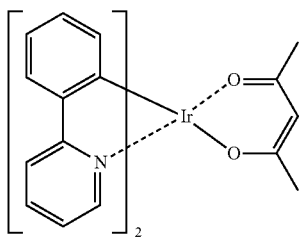
PD15 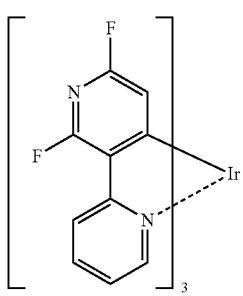
PD16 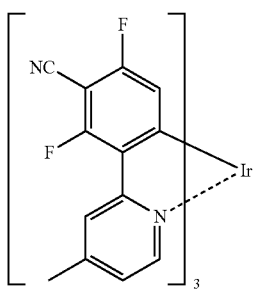
PD17 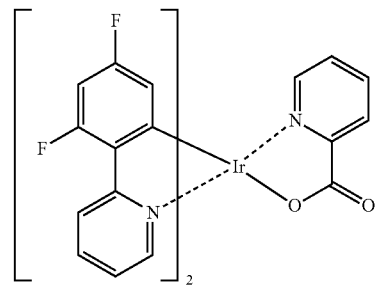
PD18 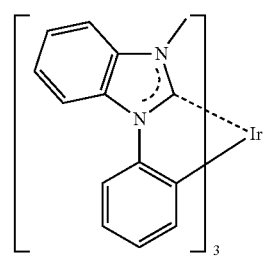
PD19 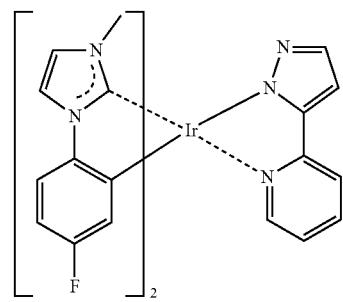
PD20 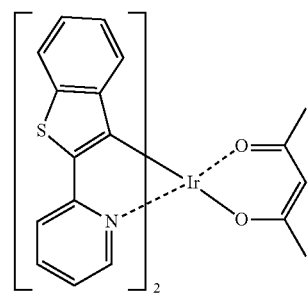
PD21 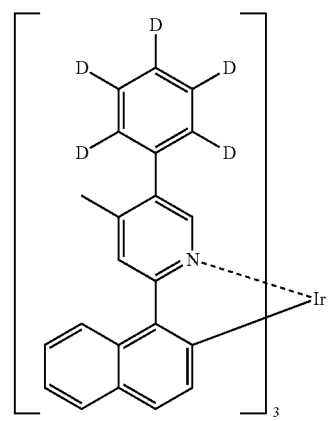

PD22 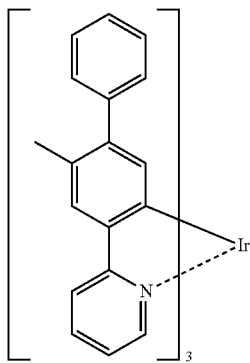

PD25 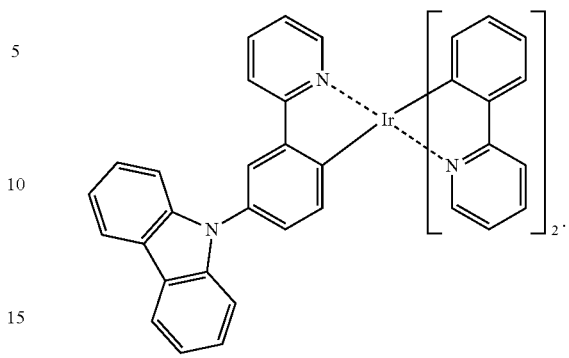

PD23 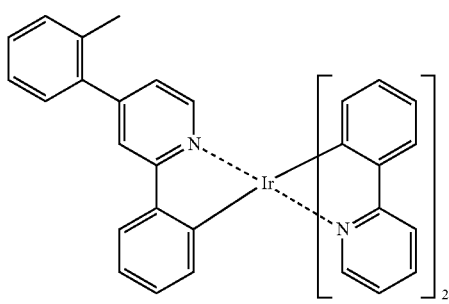

PD24 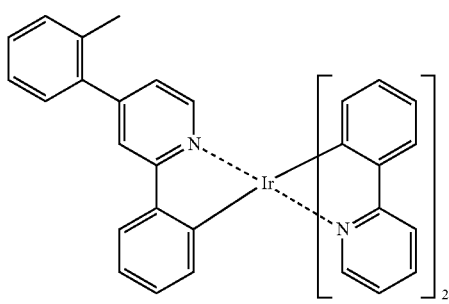

Fluorescent Dopant

The fluorescent dopant may include an amine group-containing compound, a styryl group-containing compound, or any combination thereof.

In one or more embodiments, the fluorescent dopant may include a compound represented by Formula 501:

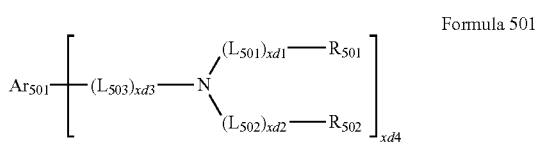

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, or a pyrene group) in which three or more monocyclic groups are condensed together.

In one or more embodiments, xd4 in Formula 501 may be 2.

In one or more embodiments, the fluorescent dopant may include: one of Compounds FD1 to FD36; DPVBi; DPAVBi; or any combination thereof:

91
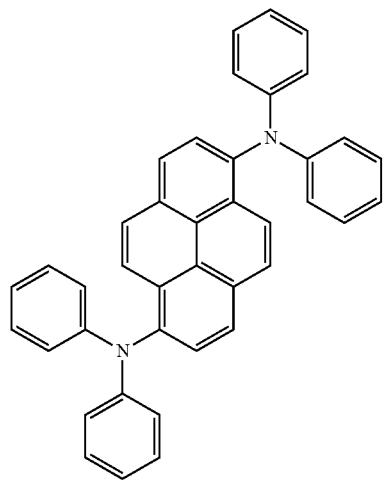
92
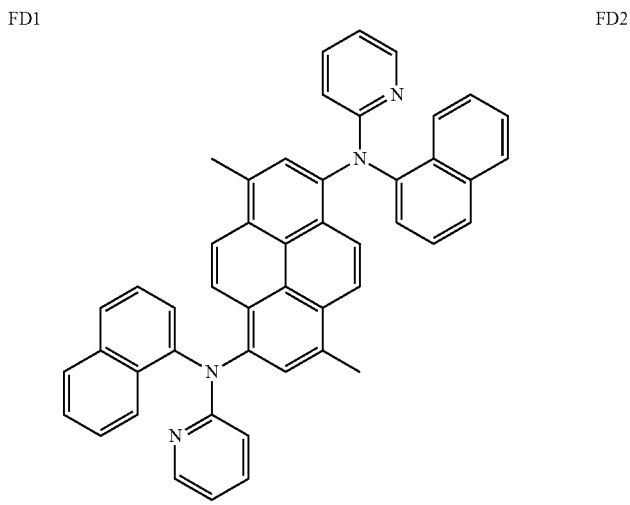
FD1
FD2
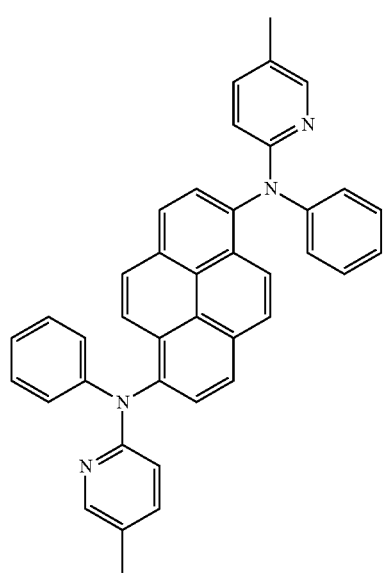
FD3
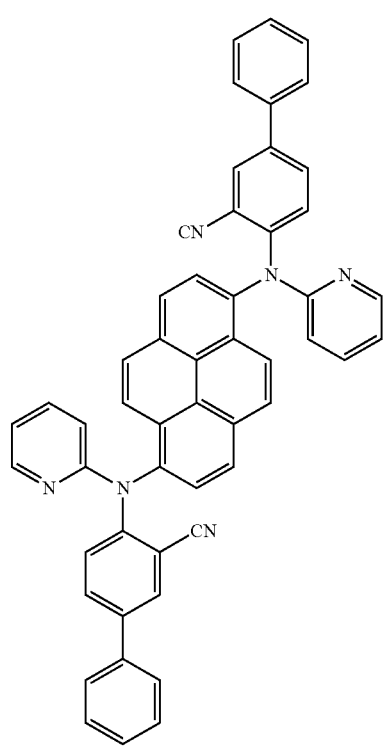
FD4

-continued
FD5
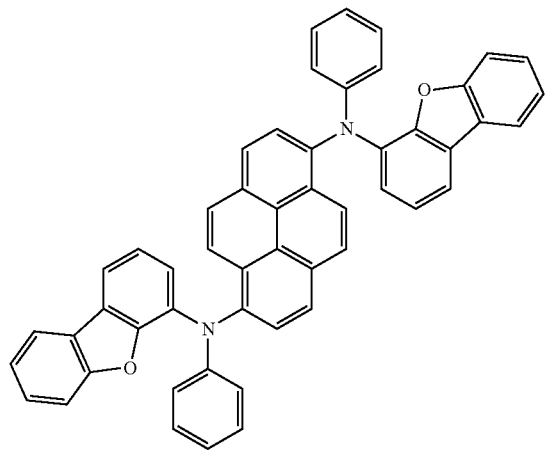
FD6
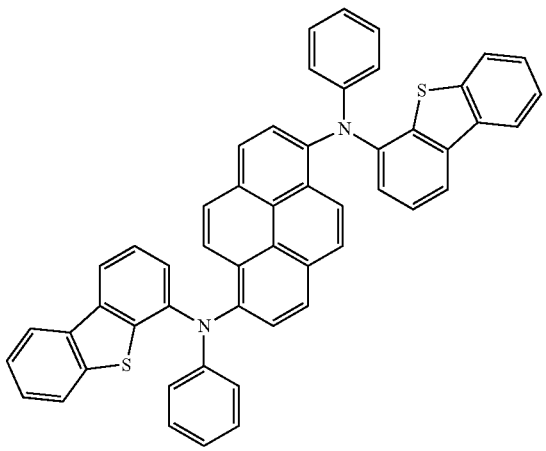
FD7
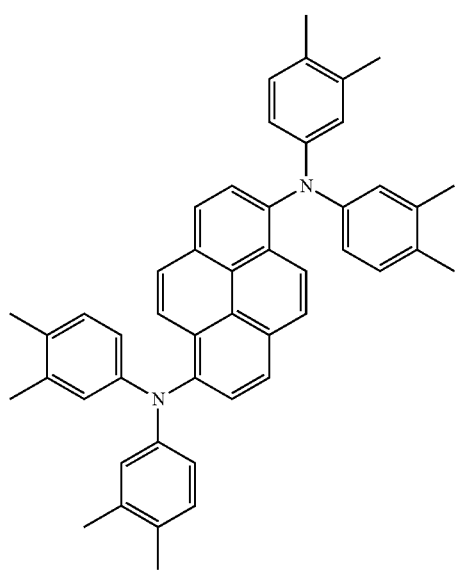
FD8
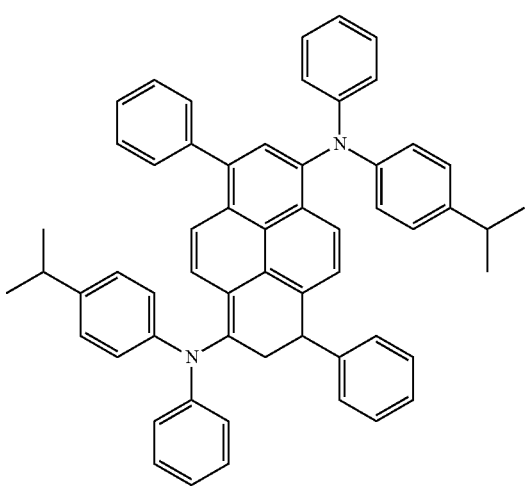
FD9
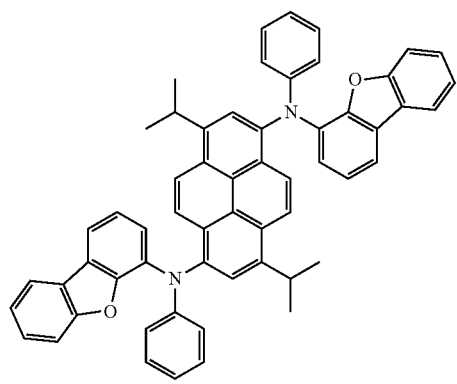
FD10
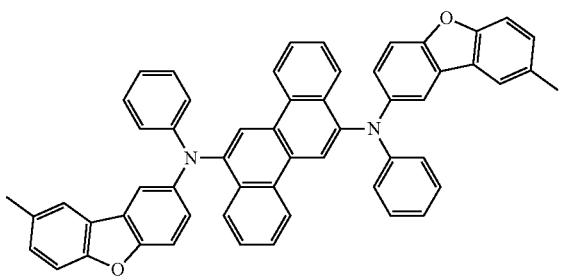

-continued
FD11
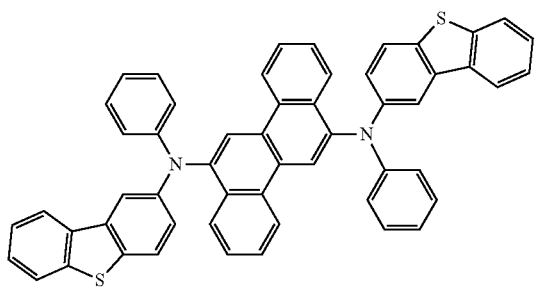
FD12
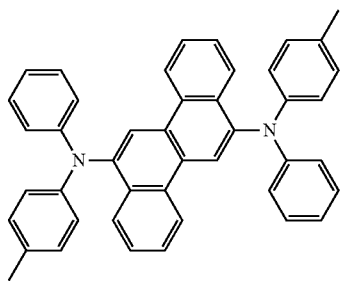
FD13
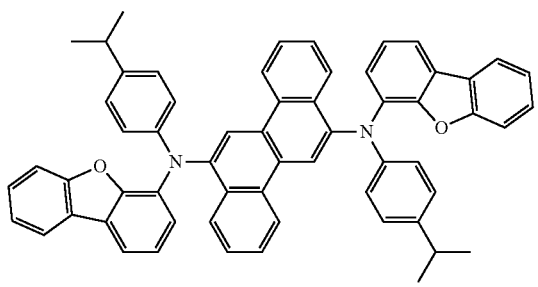
FD14
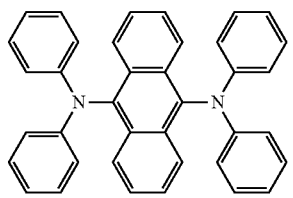
FD15
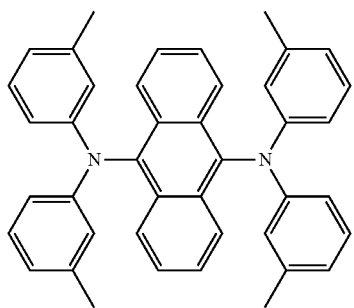
FD16
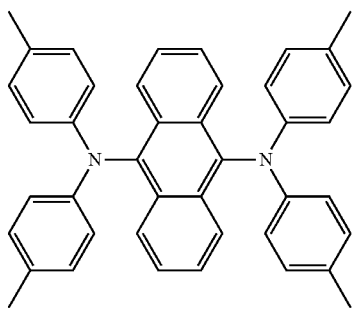
FD17
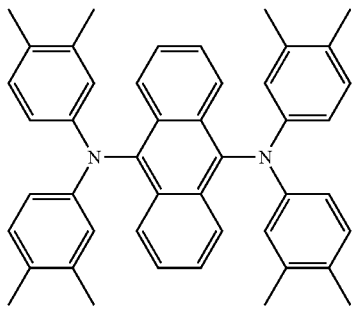
FD18
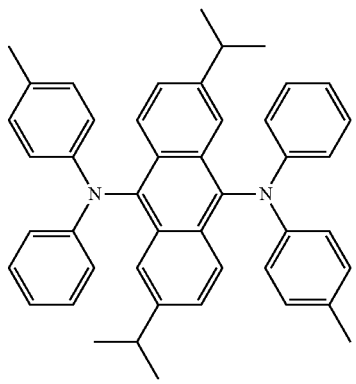

-continued
FD19
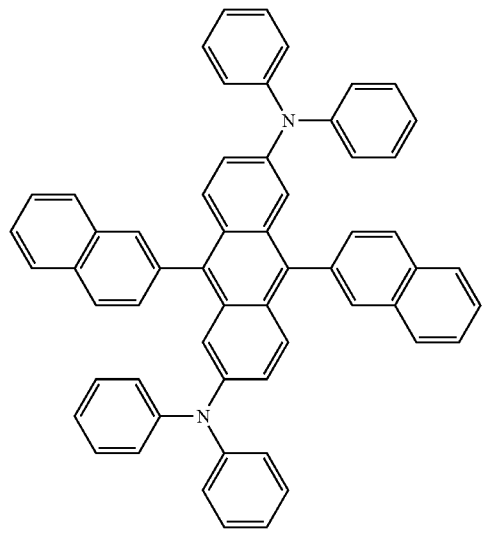
FD20
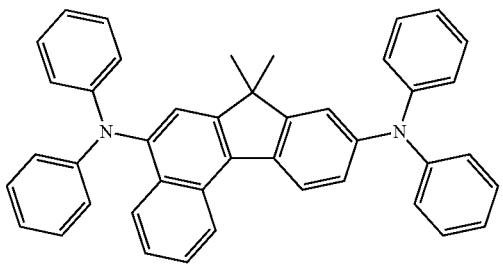
FD21
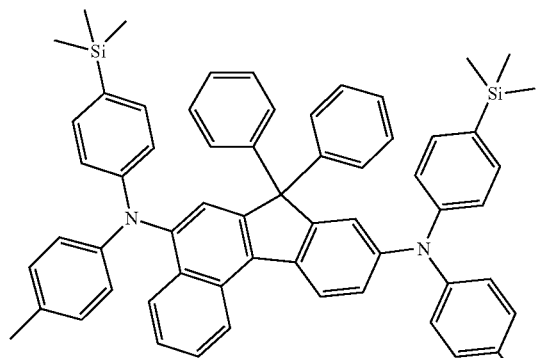
FD22
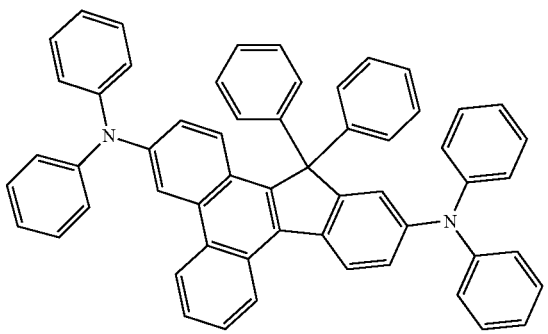
FD23
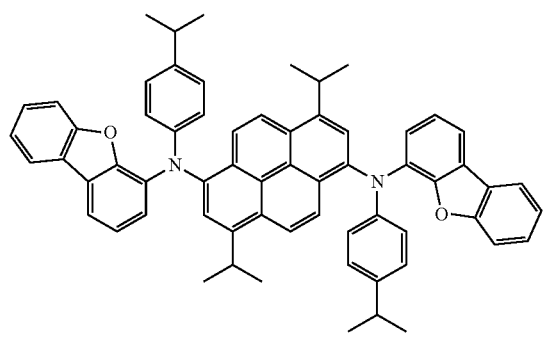
FD24
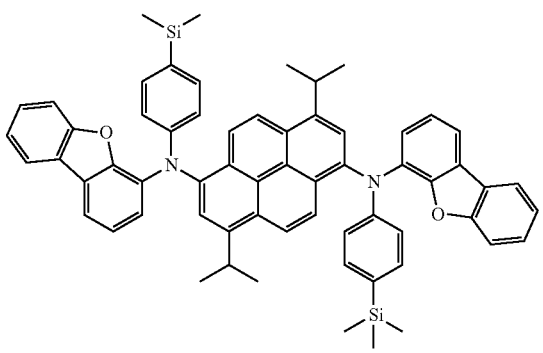
FD25
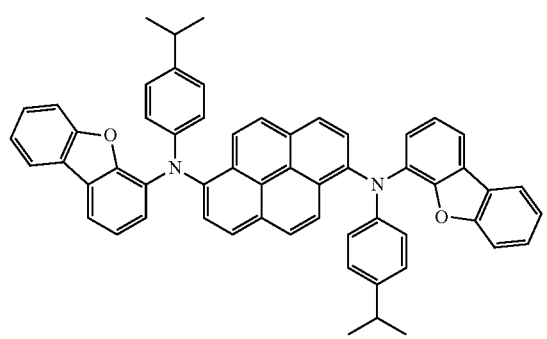
FD26
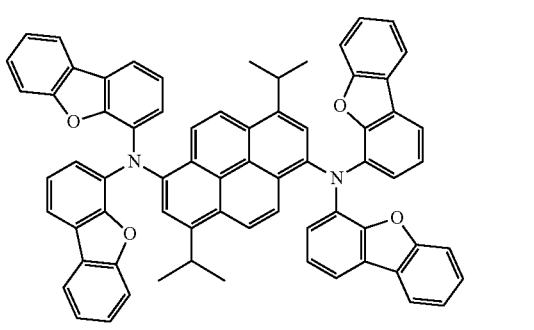

-continued
FD27
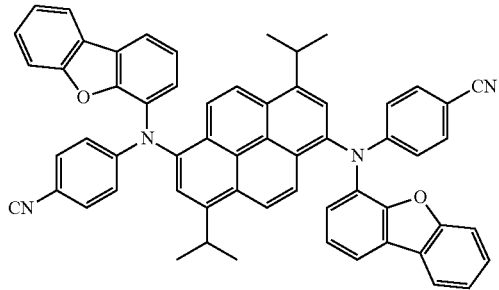
FD28
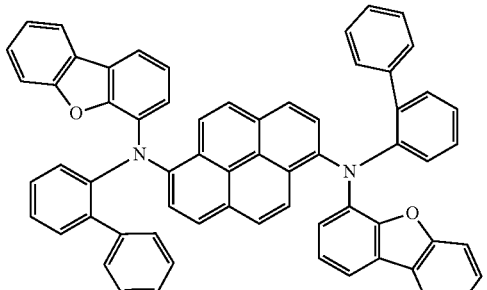
FD29
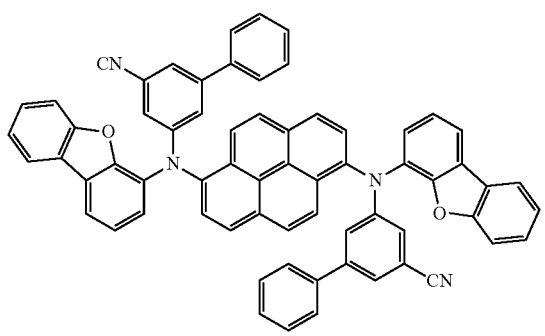
FD30
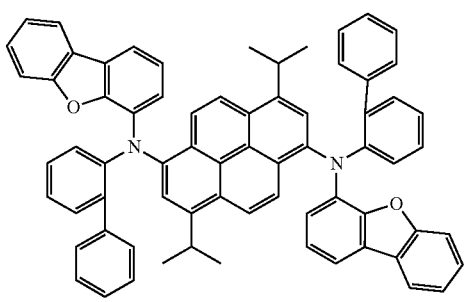
FD31
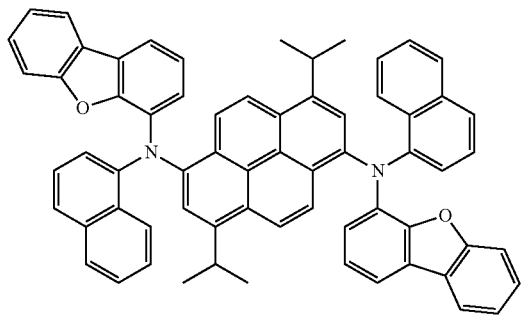
FD32
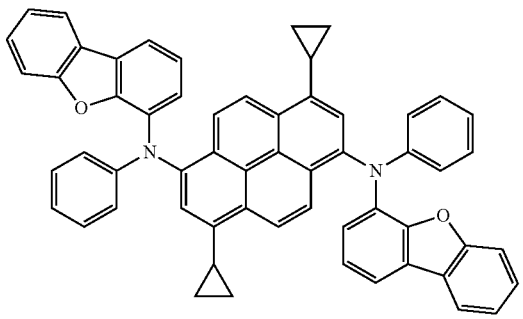
FD33
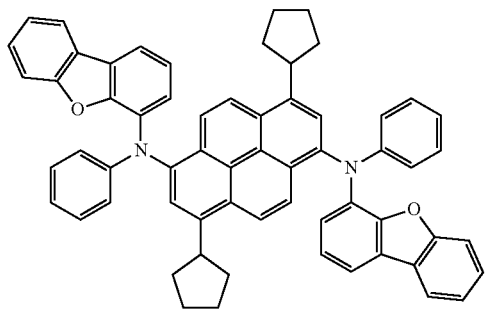
FD34
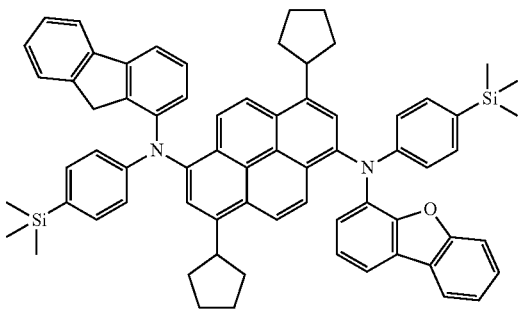

FD35

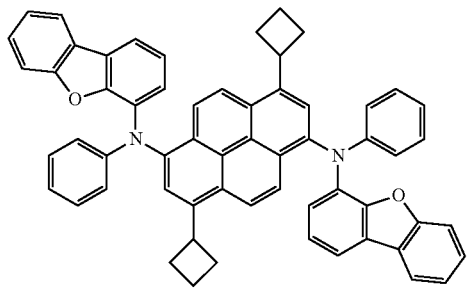

FD36

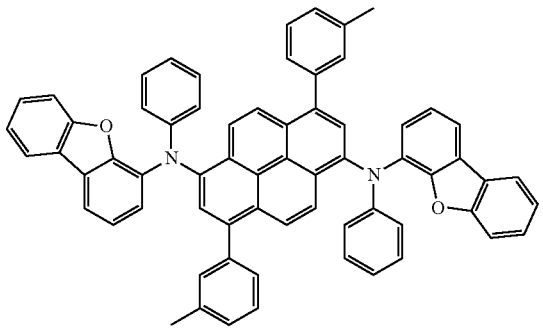

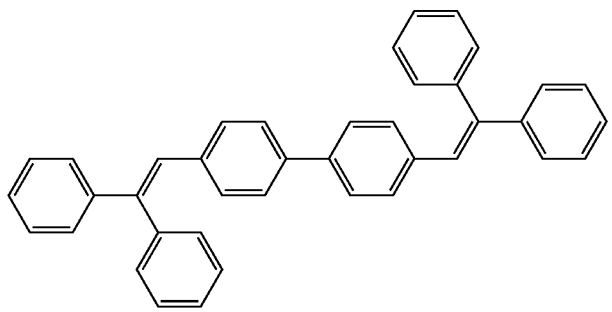

DPVBi

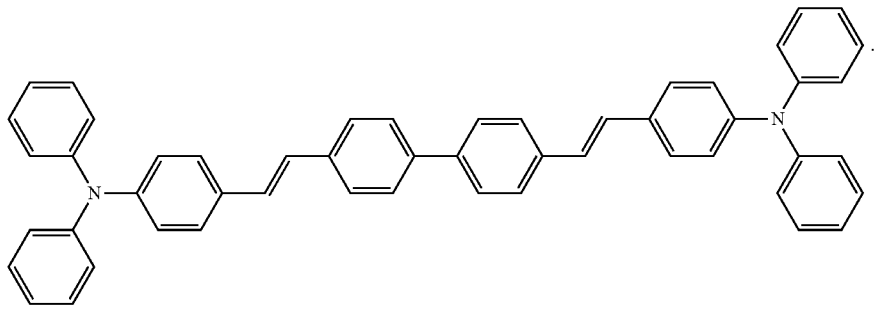

DPAVBi

Delayed Fluorescence Material

The emission layer may include a delayed fluorescence material.

In the present specification, the delayed fluorescence material may be selected from compounds capable of emitting delayed fluorescence based on a delayed fluorescence emission mechanism.

The delayed fluorescence material included in the emission layer may act (e.g., serve) as a host or a dopant depending on the kind (e.g., type) of other materials included in the emission layer.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the range described above, up-conversion from the triplet state to the singlet state of the delayed fluorescence materials may occur effectively, and thus, the emission efficiency of the light-emitting device 10 may be improved.

In one or more embodiments, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, and/or a π electron-deficient nitrogen-containing $C_1$-$C_{60}$ cyclic group), and/or ii) a material including a $C_8$-$C_{60}$ polycyclic group in which two or more cyclic groups are condensed while sharing boron (B).

Examples of the delayed fluorescence material may include at least one of Compounds DF1 to DF9:

DF1
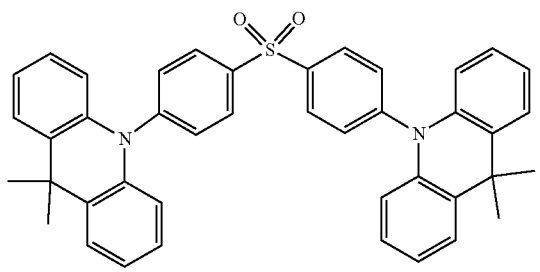
(DMAC-DPS)
DF2
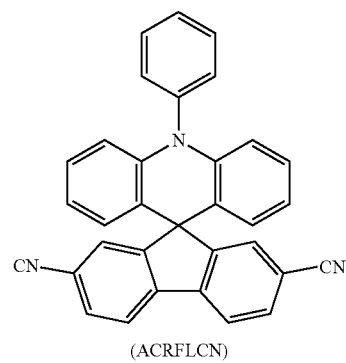
(ACRFLCN)
DF3
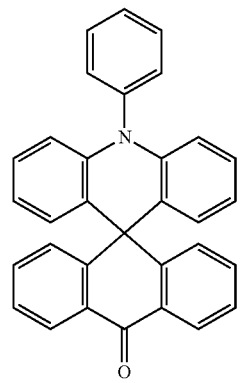
(ACRSA)
DF4
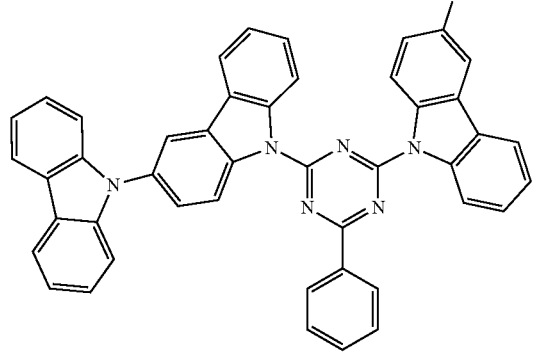
(CC2TA)
DF5
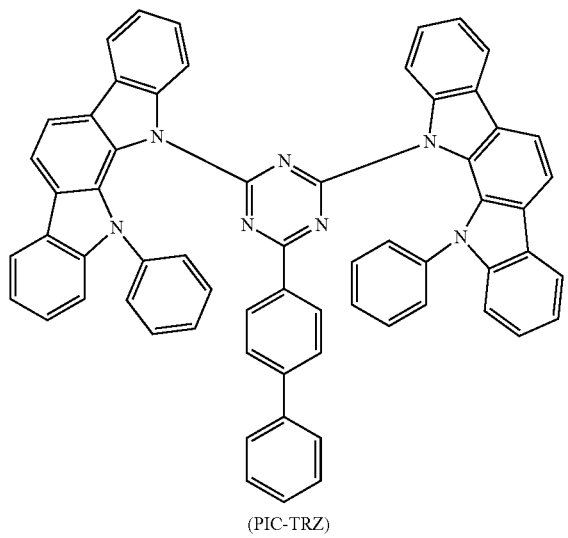
(PIC-TRZ)
DF6
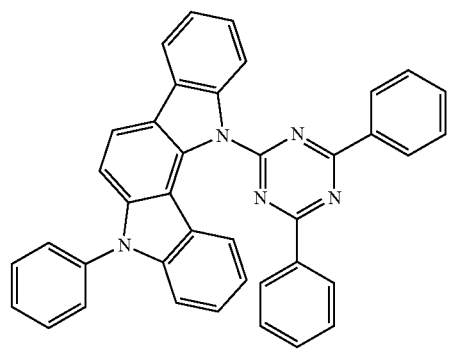
(PIC-TRZ2)
DF7
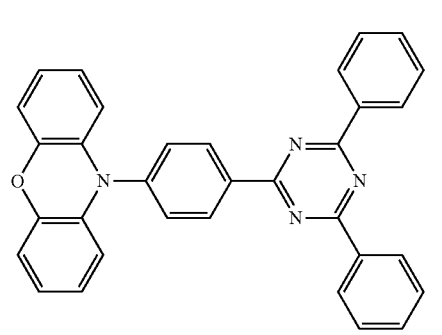
(PXZ-TRZ)
DF8
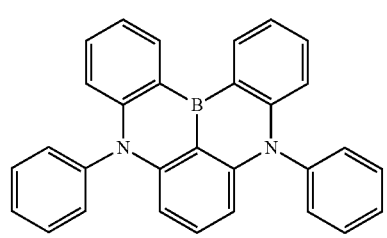
(DABNA-1)

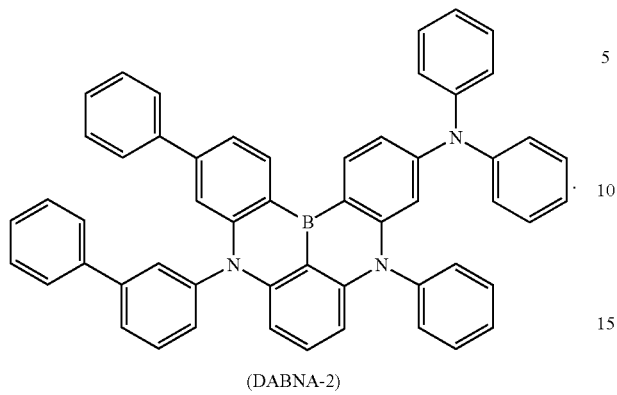

(DABNA-2)

In an embodiment, the delayed fluorescence material may include a boron-containing condensed cyclic compound represented by Formula 2:

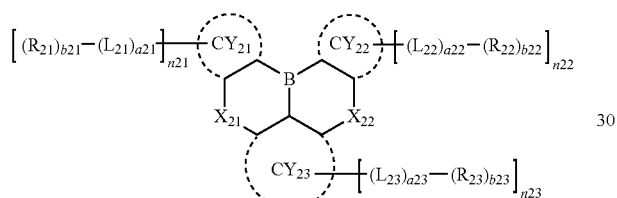

Formula 2 wherein, in Formula 2, $X_{21}$ may be $C(R_{24})(R_{25})$, $N(R_{24})$, O, or S, $X_{22}$ may be $C(R_{26})(R_{27})$, $N(R_{26})$, O, or S, CY21 to CY23 and $L_{21}$ to $L_{23}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a21 to a23 may each independently be an integer from 0 to 5, $R_{21}$ to $R_{27}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), b21 to b23 may each independently be an integer from 1 to 10, n21 to n23 are each independently an integer from 1 to 4, and $R_{10a}$ and $Q_1$ to $Q_3$ may each independently be the same as to be described below.

In an embodiment, the condensed cyclic compound represented by Formula 2 may include at least one selected from Compounds BD1 to BD19, but embodiments of the present disclosure are not limited thereto:

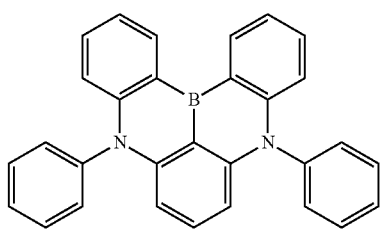

BD1

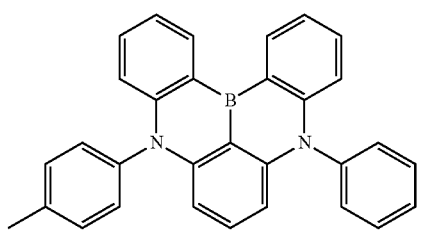

BD2

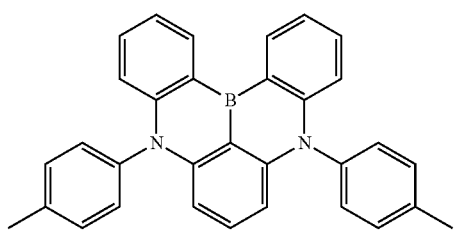

BD3

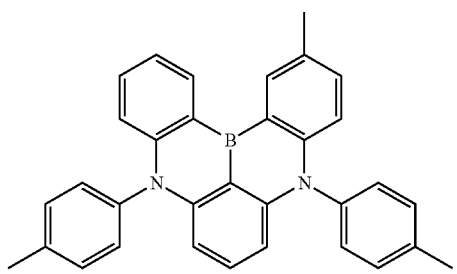

BD4

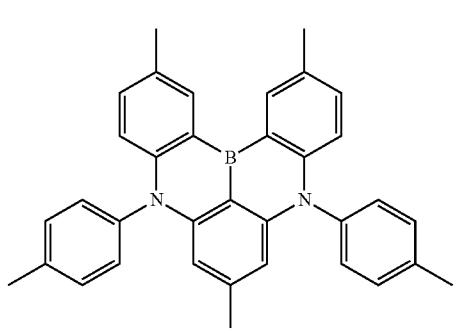

BD5

BD6
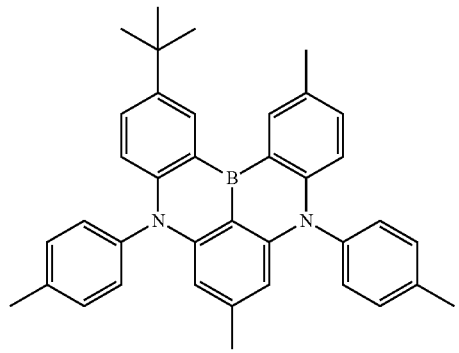
BD7
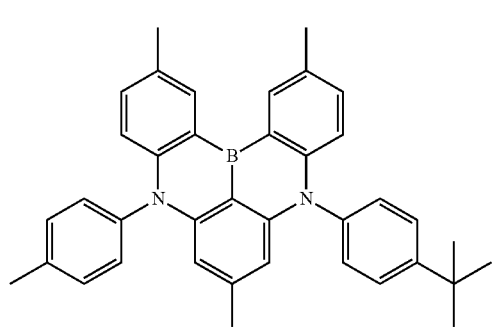
BD8
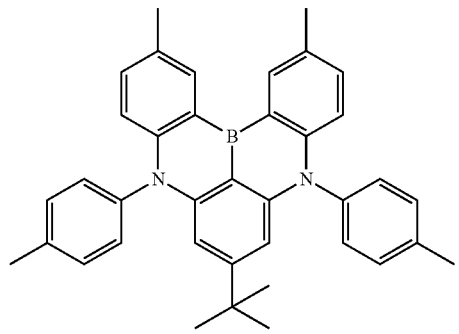
BD9
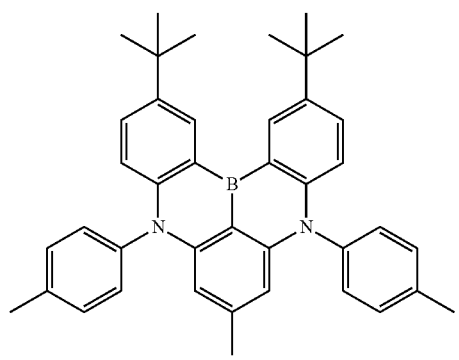
BD10
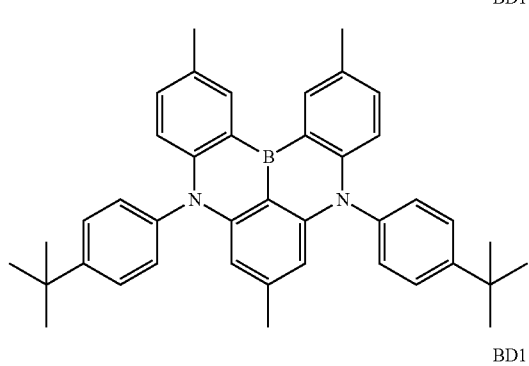
BD11
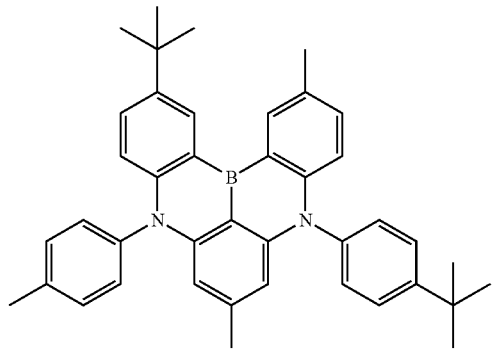
BD12
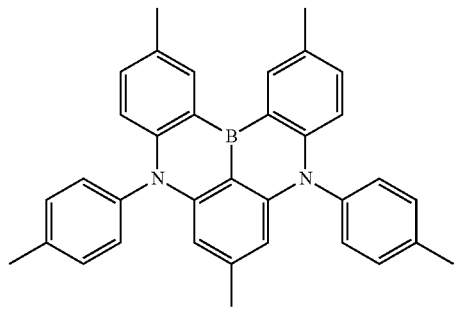
BD13
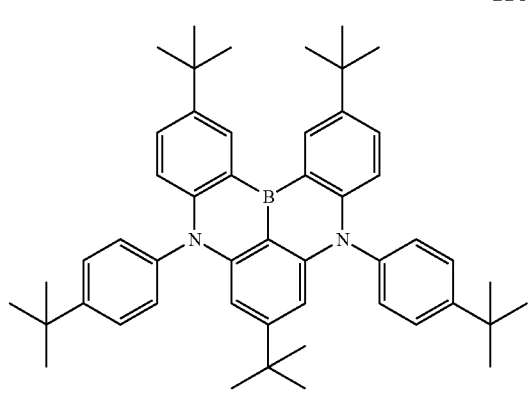

BD14

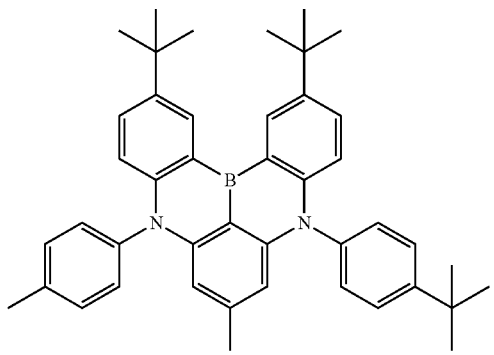

BD15

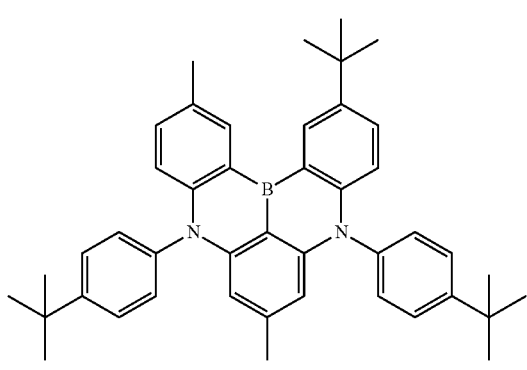

BD16

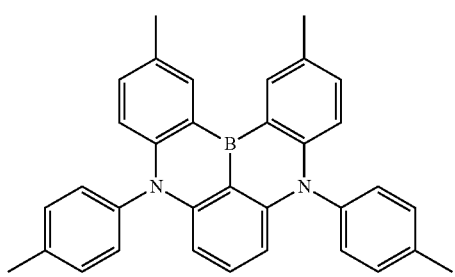

BD17

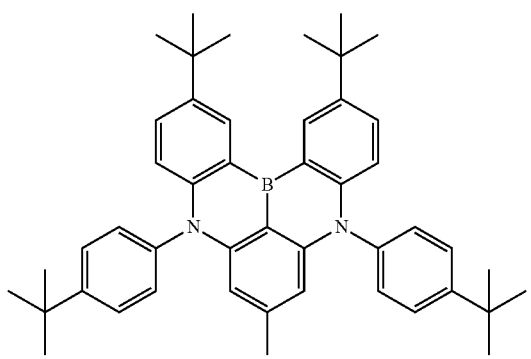

BD18

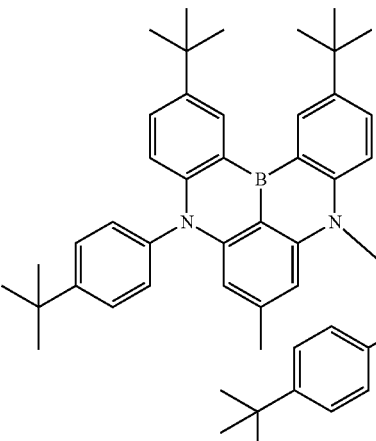

BD19

Because the condensed cyclic compound represented by Formula 2 has a narrow full width at half maximum (FWHM), a light-emitting device including the condensed cyclic compound may have improved color purity, and may have improved maximum external quantum efficiency due to an increase in the optical resonance effect.

Quantum Dot

The emission layer may include a quantum dot.

In the present specification, a quantum dot refers to a crystal of a semiconductor compound, and may include any suitable material capable of emitting light of various suitable emission wavelengths according to the size of the crystal.

A diameter of the quantum dot may be, for example, in a range of about 1 nm to about 10 nm.

The quantum dot may be synthesized by a wet chemical process, a metal organic (e.g., organometallic) chemical vapor deposition process, a molecular beam epitaxy process, or any process similar thereto.

According to the wet chemical process, a precursor material is mixed with an organic solvent to grow a quantum dot crystal particle. When the crystal grows, the organic solvent naturally acts as a dispersant coordinated on the surface of the quantum dot crystal and controls the growth of the crystal. Therefore, the growth of quantum dot particles may be controlled through a low cost process which is more easily performed than vapor deposition methods, such as metal organic chemical vapor deposition (MOCVD) and/or molecular beam epitaxy (MBE).

The quantum dot may include Group II-VI semiconductor compounds, Group III-V semiconductor compounds, Group III-VI semiconductor compounds, Group I-III-VI semiconductor compounds, Group IV-VI semiconductor compounds, a Group IV element or compound; or any combination thereof.

Examples of the Group II-VI semiconductor compound may include (e.g., may be) a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound may include (e.g., may be) a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or any combination thereof. Meanwhile, the Group III-V semiconductor compound may further include a Group II element. Examples of the Group III-V semiconductor compound further including the Group II element may include (e.g., may be) InZnP, InGaZnP, InAlZnP, etc.

Examples of the Group III-VI semiconductor compound may include (e.g., may be) a binary compound, such as GaS, GaSe, $Ga_2Se_3$, GaTe, InS, $In_2S_3$, InSe, $In_2Se_3$, and/or InTe; a ternary compound, such as $InGaS_3$ and/or $InGaSe_3$; or any combination thereof.

Examples of the Group I-III-VI semiconductor compound may include (e.g., may be) a ternary compound, such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound may include (e.g., may be) a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element or compound may include a single element material, such as Si and/or Ge; a binary compound, such as SiC and/or SiGe; or any combination thereof.

Each element included in a multi-element compound such as the binary compound, the ternary compound and/or the quaternary compound, may exist in a particle with a uniform concentration or a non-uniform concentration.

In some embodiments, the quantum dot may have a single structure or a dual core-shell structure. In the case of the quantum dot having a single structure, the concentration of each element included in the corresponding quantum dot may be uniform. In one or more embodiments, in a quantum dot with a core-shell structure, the material contained in the core and the material contained in the shell may be different from each other.

The shell of the quantum dot may act (e.g., serve) as a protective layer to prevent or reduce chemical degeneration of the core to maintain semiconductor characteristics and/or serve as a charging layer to impart electrophoretic characteristics to the quantum dot. The shell may be a single layer or a multi-layer. The interface between the core and the shell may have a concentration gradient in which the concentration of elements existing in the shell decreases toward the center.

Examples of the shell of the quantum dot may include (e.g., may be) a metal oxide, a metalloid oxide, a non-metal oxide, a semiconductor compound, or any combination thereof. Examples of the metal oxide, the metalloid oxide, and the non-metal oxide may include (e.g., may be) a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; and any combination thereof. Examples of the semiconductor compound may include (e.g., may be), as described herein, Group II-VI semiconductor compounds; Group III-V semiconductor compounds; Group III-VI semiconductor compounds; Group I-III-VI semiconductor compounds; Group IV-VI semiconductor compounds; and any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within these ranges, color purity and/or color gamut (e.g., color reproducibility) may be increased. In addition, because light emitted through the quantum dot is emitted in all directions, a wide viewing angle may be improved.

In addition, the quantum dot may be a spherical particle, a pyramidal particle, a multi-arm particle, a cubic nanoparticle, a nanotube particle, a nanowire particle, a nanofiber particle, and/or a nanoplate particle.

Because the energy band gap may be adjusted by controlling the size of the quantum dot, light having various suitable wavelength bands may be obtained from the quantum dot emission layer. Therefore, by utilizing quantum dots of different sizes, a light-emitting device that emits light of various wavelengths may be implemented. In more detail, the size of the quantum dot may be selected to emit red, green and/or blue light. In addition, the size of the quantum dot may be configured to emit white light by combining light of various suitable colors.

Electron Transport Region in Interlayer 130

The electron transport region may have: i) a single-layered structure consisting of a single layer consisting of a single material, ii) a single-layered structure consisting of a single layer including a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from the emission layer in the respective stated order.

The electron transport region (for example, the buffer layer, the hole blocking layer, the electron control layer, or the electron transport layer in the electron transport region)

may include a metal-free compound including at least one π electron-deficient nitrogen-containing $C_1$-$C_{60}$ cyclic group.

In an embodiment, the electron transport region may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$ ($Q_{601}$), or —P(=O)($Q_{601}$)($Q_{602}$), $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

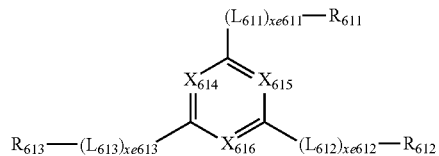

Formula 601-1 wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

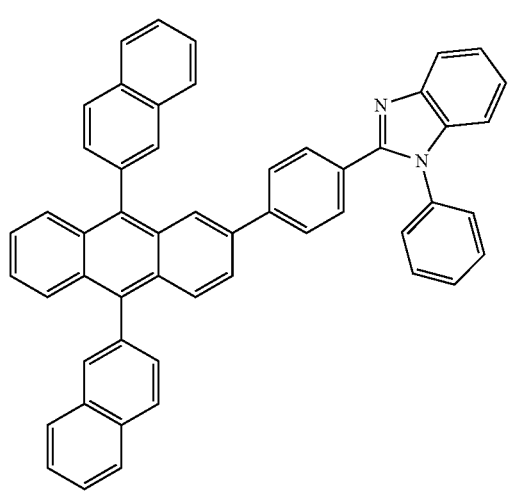

ET1

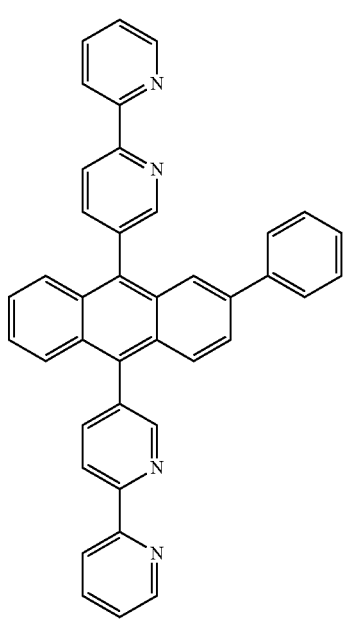

ET2

ET3 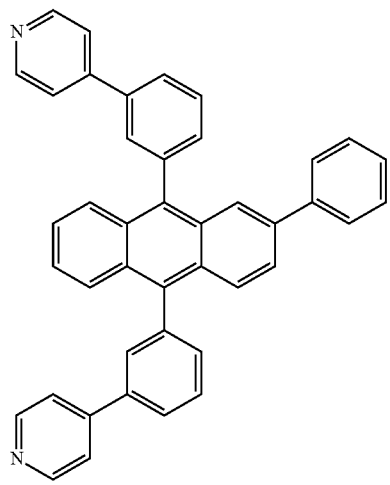
ET4 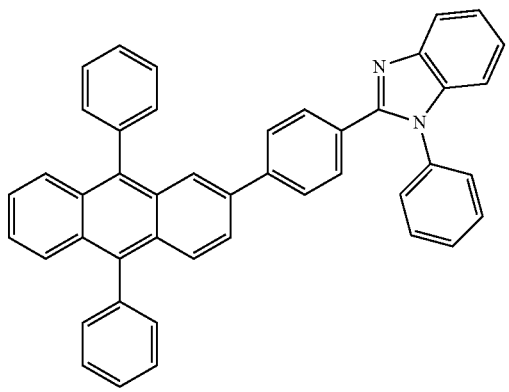
ET5 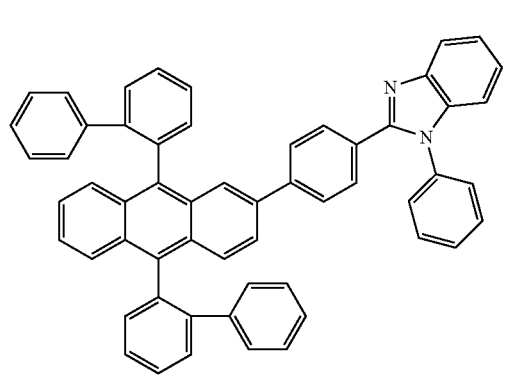
ET6 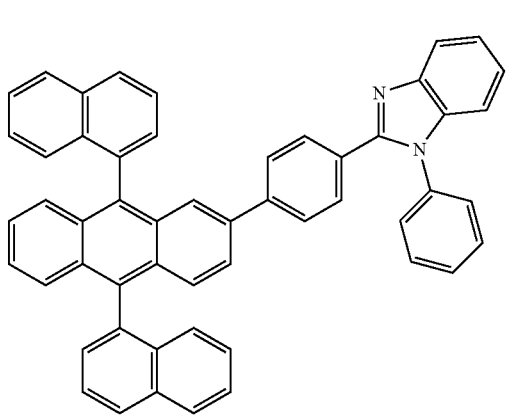
ET7 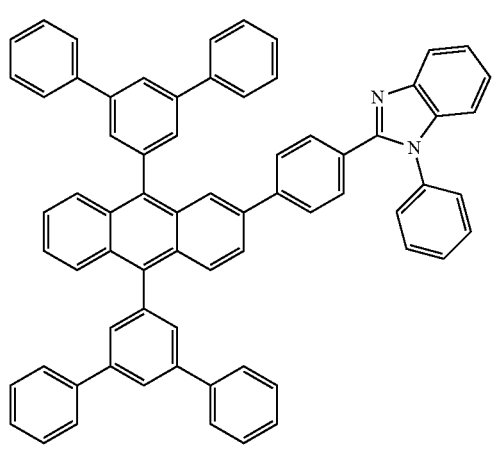
ET8 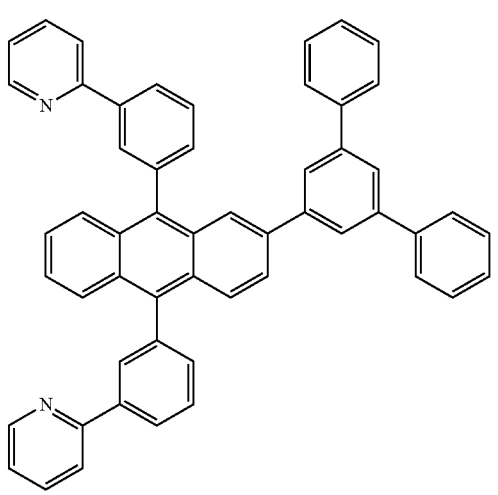

-continued
ET9
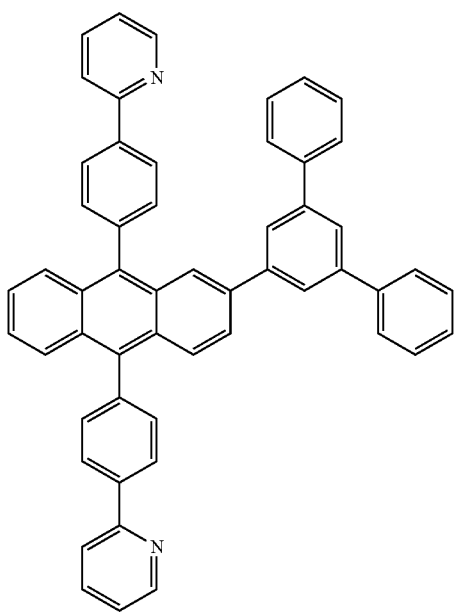
ET10
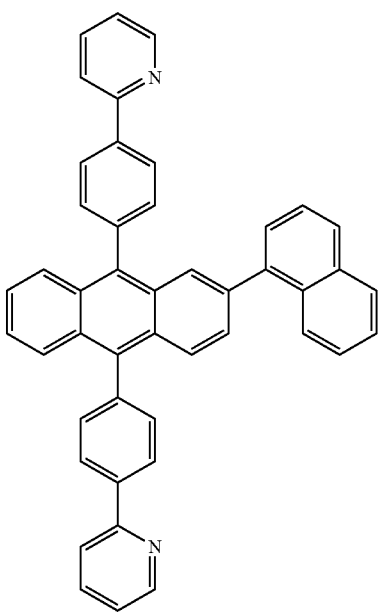
ET11
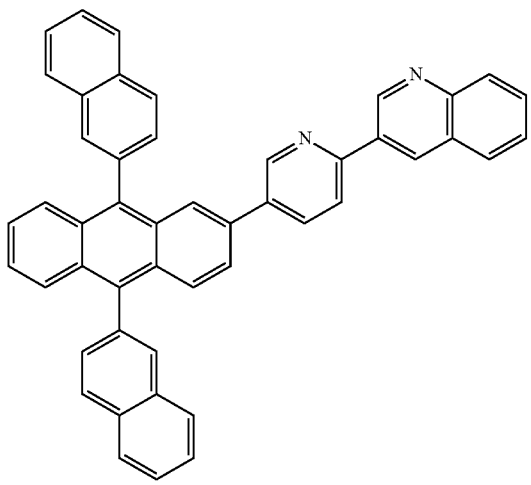
ET12
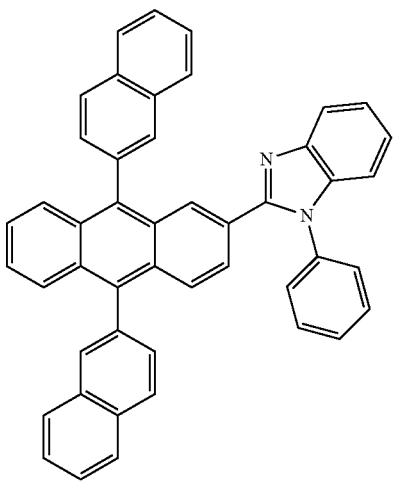
ET13
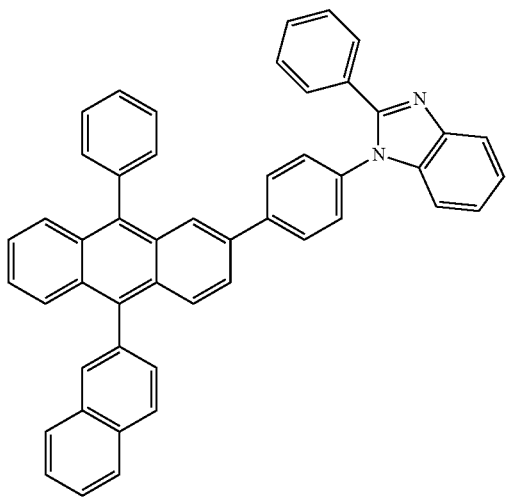
ET14
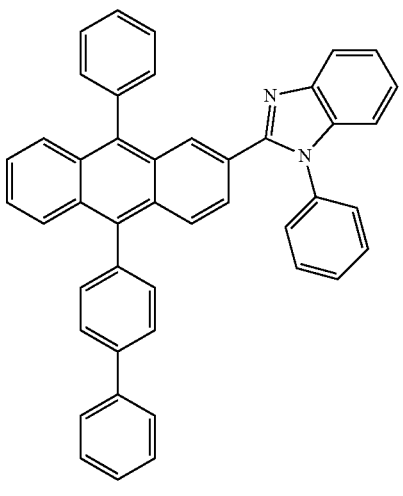

-continued
ET15
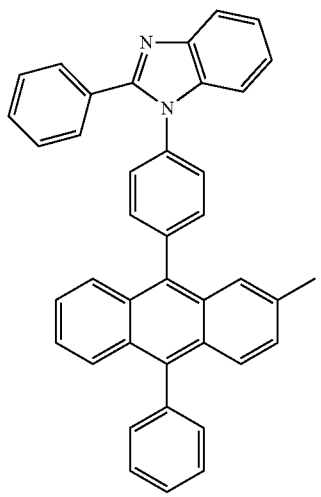
ET16
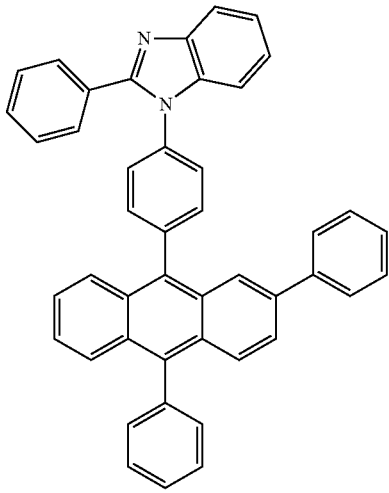
ET17
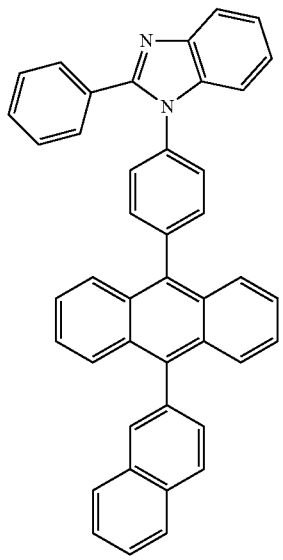
ET18
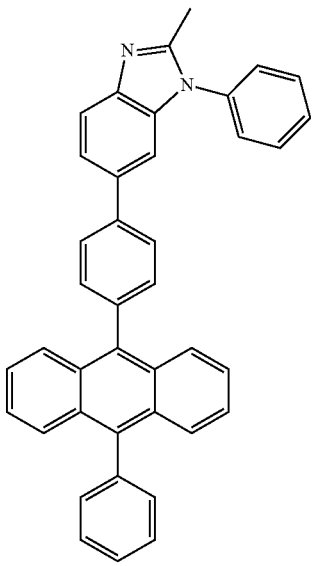
ET19
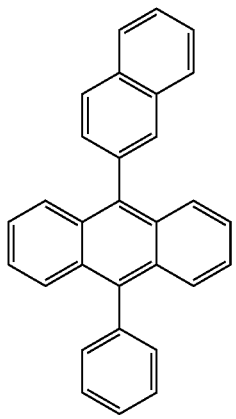
ET20
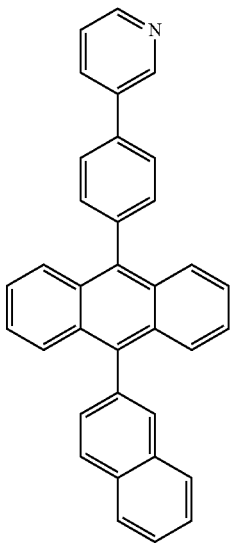

-continued
121
ET21
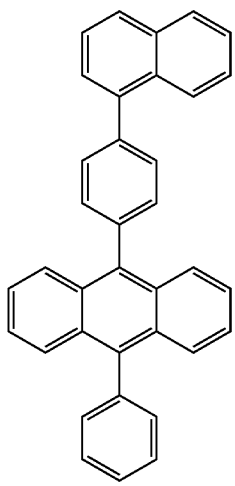
122
ET22
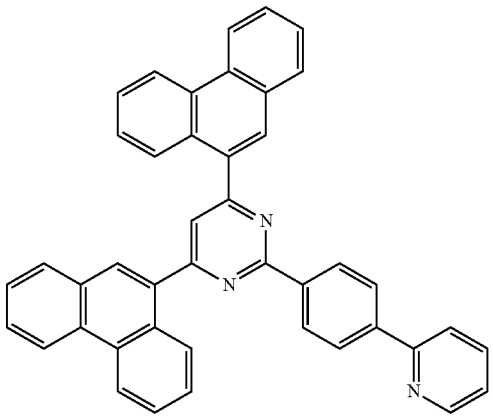
ET23
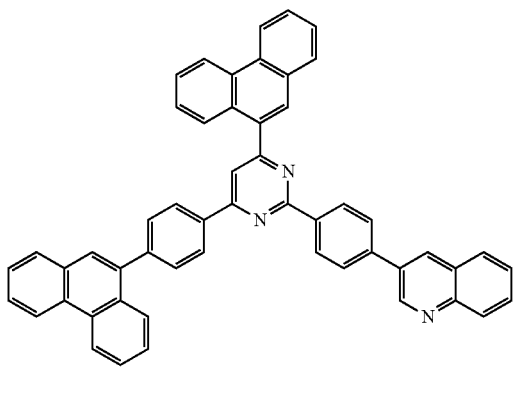
ET24
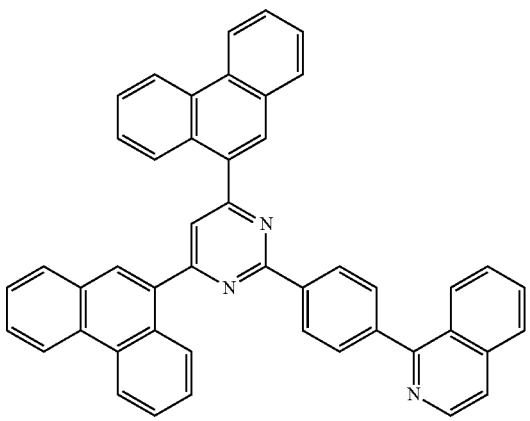
ET25
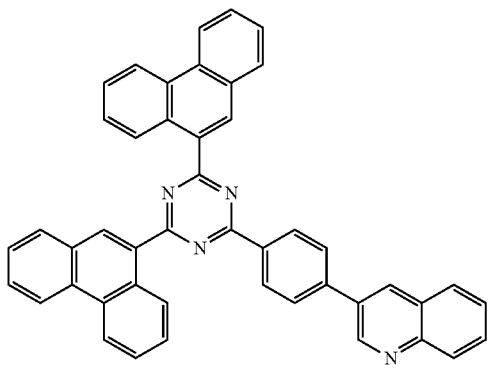
ET26
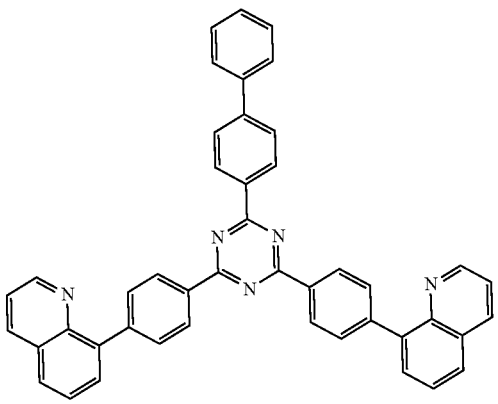

ET27
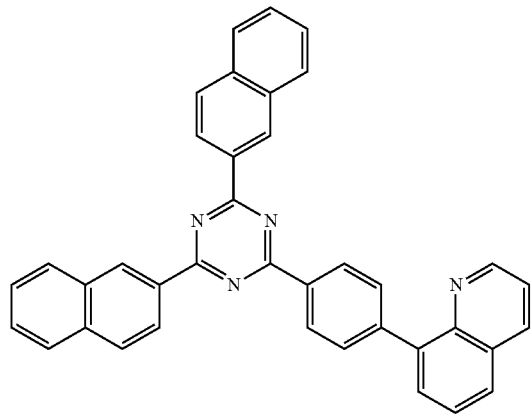
ET28
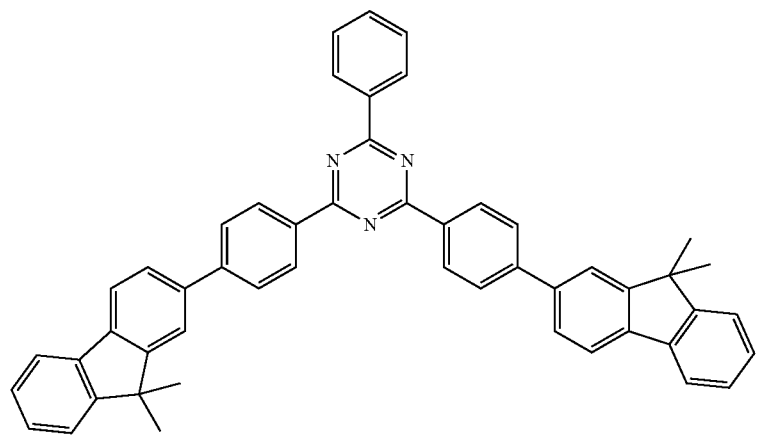
ET29
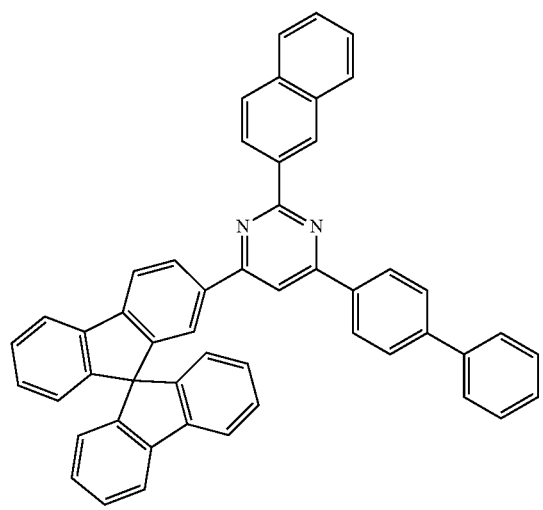
ET30
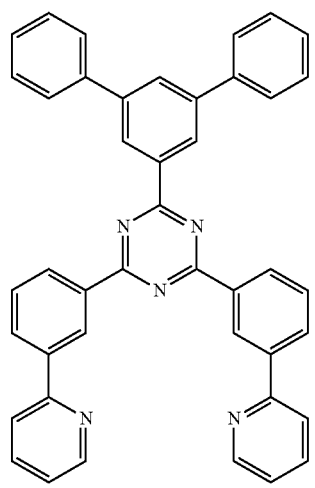

-continued
ET31
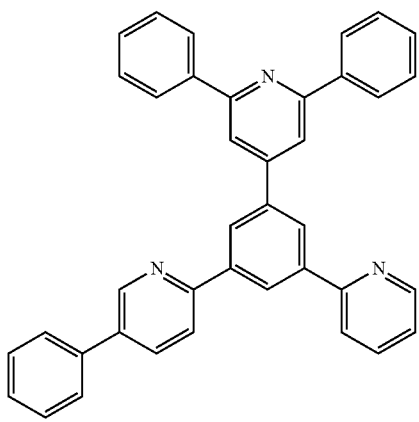
ET32
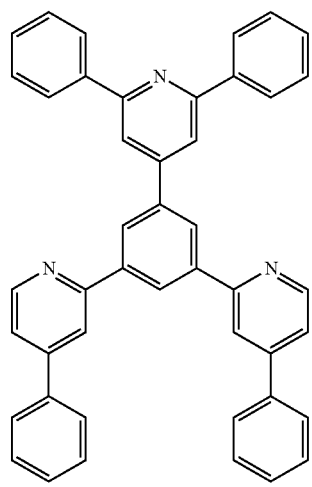
ET33
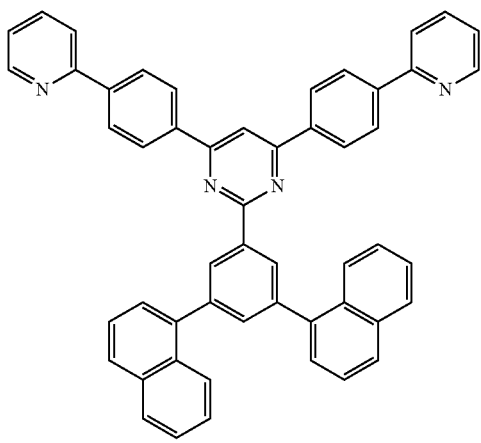
ET34
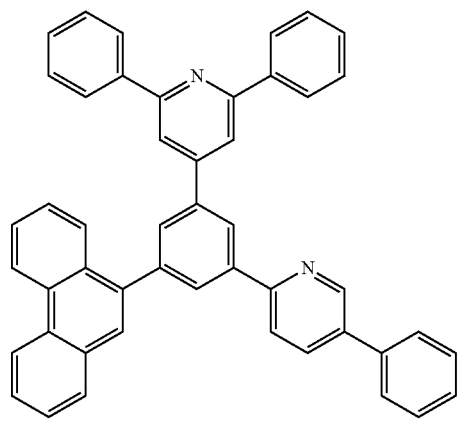
ET35
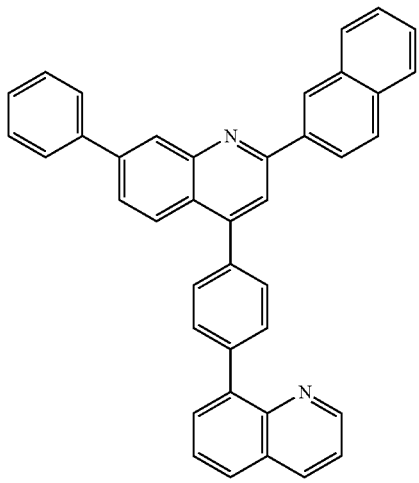
ET36
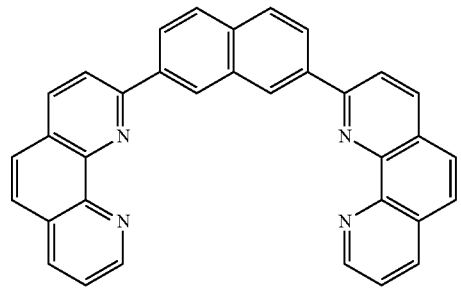

-continued
ET37
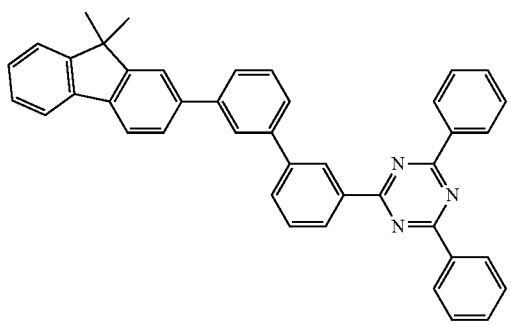
ET38
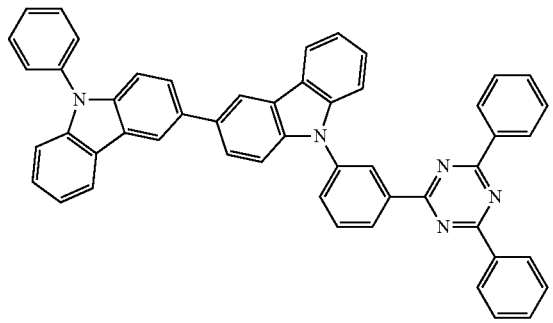
ET39
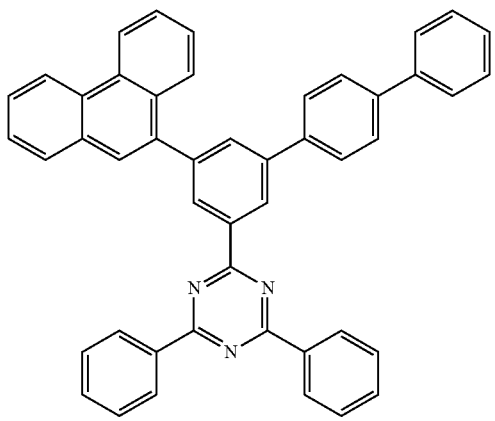
ET40
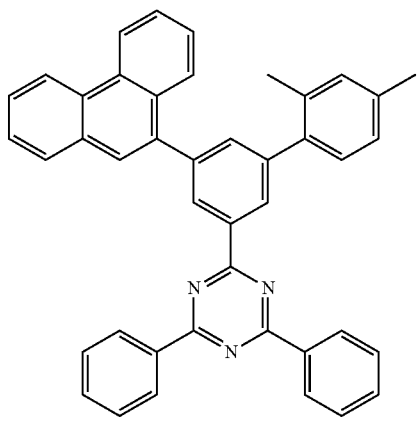
ET41
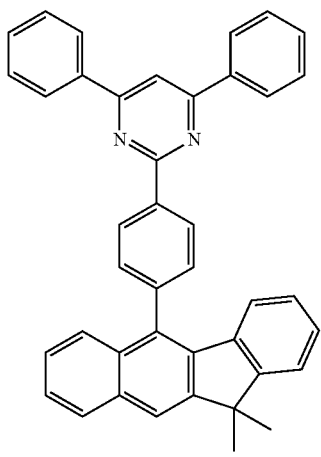
ET42
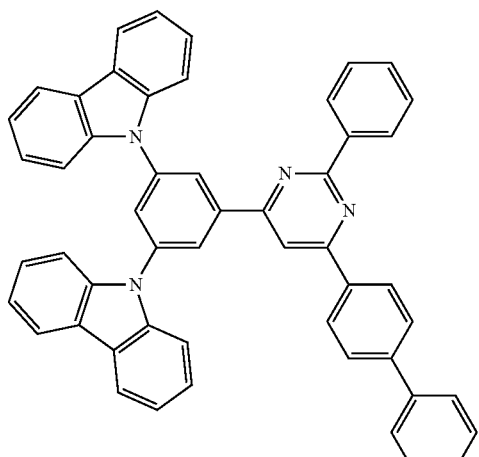

-continued

ET43

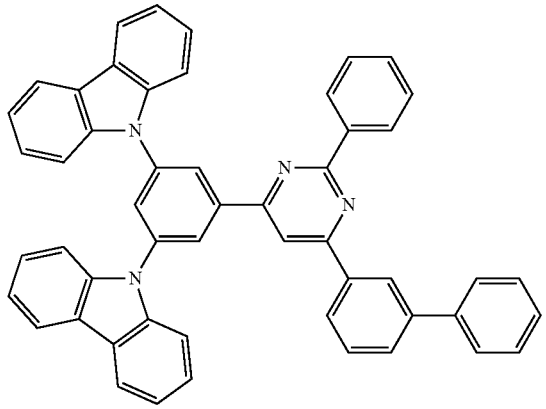

ET44

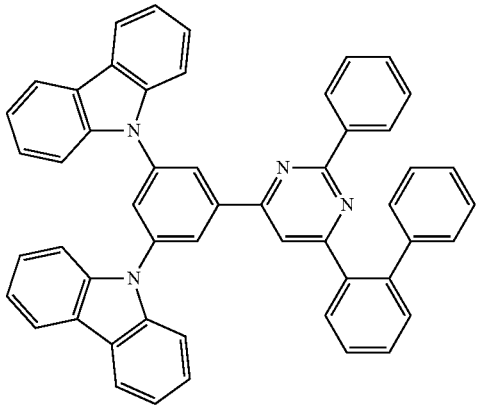

ET45

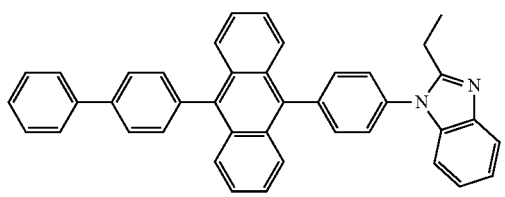

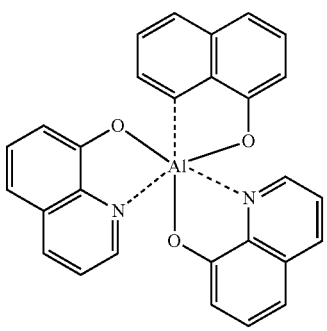

Alq3

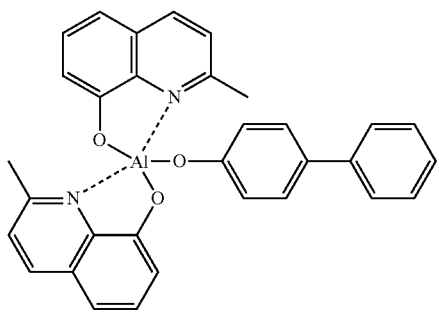

BAlq

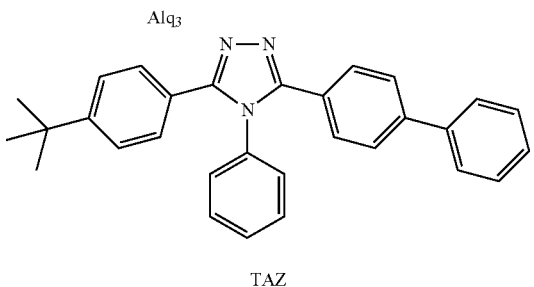

TAZ

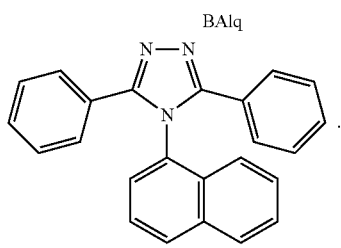

NTAZ

A thickness of the electron transport region may be from about 50 Å to about 5,000 Å, for example, from about 100 Å to about 4,000 Å. When the electron transport region includes the buffer layer, the hole blocking layer, the electron control layer, the electron transport layer, or any combination thereof, a thickness of the buffer layer, the hole blocking layer, and/or the electron control layer may each independently be from about 20 Å to about 1,000 Å, for example, about 30 Å to about 300 Å, and a thickness of the electron transport layer may be from about 100 Å to about 1,000 Å, for example, about 150 Å to about 500 Å. When the thicknesses of the buffer layer, the hole blocking layer, the electron control layer, and/or the electron transport layer are within these respective ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. The metal ion of the alkali metal complex may be a Li ion, a Na ion, a K ion, a Rb ion, or a Cs ion, and the metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

ET-D1

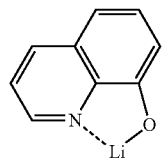

ET-D2

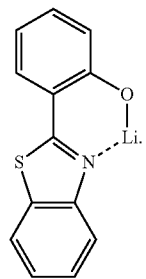

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, and/or iodides), and/or tellurides of the alkali metal, the alkaline earth metal, and the rare earth metal, or any combination thereof.

The alkali metal-containing compound may include alkali metal oxides (such as $Li_2O$, $Cs_2O$, and/or $K_2O$), alkali metal halides (such as LiF, NaF, CsF, KF, LiI, NaI, CsI, and/or KI), or any combination thereof. The alkaline earth metal-containing compound may include alkaline earth metal oxides, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include (e.g., may be) LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., consist of) i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In one or more embodiments, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the ranges described above, the electron injection layer may have satisfactory electron injection characteristics without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be utilized.

In one or more embodiments, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode (e.g., on the side opposite to the second electrode) 110, and/or a second capping layer may be located outside the second electrode (e.g., on the side opposite to the first electrode) 150. In one or more embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer of the interlayer 130 of the light-emitting device 10 may be extracted toward (e.g., transmitted or provided to) the outside through the first electrode 110, which is a semi-transmissive electrode or a transmissive electrode, and the first capping layer, and/or light generated in the emission layer of the interlayer 130 of the light-emitting device 10 may be extracted toward (e.g., transmitted or provided to) the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 may be increased, so that the emission efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrin derivative, a phthalocyanine derivative, a naphthalocyanine derivative, an alkali metal complex, an alkaline earth metal complex, or any combination thereof. The carbocyclic compound, the heterocyclic compound, and/or the amine group-containing compound may be optionally substituted with a substituent containing O, N, S, Se, Si, F, Cl, Br, I, or any combination thereof. In one or more embodiments, at least one of the first capping layer or the second capping layer may each independently include an amine group-containing compound.

In one or more embodiments, at least one of the first capping layer or the second capping layer may each independently include a compound represented by Formula 201, a compound represented by Formula 202, or any combination thereof.

In one or more embodiments, at least one of the first capping layer or the second capping layer may each independently include one of Compounds HT28 to HT33, one of Compounds CP1 to CP6, β-NPB, or any combination thereof:

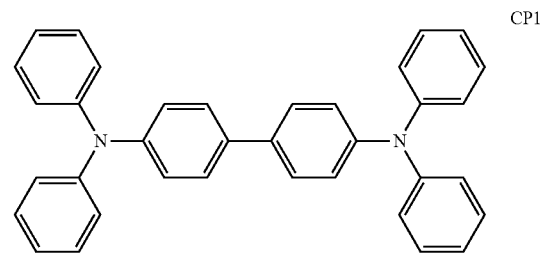

CP1

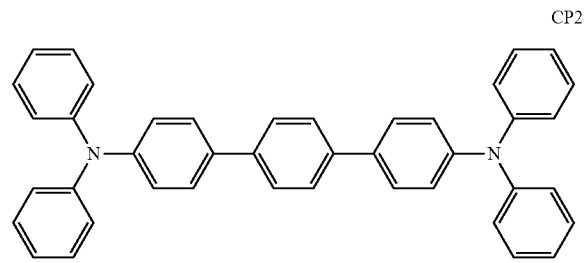

CP2

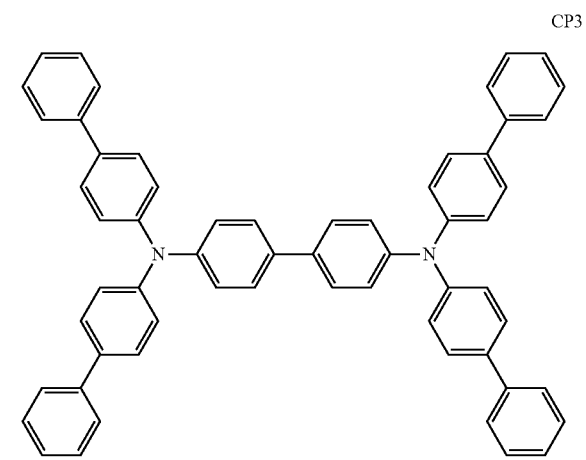

CP3

-continued

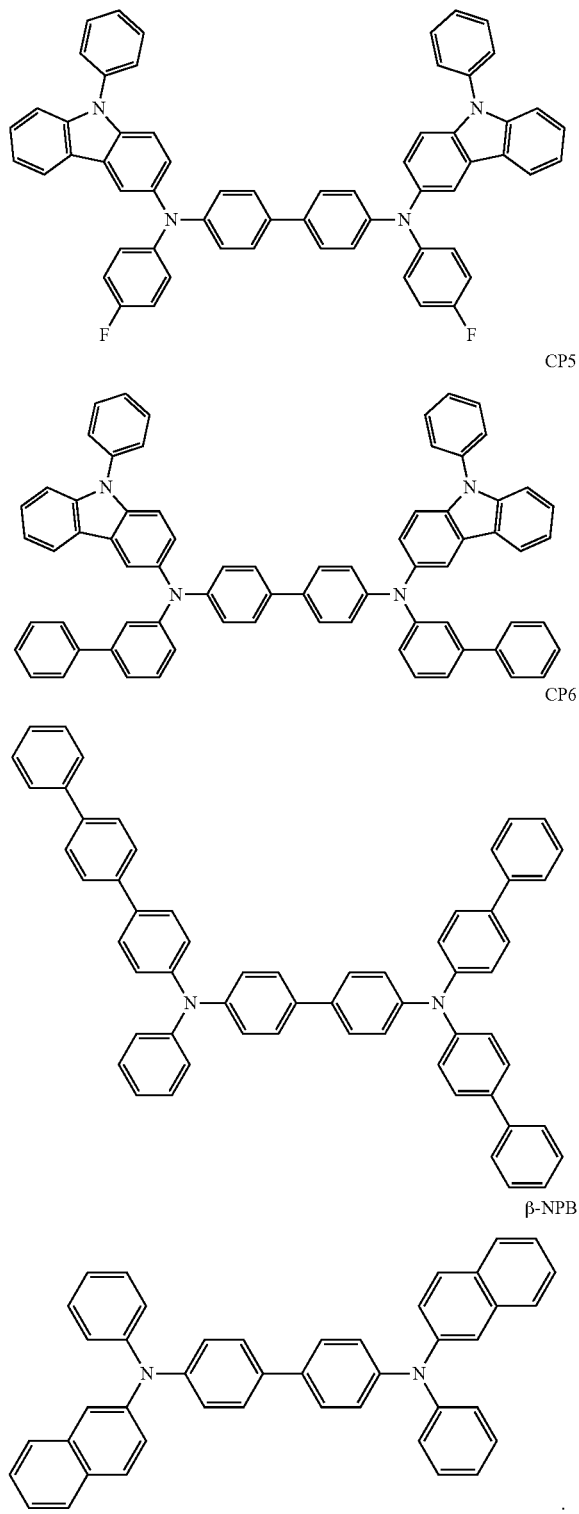

Electronic Apparatus

The light-emitting device may be included in various suitable electronic apparatuses. In one or more embodiments, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In one or more embodiments, the light emitted from the light-emitting device may be blue light or white light. The light-emitting device may be the same as described above. In one or more embodiments, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the plurality of subpixel areas, and the color conversion layer may include a plurality of color conversion areas respectively corresponding to the plurality of subpixel areas.

A pixel-defining film may be located among the plurality of subpixel areas to define each of the subpixel areas.

The color filter may further include a plurality of color filter areas and light-shielding patterns located among the plurality of color filter areas, and the color conversion layer may include a plurality of color conversion areas and light-shielding patterns located among the plurality of color conversion areas.

The plurality of color filter areas (or the plurality of color conversion areas) may include a first area emitting a first-color light, a second area emitting a second-color light, and/or a third area emitting a third-color light, and the first-color light, the second-color light, and/or the third-color light may have different maximum emission wavelengths from one another. In one or more embodiments, the first-color light may be red light, the second-color light may be green light, and the third-color light may be blue light. In one or more embodiments, the plurality of color filter areas (or the plurality of color conversion areas) may include quantum dots. In an embodiment, the first area may include a red quantum dot (e.g., a red-light emitting quantum dot), the second area may include a green quantum dot (e.g., a green-light emitting quantum dot), and the third area may not include a quantum dot. The quantum dot may be the same as described in the present specification. The first area, the second area, and/or the third area may each further include a scatterer.

In one or more embodiments, the light-emitting device may emit a first light, the first area may absorb the first light to emit a first first-color light, the second area may absorb the first light to emit a second first-color light, and the third area may absorb the first light to emit a third first-color light. In this regard, the first first-color light, the second first-color light, and the third first-color light may have different maximum emission wavelengths. For example, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer (e.g., an active layer), wherein the source electrode or the drain electrode may be electrically connected to the first electrode or the second electrode of the light-emitting device.

The thin-film transistor may further include a gate electrode, a gate insulating film, etc.

The activation layer may include crystalline silicon, amorphous silicon, an organic semiconductor, an oxide semiconductor, and/or the like.

The electronic apparatus may further include a sealing portion for sealing the light-emitting device. The sealing portion may be placed between the color filter and the light-emitting device and/or between the light-emitting device and the color conversion layer. The sealing portion allows light from the light-emitting device to be extracted to the outside, while concurrently (or simultaneously) preventing or substantially preventing external ambient air and/or moisture from penetrating into the light-emitting device. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the color conversion layer, according to the usage of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to various suitable displays, light sources, lighting (e.g., lighting apparatuses), personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Figure 2:
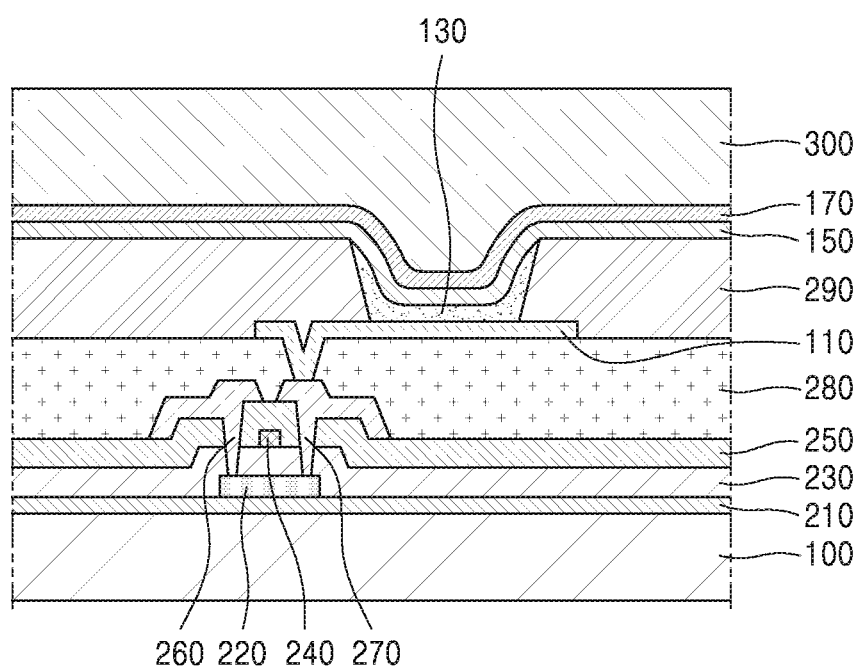
FIG. 2 is a schematic cross-sectional view of an electronic apparatus according to an embodiment.
Figure 3:
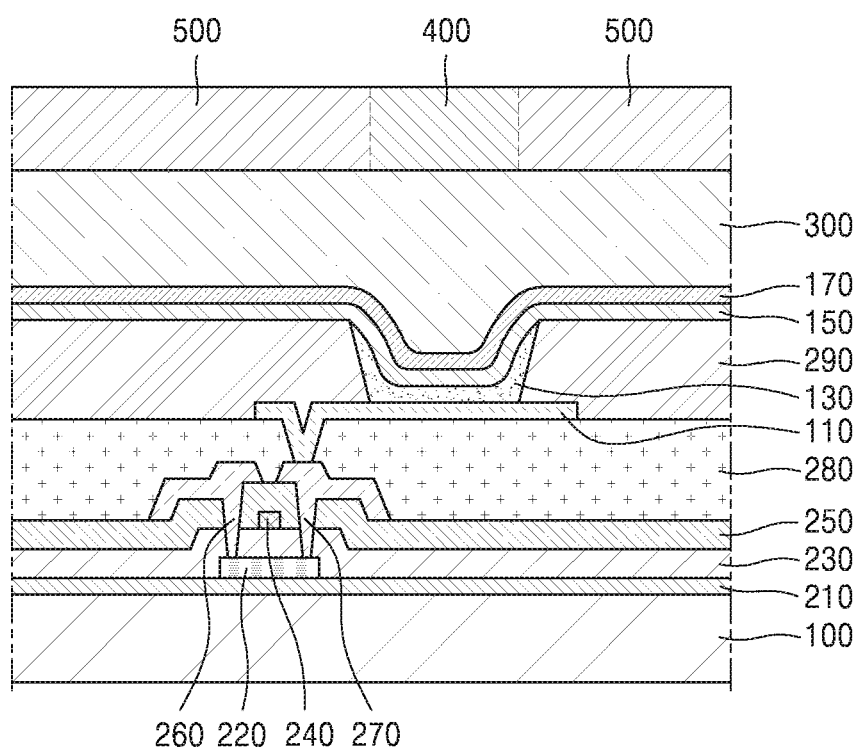
FIG. 3 is a schematic cross-sectional view of an electronic apparatus according to an embodiment.

Description of FIGS. 2 and 3

FIG. 2 is a cross-sectional view showing a light-emitting apparatus according to an embodiment of the present disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT may be electrically connected to a light-emitting device to drive the light-emitting device, and may be covered by a passivation layer 280. The passivation layer 280 may include an inorganic insulating film, an organic insulating film, or a combination thereof. A light-emitting device may be provided on the passivation layer 280. The light-emitting device may include a first electrode 110, an interlayer 130, and a second electrode 150.

The first electrode 110 may be located on the passivation layer 280. The passivation layer 280 does not completely cover the drain electrode 270 and exposes a portion of the drain electrode 270, and the first electrode 110 is connected to the exposed portion of the drain electrode 270.

A pixel defining layer 290 containing an insulating material may be located on the first electrode 110. The pixel defining layer 290 exposes a region of the first electrode 110, and an interlayer 130 may be formed in the exposed region of the first electrode 110. The pixel defining layer 290 may be a polyimide or a polyacrylic organic film. In one or more embodiments, at least some layers (e.g., one or more layers) of the interlayer 130 may extend beyond the upper portion of the pixel defining layer 290 to be in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or a combination thereof; or a combination of the inorganic film and the organic film.

FIG. 3 is a cross-sectional view showing a light-emitting apparatus according to an embodiment of the present disclosure.

The light-emitting apparatus of FIG. 3 is the same as the light-emitting apparatus of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

Manufacture Method

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as used herein refers to a cyclic group consisting of only carbon atoms as ring-forming atoms and having three to sixty carbon atoms, and the term "$C_1$-$C_{60}$ heterocyclic group" as used herein refers to a cyclic group that has, in addition to one to sixty carbon atom(s), a heteroatom as ring-forming atoms. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the number of ring-forming atoms of the $C_1$-$C_{60}$ heterocyclic group may be from 3 to 61.

The term "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{60}$ carbocyclic group may be i) a T1 group or ii) a condensed cyclic group in which two or more T1 groups are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, and/or an indenoanthracene group), the $C_1$-$C_{60}$ heterocyclic group may be i) a T2 group, ii) a condensed cyclic group in which two or more T2 groups are condensed with each other, or iii) a condensed cyclic group in which at least one T2 group and at least one T1 group are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) a T1 group, ii) a condensed cyclic group in which two or more T1 groups are condensed with each other, iii) a $T_3$ group, iv) a condensed cyclic group in which two or more $T_3$ groups are condensed with each other, or v) a condensed cyclic group in which at least one $T_3$ group and at least one T1 group are condensed with each other (for example, the π electron-rich $C_3$-$C_{60}$ cyclic group may be the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) a $T_4$ group, ii) a condensed cyclic group in which two or more $T_4$ groups are condensed with each other, iii) a condensed cyclic group in which at least one $T_4$ group and at least one T1 group are condensed with each other, iv) a condensed cyclic group in which at least one $T_4$ group and at least one $T_3$ group are condensed with each other, or v) a condensed cyclic group in which at least one $T_4$ group, at least one T1 group, and at least one $T_3$ group are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group" as used herein each refer to a group condensed to any cyclic group or a monovalent or polyvalent group (for example, a divalent group, a trivalent group, a tetravalent group, etc.), depending on the structure of a formula in connection with which the terms are used. For example, "a benzene group" may be a benzene ring, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_6$ heterocyclic group may include (e.g., may be) a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include (e.g., may be) a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include (e.g., may be) a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle and/or at a terminal end (e.g., the terminus) of the $C_2$-$C_{60}$ alkyl group, and examples thereof may include (e.g., may be) an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at a terminal end (e.g., the terminus) of the $C_2$-$C_{60}$ alkyl group, and examples thereof may include an ethynyl group and a propynyl group. The term "$C_2$-$C_{60}$ alkynylene group" as used herein refers to a divalent group having the same structure as the $C_2$-$C_{00}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof may include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include (e.g., may be) a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof may include (e.g., may be) a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has three to ten carbon atoms and at least one carbon-carbon double bond in the ring thereof and no aromaticity, and examples thereof may include (e.g., may be) a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one double bond (e.g., carbon-carbon double bond) in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group may include (e.g., may be) a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group and an ovalenyl group. When the $C_6$-$C_{60}$ aryl group and the $C_6$-$C_{60}$ arylene group each include two or more rings, the two or more rings may be condensed with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{00}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include (e.g., may be) a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, a dibenzofuranyl group, a dibenzothiophenyl group, and a naphthyridinyl group. When the $C_1$-$C_6$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and no aromaticity in its molecular structure when considered as a whole (e.g., the entire molecular structure is not aromatic). Examples of the monovalent non-aromatic condensed polycyclic group may include (e.g., may be) an indenyl group, a spiro-bifluorenyl group, a benzofluorenyl group, an indenophenanthrenyl group, an adamantyl group, and an indeno anthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, having 1 to 60 carbon atoms), as a ring-forming atom, and having non-aromaticity in its molecular structure when considered as a whole (e.g., the entire molecular structure is not aromatic). Examples of the monovalent non-aromatic condensed heteropolycyclic group may include (e.g., may be) an azaadamantyl group, a 9,10-dihydroacridinyl group and a 9H-xanthenyl group. The term "divalent non-aromatic condensed heteropolycyclic group" as used herein refers to a divalent group having the same structure as a monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —$SA_{103}$ (wherein $A_{103}$ is the $C_6$-$C_{60}$ aryl group).

The term "$R_{10a}$" as used herein refers to:
deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_6$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ as used herein may each independently be: hydrogen; deuterium; —F; —Cl; —Br; —I; a hydroxyl group; a cyano group; a nitro group; a $C_1$-$C_6$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_6$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom may include (e.g., may be) O, S, N, P, Si, B, Ge, Se, and any combination thereof.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a light-emitting device according to embodiments will be described in more detail with reference to Examples.

EXAMPLES

Example 1

As an anode, ITO and $WO_3$ were co-deposited at a weight ratio of 10:1 to a thickness of 70 Å on a glass substrate with ITO (50 Å)/Ag (1,000 Å) sequentially deposited thereon. The glass substrate was sonicated with isopropyl alcohol and pure water each for 5 minutes, and then cleaned by exposure to ultraviolet rays and ozone for 30 minutes. Then, the glass substrate was provided to a vacuum deposition apparatus.

As a hole injection layer, HT3 and $HfO_2$ were co-deposited at a weight ratio of 10:1 on the anode to form a hole injection layer having a thickness of 50 Å. HT3 was deposited on the hole injection layer to form a hole transport layer having a thickness of 1,000 Å.

HT18 was deposited on the hole transport layer to form an electron blocking layer having a thickness of 50 Å.

As a host and a dopant, BH8 and BD5 were co-deposited at a weight ratio of 100:1 on the electron blocking layer to form an emission layer having a thickness of 150 Å.

As a buffer layer, ET28 was deposited on the emission layer to a thickness of 50 Å, ET1 and Liq were co-deposited at a weight ratio of 5:5 on the buffer layer to form an electron transport layer having a thickness of 350 Å, and then, Yb was deposited on the electron transport layer to form an electron injection layer having a thickness of 13 Å.

Ag and Mg (Mg in the amount of 10 wt %) were co-deposited on the electron injection layer to form a cathode having a thickness of 85 Å, and HT28 (700 Å) was deposited on the cathode to form a capping layer, thereby completing the manufacture of a light-emitting device.

Example 2

A light-emitting device was manufactured in the same manner as in Example 1, except that, in forming a hole injection layer, $HfO_2$ was deposited alone without utilizing HT3.

Example 3

A light-emitting device was manufactured in the same manner as in Example 1, except that a hole injection layer was formed in the multi-layered structure of a first hole injection layer which is a single material layer of $HfO_2$ (10 Å) and a second hole injection layer which is a mixed layer of HT3 and $HfO_2$ (weight ratio of 10:1, 50 Å).

Example 4

A light-emitting device was manufactured in the same manner as in Example 1, except that a hole injection layer was formed in the multi-layered structure of a first hole injection layer which is a mixed layer of HT3 and $HfO_2$ (weight ratio of 10:1, 50 Å) and a second hole injection which is a single material layer of $HfO_2$ (10 Å).

Example 5

A light-emitting device was manufactured in the same manner as in Example 1, except that a hole injection layer was formed in the multi-layered structure of a first hole injection layer which is a single material layer of $HfO_2$ (10 Å), a second hole injection layer which is a mixed layer of HT3 and $HfO_2$ (weight ratio of 10:1, 50 Å) and a third hole injection layer which is a single material layer of $HfO_2$ (10 Å).

Example 6

A light-emitting device was manufactured in the same manner as in Example 1, except that a hole injection layer was formed in the multi-layered structure of a first hole injection layer which is a mixed layer of HT3 and $HfO_2$ (weight ratio of 10:1, 50 Å), a second hole injection which is a single material layer of $HfO_2$ (10 Å) and a third hole injection layer which is a mixed layer of HT3 and $HfO_2$ (weight ratio of 10:1, 50 Å).

Example 7

A light-emitting device was manufactured in the same manner as in Example 1, except that, in forming an emission layer, H8 and FD5 were utilized as a host and a dopant.

Comparative Example 1

A light-emitting device was manufactured in the same manner as in Example 1, except that HT3 and F4-TCNQ were co-deposited at a weight ratio of 100:2 in forming a hole injection layer, and H8 and FD5 were utilized as a host and a dopant in forming an emission layer.

Comparative Example 2

A light-emitting device was manufactured in the same manner as in Example 1, except that $MoO_3$ was utilized instead of $WO_3$ in forming an anode, and HT3 and F4-TCNQ were co-deposited at a weight ratio of 100:2 in forming a hole injection layer.

Comparative Example 3

A light-emitting device was manufactured in the same manner as in Example 1, except that $WO_3$ was not utilized in forming an anode, and $TiO_2$ was deposited to a thickness of 50 Å between the anode and a hole injection layer.

Comparative Example 4

A light-emitting device was manufactured in the same manner as in Example 1, except that, in forming a hole injection layer, HT3 and F4-TCNQ were co-deposited at a weight ratio of 100:2.

Evaluation Example 1

The efficiency (Cd/A) of each of the light-emitting devices manufactured according to Examples 1 to 7 and Comparative Examples 1 to 4 at the current density of 10 mA/cm² was measured, and results thereof are shown as a percentage (%) with respect to Comparative Example 1 in Table 1. That is, the efficiency shown in Table 1 is the efficiency of each of Examples 1 to 7 and Comparative Examples 1 to 4 relative to the efficiency of Comparative Example 1.

TABLE 1

| | | Hole injection layer | | | Emission layer | | Efficiency |
|---|---|---|---|---|---|---|---|
| | Anode | First hole injection layer | Second hole injection layer | Third hole injection layer | Host | Dopant | (%) |
| Example 1 | ITO:WO₃ | HT3:HfO₂ | — | — | BH8 | BD5 | 124 |
| Example 2 | ITO:WO₃ | HfO₂ | — | — | BH8 | BD5 | 122 |
| Example 3 | ITO:WO₃ | HfO₂ | HT3:HfO₂ | — | BH8 | BD5 | 108 |
| Example 4 | ITO:WO₃ | HT3:HfO₂ | HfO₂ | — | BH8 | BD5 | 115 |
| Example 5 | ITO:WO₃ | HfO₂ | HT3:HfO₂ | HfO₂ | BH8 | BD5 | 105 |
| Example 6 | ITO:WO₃ | HT3:HfO₂ | HfO₂ | HT3:HfO₂ | BH8 | BD5 | 109 |
| Example 7 | ITO:WO₃ | HT3:HfO₂ | — | — | H8 | FD5 | 105 |
| Comparative Example 1 | ITO:WO₃ | HT3:F4-TCNQ | — | — | H8 | FD5 | 100 |
| Comparative Example 2 | ITO:MoO₃ | HT3:F4-TCNQ | — | — | BH8 | BD5 | 95 |
| Comparative Example 3 | ITO | TiO₂ | HT3:HfO₂ | — | BH8 | BD5 | 88 |
| Comparative Example 4 | ITO:WO₃ | HT3:F4-TCNQ | — | — | BH8 | BD5 | 102 |

Referring to Table 1, it can be seen that the light-emitting devices of Examples 1 to 7 each have improved efficiency, compared to the light-emitting devices of each of Comparative Examples 1 to 4.

The light-emitting devices may have a low driving voltage, a high efficiency, and a long lifespan due to the improvement in hole injection characteristics.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various suitable changes in form and details may be made therein without departing from the spirit and scope as defined by the following claims, and equivalents thereof.

What is claimed is:

1. A light-emitting device comprising:
a first electrode;
a second electrode facing the first electrode; and
an interlayer between the first electrode and the second electrode and comprising an emission layer,
wherein
the interlayer comprises a hole transport region between the first electrode and the emission layer,
the hole transport region comprises a hole injection layer,
the first electrode comprises a conductive oxide mixed with a first inorganic material,
the hole injection layer comprises a second inorganic material, the first inorganic material comprises tantalum (Ta), molybdenum (Mo), vanadium (V), niobium (Nb), silver (Ag), zinc (Zn), tin (Sn), chromium (Cr), cobalt (Co), rhodium (Rh), tungsten (W), iron (Fe), copper (Cu), gold (Au), ruthenium (Ru), osmium (Os), titanium (Ti), nickel (Ni), rhenium (Re), palladium (Pd), iridium (Ir), platinum (Pt), $In_2O_3$, $GeO_2$, $SnO_2$, $MoO_2$, $MoO_3$, $WO_3$, CuO, $TiO_2$, $V_2O_5$, $NiO_x$ ($0 \leq x \leq 3/2$), $CrO_{3-x}$ ($0 \leq x \leq 2$), $Ta_2O_5$, $Co_3O_4$, or any combination thereof, and the second inorganic material comprises calcium (Ca), scandium (Sc), titanium (Ti), strontium (Sr), yttrium (Y), zirconium (Zr), niobium (Nb), barium (Ba), hafnium (Hf), tantalum (Ta), lanthanum (La), neodymium (Nd), gadolinium (Gd), $HfO_x(0<x \leq 2)$, $ZrO_x$ ($0<x \leq 2$), $LaO_x$ ($0<x \leq 3/2$), $LaAlO_x$ ($0<x \leq 3$), $TaO_x$ ($0<x \leq 5/2$), $AlO_x$ ($0<x \leq 3/2$), $SiO_2$, $ZrSiO_4$, $HfSiO_4$, SrO, $Y_2O_3$, CaO, BaO, $BaZrO_3$, MgO, $TiO_2$, $Si_3N_4$, or any combination thereof, and wherein an amount of the first inorganic material in the first electrode is greater than 0 wt % and less than 50 wt % based on a total weight of the first electrode.

2. The light-emitting device of claim 1, wherein the conductive oxide comprises indium tin oxide (ITO), indium zinc oxide (IZO), tin oxide ($SnO_2$), zinc oxide (ZnO), or any combination thereof.

3. The light-emitting device of claim 1, wherein an absolute value of a work function of the first electrode is about 5.0 eV to about 5.3 eV.

4. The light-emitting device of claim 1, wherein the second inorganic material has a dielectric constant (k) of 4 to 60.

5. The light-emitting device of claim 1, wherein the first electrode and the hole injection layer are in direct contact with each other.

6. The light-emitting device of claim 1, wherein
the hole injection layer consists of the second inorganic material, or
the hole injection layer comprises the second inorganic material and a hole transport material.

7. The light-emitting device of claim 6, wherein the hole transport material comprises at least one of groups represented by Formulae CY201 to CY217:

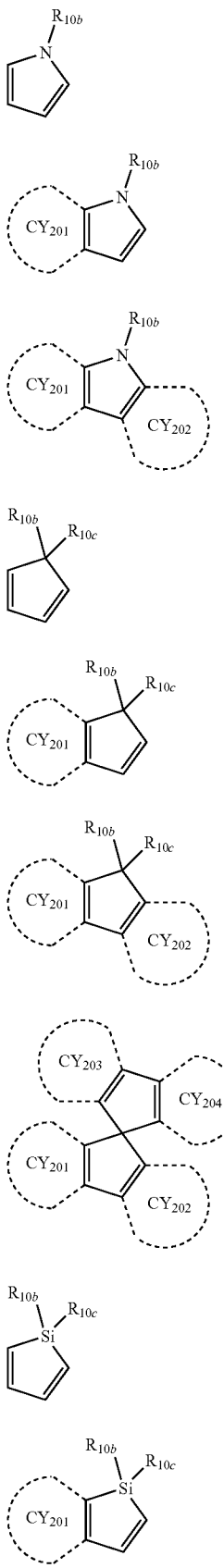
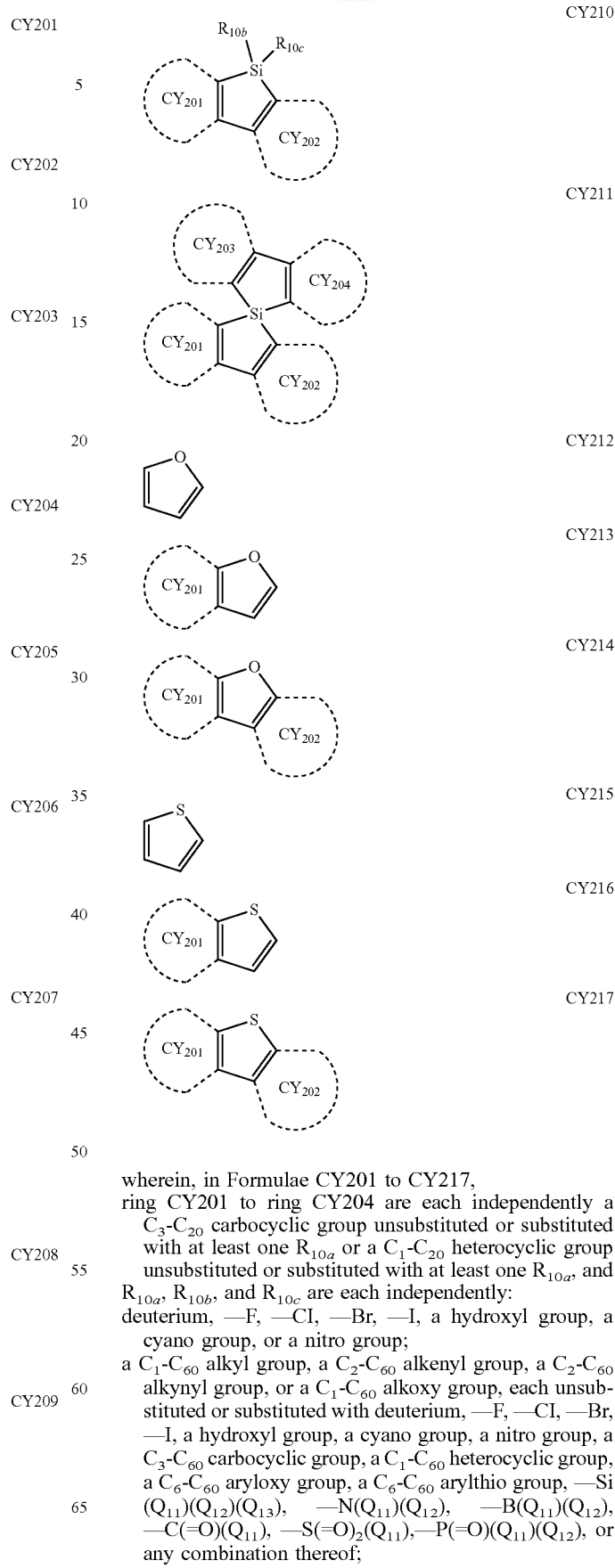

wherein, in Formulae CY201 to CY217,
ring CY201 to ring CY204 are each independently a C$_3$-C$_{20}$ carbocyclic group unsubstituted or substituted with at least one R$_{10a}$ or a C$_1$-C$_{20}$ heterocyclic group unsubstituted or substituted with at least one R$_{10a}$, and R$_{10a}$, R$_{10b}$, and R$_{10c}$ are each independently:
deuterium, —F, —Cl, —Br, —I, a hydroxyl group, a cyano group, or a nitro group;
a C$_1$-C$_{60}$ alkyl group, a C$_2$-C$_{60}$ alkenyl group, a C$_2$-C$_{60}$ alkynyl group, or a C$_1$-C$_{60}$ alkoxy group, each unsubstituted or substituted with deuterium, —F, —Cl, —Br, —I, a hydroxyl group, a cyano group, a nitro group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), —P(=O)(Q$_{11}$)(Q$_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$),—N($Q_{21}$)($Q_{22}$), —B($Q_{21}$)($Q_{22}$), —C(=O)($Q_{21}$), —S(=O)$_2$($Q_{21}$),—P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and wherein $Q_{11}$ to $Q_{13}$, $Q_{21}$ to $Q_{23}$, and $Q_{31}$ to $Q_{33}$ are each independently: hydrogen;

deuterium; —F; —Cl; Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

8. The light-emitting device of claim 1, wherein the hole injection layer has a multi-layered structure comprising at least two different layers.

9. The light-emitting device of claim 1, wherein
the hole injection layer comprises at least one single material layer and at least one mixed layer,
the single material layer consists of the second inorganic material, and
mixed layer comprises the second inorganic material and a hole transport material.

10. The light-emitting device of claim 9, wherein
the hole injection layer comprises a first single material layer and a first mixed layer sequentially arranged from the first electrode,
the hole injection layer comprises a first mixed layer and a first single material layer sequentially arranged from the first electrode,
the hole injection layer comprises a first single material layer, a first mixed layer, and a second single material layer sequentially arranged from the first electrode, or
the hole injection layer comprises a first mixed layer, a first single material layer, and a second mixed layer sequentially arranged from the first electrode.

11. The light-emitting device of claim 1, wherein
the hole injection layer comprises the second inorganic material and a hole transport material, and
an amount of the second inorganic material in the hole injection layer is greater than 0 wt % and less than 50 wt % based on a total weight of the hole injection layer.

12. The light-emitting device of claim 1, wherein
the first electrode is an anode,
the second electrode is a cathode,
the interlayer further comprises an electron transport region between the emission layer and the second electrode,
the hole transport region further comprises a hole transport layer, an emission auxiliary layer, an electron blocking layer, or any combination thereof, between the hole injection layer and the emission layer, and
the electron transport region comprises a buffer layer, a hole blocking layer, an electron control layer, an electron transport layer, an electron injection layer, or any combination thereof.

13. The light-emitting device of claim 1, wherein
the first electrode is an anode,
the second electrode is a cathode,
the hole transport region further comprises a hole transport layer between the hole injection layer and the emission layer, and
the hole transport layer comprises a hole transport material.

14. An electronic apparatus comprising the light-emitting device of claim 1.

15. The electronic apparatus of claim 14, further comprising a thin-film transistor comprising a source electrode, a drain electrode, and an activation layer,
wherein the first electrode of the light-emitting device is electrically connected to the source electrode or the drain electrode of the thin-film transistor.

16. The electronic apparatus of claim 14, further comprising a functional layer comprising a touch screen layer, a polarizing layer, a color filter, a color conversion layer, or any combination thereof.

17. The electronic apparatus of claim 14, wherein the electronic apparatus is applied to a display, a light source, lighting, a personal computer, a mobile personal computer, a mobile phone, a digital camera, an electronic organizer, an electronic dictionary, an electronic game machine, a medical instrument, an electronic thermometer, a sphygmomanometer, a blood glucose meter, a pulse measurement device, a pulse wave measurement device, an electrocardiogram display, an ultrasonic diagnostic device, an endoscope display, a fish finder, a measuring instrument, a meter for a vehicle, a meter for an aircraft, a meter for a vessel, or a projector.

18. A light-emitting device comprising:
a first electrode;
a second electrode facing the first electrode; and
an interlayer between the first electrode and the second electrode and comprising an emission layer,
wherein
the interlayer comprises a hole transport region between the first electrode and the emission layer,
the hole transport region comprises a hole injection layer,
the first electrode comprises a conductive oxide and a first inorganic material,
the hole injection layer comprises a second inorganic material,
the first inorganic material comprises tantalum (Ta), molybdenum (Mo), vanadium (V), niobium (Nb), silver (Ag), zinc (Zn), tin (Sn), chromium (Cr), cobalt (Co), rhodium (Rh), tungsten (W), iron (Fe), copper (Cu), gold (Au), ruthenium (Ru), osmium (Os), titanium (Ti), nickel (Ni), rhenium (Re), palladium (Pd), iridium (Ir), platinum (Pt), $In_2O_3$, $GeO_2$, $SnO_2$, $MoO_2$, $MoO_3$, $WO_3$, CuO, $TiO_2$, $V_2O_5$, $NiO_x$(0≤x≤3/2), $CrO_{3-x}$ (0≤x≤2), $Ta_2O_5$, $Co_3O_4$, or any combination thereof, and
the second inorganic material comprises calcium (Ca), scandium (Sc), titanium (Ti), strontium (Sr), yttrium (Y), zirconium (Zr), niobium (Nb), barium (Ba), hafnium (Hf), tantalum (Ta), lanthanum (La), neodymium (Nd), gadolinium (Gd), $HfO_x$ (0<x≤2), $ZrO_x$ (0<x≤2), $LaO_x$(0<x≤3/2), $LaAlO_x$(0<x≤3), $TaO_x$ (0<x≤5/2), $AlO_x$(0<x≤3/2), $SiO_2$, $ZrSiO_4$, $HfSiO_4$, SrO, $Y_2O_3$, CaO, BaO, $BaZrO_3$, MgO, $TiO_2$, $Si_3N_4$, or any combination thereof, and
wherein
the hole injection layer comprises the second inorganic material and a hole transport material, and an absolute value of a work function of the first electrode is greater than or equal to an absolute value of a HOMO energy level of the hole transport material.

19. A light-emitting device comprising:
a first electrode;
a second electrode facing the first electrode; and
an interlayer between the first electrode and the second electrode and comprising an emission layer,
wherein
the interlayer comprises a hole transport region between the first electrode and the emission layer,
the hole transport region comprises a hole injection layer,
the first electrode comprises a conductive oxide and a first inorganic material,
the hole injection layer comprises a second inorganic material,
the first inorganic material comprises tantalum (Ta), molybdenum (Mo), vanadium (V), niobium (Nb), silver (Ag), zinc (Zn), tin (Sn), chromium (Cr), cobalt (Co), rhodium (Rh), tungsten (W), iron (Fe), copper (Cu), gold (Au), ruthenium (Ru), osmium (Os), titanium (Ti), nickel (Ni), rhenium (Re), palladium (Pd), iridium (Ir), platinum (Pt), $In_2O_3$, $GeO_2$, $SnO_2$, $MoO_2$, $MoO_3$, $WO_3$, $CuO$, $TiO_2$, $V_2O_5$, $NiO_x$ ($0 \leq x \leq 3/2$), $CrO_{3-x}$ ($0 < x \leq 2$), $Ta_2O_5$, $Co_3O_4$, or any combination thereof, and
the second inorganic material comprises calcium (Ca), scandium (Sc), titanium (Ti), strontium (Sr), yttrium (Y), zirconium (Zr), niobium (Nb), barium (Ba), hafnium (Hf), tantalum (Ta), lanthanum (La), neodymium (Nd), gadolinium (Gd), $HfO_x(0<x\leq2)$, $ZrO_x(0<x\leq2)$, $LaO_x(0<x\leq3/2)$, $LaAlO_x(0<x\leq3)$, $TaO_x(0<x\leq5/2)$, $AlO_x(0<x\leq3/2)$, $SiO_2$, $ZrSiO_4$, $HfSiO_4$, $SrO$, $Y_2O_3$, $CaO$, $BaO$, $BaZrO_3$, $MgO$, $TiO_2$, $Si_3N_4$, or any combination thereof, and
wherein
the emission layer comprises a host and a dopant,
the host is an anthracene compound, and
the dopant is a boron-containing condensed cyclic compound.

20. The light-emitting device of claim 19, wherein the dopant is represented by Formula 2:

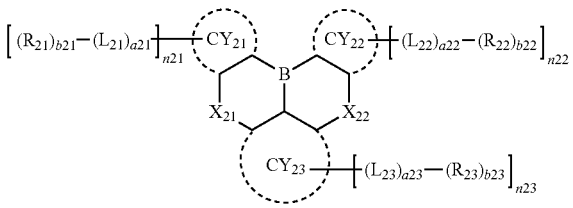

Formula 2 wherein, in Formula 2,
$X_{21}$ is $C(R_{24})(R_{25})$, $N(R_{24})$, O, or S,
$X_{22}$ is $C(R_{26})(R_{27})$, $N(R_{26})$, O, or S,
$CY_{21}$ to $CY_{23}$ and $L_{21}$ to $L_{23}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
a21 to a23 are each independently an integer from 0 to 5,
$R_{21}$ to $R_{27}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$),
b21 to b23 are each independently an integer from 1 to 10,
n21 to n23 are each independently an integer from 1 to 4, and
$R_{10a}$ is:
deuterium, —F, —Cl, —Br, —I, a hydroxyl group, a cyano group, or a nitro group,
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and
wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

* * * * *